(12) United States Patent
Kabir

(10) Patent No.: US 8,183,659 B2
(45) Date of Patent: *May 22, 2012

(54) INTEGRATED CIRCUITS HAVING INTERCONNECTS AND HEAT DISSIPATORS BASED ON NANOSTRUCTURES

(75) Inventor: Mohammad Shafiqul Kabir, Gothenburg (SE)

(73) Assignee: Smoltek AB

( * ) Notice: Subject to any disclaimer, the term of this patent is extended or adjusted under 35 U.S.C. 154(b) by 0 days.

This patent is subject to a terminal disclaimer.

(21) Appl. No.: 12/830,135

(22) Filed: Jul. 2, 2010

(65) Prior Publication Data

US 2010/0328898 A1  Dec. 30, 2010

Related U.S. Application Data

(60) Division of application No. 11/511,867, filed on Aug. 28, 2006, now Pat. No. 7,777,291, and a continuation-in-part of application No. 11/412,060, filed on Apr. 25, 2006, now Pat. No. 7,687,876.

(60) Provisional application No. 60/772,449, filed on Feb. 10, 2006.

(30) Foreign Application Priority Data

Aug. 26, 2005 (SE) ........................ 0501888

(51) Int. Cl.
*H01L 27/095* (2006.01)

(52) U.S. Cl. ............... 257/471; 257/16; 257/19; 257/52; 257/54; 257/55; 257/E29.08; 257/E31.034; 257/E31.047; 257/E51.04; 977/734; 977/742; 977/750; 977/814; 977/842; 977/860

(58) Field of Classification Search ............. 257/16, 257/19, 52, 54, 55, 471, E29.08, E31.034, 257/E31.047, E51.04; 977/734, 742, 750, 977/814, 842, 860
See application file for complete search history.

(56) References Cited

U.S. PATENT DOCUMENTS

| 6,297,592 B1 | 10/2001 | Goren et al. |
| 6,720,728 B2 | 4/2004 | Den |
| 6,724,017 B2 | 4/2004 | Semeria et al. |
| 6,737,939 B2 | 5/2004 | Hoppe et al. |
| 6,739,932 B2 | 5/2004 | Yaniv et al. |
| 6,858,197 B1 | 2/2005 | Delzeit |
| 6,962,823 B2 | 11/2005 | Empedocles et al. |
| 6,965,513 B2 | 11/2005 | Montgomery et al. |
| 7,084,507 B2 | 8/2006 | Awano |
| 7,094,692 B2 * | 8/2006 | Horibe et al. ................. 438/680 |

(Continued)

FOREIGN PATENT DOCUMENTS

JP        10-188778       7/1998

(Continued)

OTHER PUBLICATIONS

Communication pursuant to Article 94(3) EPC for Application No. 06 733 343.5, dated Jan. 19, 2011, 5 pages.

(Continued)

*Primary Examiner* — Andy Huynh
(74) *Attorney, Agent, or Firm* — Fish & Richardson P.C.

(57) ABSTRACT

The present invention provides for nanostructures grown on a conducting or insulating substrate, and a method of making the same. The nanostructures grown according to the claimed method are suitable for interconnects and/or as heat dissipators in electronic devices.

8 Claims, 32 Drawing Sheets

U.S. PATENT DOCUMENTS

| | | | |
|---|---|---|---|
| 7,682,973 | B2 | 3/2010 | Kim et al. |
| 7,687,876 | B2* | 3/2010 | Kabir .......................... 257/471 |
| 7,777,291 | B2 | 8/2010 | Kabir |
| 7,977,761 | B2* | 7/2011 | Kabir .......................... 257/471 |
| 2002/0185949 | A1 | 12/2002 | Yaniv et al. |
| 2003/0117770 | A1 | 6/2003 | Montgomery et al. |
| 2003/0236000 | A1 | 12/2003 | Vogeli et al. |
| 2004/0037972 | A1 | 2/2004 | Simon et al. |
| 2004/0101468 | A1 | 5/2004 | Liu et al. |
| 2004/0161929 | A1 | 8/2004 | Son et al. |
| 2004/0182600 | A1 | 9/2004 | Kawabata et al. |
| 2004/0195957 | A1 | 10/2004 | Hu et al. |
| 2004/0251841 | A1 | 12/2004 | Negishi et al. |
| 2005/0046322 | A1 | 3/2005 | Kim et al. |
| 2005/0127351 | A1 | 6/2005 | Tolt |
| 2005/0212398 | A1 | 9/2005 | Okano et al. |
| 2005/0229837 | A1 | 10/2005 | Marty et al. |
| 2006/0091557 | A1* | 5/2006 | Sakamoto et al. ............ 257/774 |
| 2006/0238096 | A1 | 10/2006 | Han et al. |
| 2007/0243124 | A1 | 10/2007 | Baughman et al. |
| 2008/0003733 | A1 | 1/2008 | Kim et al. |
| 2008/0090052 | A1 | 4/2008 | Hori et al. |
| 2008/0107892 | A1 | 5/2008 | Jiao et al. |
| 2008/0224115 | A1* | 9/2008 | Bakkers et al. ................... 257/1 |
| 2008/0232755 | A1 | 9/2008 | Kabir |
| 2009/0072408 | A1 | 3/2009 | Kabir et al. |
| 2009/0233124 | A1 | 9/2009 | Berg et al. |
| 2010/0171093 | A1 | 7/2010 | Kabir |

FOREIGN PATENT DOCUMENTS

| | | |
|---|---|---|
| JP | 2000086216 | 3/2000 |
| JP | 2002117791 | 4/2002 |
| JP | 2002203473 | 7/2002 |
| JP | 2002289086 | 10/2002 |
| JP | 2003115257 | 4/2003 |
| JP | 2003115259 | 4/2003 |
| JP | 2003249163 | 9/2003 |
| JP | 2004055157 | 2/2004 |
| JP | 2004261875 | 9/2004 |
| JP | 2005116469 | 4/2005 |
| JP | 2006224296 | 8/2006 |
| WO | WO 03/055793 | 7/2003 |
| WO | WO 03/078305 | 9/2003 |
| WO | WO 2004/042830 | 5/2004 |
| WO | WO 2004/070854 | 8/2004 |
| WO | WO 2004/075275 | 9/2004 |
| WO | WO 2004/079450 | 9/2004 |
| WO | WO 2004/087564 | 10/2004 |
| WO | WO 2004/096699 | 11/2004 |
| WO | WO 2004/109815 | 12/2004 |
| WO | WO 2005/112126 | 11/2005 |
| WO | WO 2006/115453 | 11/2006 |
| WO | WO 2007/053202 | 5/2007 |

OTHER PUBLICATIONS

Communication pursuant to Article 94(3) EPC for Application No. 06 850 481.0, dated Mar. 29, 2011, 7 pages.
Adams, D. P. et al., "Microstructure and residual stress of very thin Mo films", *Thin Solid Films*, vol. 266 (1995), pp. 52-57.
Ajayan, P. M., "How does a nanofibre grow?", *Nature*, vol. 427 (Jan. 29, 2004), pp. 402-403.
Avouris, P. et al., "Carbon Nanotube Electronics", *Proceedings of the IEEE*, vol. 91, No. 11 (Nov. 2003), pp. 1772-1784.
Awano, Y. et al., "Carbon nanotube technologies for future ULSIs", *2003 International Symposium on VLSI Technology, Systems, and Applications*, (2003), pp. 40-41.
Bachtold, A. et al., "Logic Circuits with Carbon Nanotube Transistors", *Science*, vol. 294 (Nov. 9, 2001), pp. 1317-1320.
Baker, R. T. K., "Catalytic growth of carbon filaments", *Carbon*, vol. 27, No. 3 (1989), pp. 315-323.
Baughman, R. H. et al., "Carbon Nanotubes—the Route Toward Applications", *Science*, vol. 297 (Aug. 2, 2002), pp. 787-792.
Baylor, L. R. et al., "Field emission from isolated individual vertically aligned carbon nanocones", *Journal of Applied Physics*, vol. 91, No. 7 (Apr. 1, 2002), pp. 4602-4606.
Bertness, K. A. et al., "Formation of AlN and GaN nanocolumns on Si(111) using molecular beam epitaxy with ammonia as a nitrogen source", *Phys. Stat. Sol. (c)*, vol. 2, No. 7 (Feb. 8, 2005), pp. 2369-2372.
Blase, X. et al., "Hybridization Effects and Metallicity in Small Radius Carbon Nanotubes", *Physical Review Letters*, vol. 72, No. 12 (Mar. 21, 1994), pp. 1878-1881.
Burke, P. J., "AC performance of nanoelectronics: towards a ballistic THz nanotube transistor", *Solid-State Electronics*, vol. 48 (2004), 1981-1986.
Cassell, A. M. et al., "Large Scale CVD Synthesis of Single-Walled Carbon Nanotubes", *J. Phys. Chem. B*, vol. 103 (1999), pp. 6484-6492.
Caughman, J. B. O. et al., "Growth of vertically aligned carbon nanofibers by low-pressure inductively coupled plasma-enhanced chemical vapor deposition", *Applied Physics Letters*, vol. 83, No. 6 (Aug. 11, 2003), pp. 1207-1209.
Cerofolini, G. F. et al., "A hybrid approach to nanoelectronics", *Nanotechnology*, vol. 16 (May 12, 2005), pp. 1040-1047.
Chen, B. et al., "Heterogeneous Single-Walled Carbon Nanotube Catalyst Discovery and Optimization", *Chem. Mater.*, vol. 14 (2002), pp. 1891-1896.
Chhowalla, M. et al., "Growth process conditions of vertically aligned carbon nanotubes using plasma enhanced chemical vapor deposition", *Journal of Applied Physics*, vol. 90, No. 10 (Nov. 15, 2001), pp. 5308-5317.
Choi, Y. C. et al., "Effect of surface morphology of Ni thin film on the growth of aligned carbon nanotubes by microwave plasma-enhanced chemical vapor deposition", *Journal of Applied Physics*, vol. 88, No. 8 (Oct. 15, 2000), pp. 4898-4903.
Chopra, N. et al., "Control of Multiwalled Carbon Nanotube Diameter by Selective Growth on the Exposed Edge of a Thin Film Multilayer Structure", *Nano Letters*, vol. 2, No. 10 (2002), 1177-1181.
Chopra, N. et al., "Incident angle dependence of nanogap size in suspended carbon nanotube shadow lithography", *Nanotechnology*, vol. 16 (Dec. 10, 2004), pp. 133-136.
Ciraci, S. et al., "Functionalized carbon nanotubes and device applications", *Journal of Physics: Condensed Matter*, vol. 16 (2004), pp. R901-R960.
Colomer, J. F. et al., "Large-scale synthesis of single-wall carbon nanotubes by catalytic chemical vapor deposition (CCVD) method", *Chemical Physics Letters*, vol. 317 (2000), pp. 83-89.
Conway, N. M. J. et al., "Defect and disorder reduction by annealing in hydrogenated tetrahedral amorphous carbon", *Diamond and Related Materials*, vol. 9 (2000), pp. 765-770.
Coquay, P. et al., "Carbon Nanotubes by a CVD Method. Part II: Formation of Nanotubes from (Mg, Fe)O Catalysts", *J. Phys. Chem. B*, vol. 106, No. 51 (2002), pp. 13199-13210.
Cui, H. et al., "Initial growth of vertically aligned carbon nanofibers", *Applied Physics Letters*, vol. 84, No. 20 (May 17, 2004), pp. 4077-4079.
Davis, J. F. et al., "High-Q Mechanical Resonator Arrays Based on Carbon Nanotubes", *Nanotechnology*, vol. 2 (Aug. 2003), pp. 635-638.
Dekker, C., "Carbon nanotubes as molecular quantum wires", *Physics Today*, (May 1999), pp. 22-28.
Delzeit, L. et al., "Growth of carbon nanotubes by thermal and plasma chemical vapour deposition processes and applications in microscopy", *Nanotechnology*, vol. 13 (2002), pp. 280-284.
Delzeit, L. et al., "Growth of multiwall carbon nanotubes in an inductively coupled plasma reactor", *Journal of Applied Physics*, vol. 91, No. 9 (May 1, 2002), pp. 6027-6033.
Delzeit, L. et al., "Multilayered metal catalysts for controlling the density of single-walled carbon nanotube growth", *Chemical Physics Letters*, vol. 348 (2001), pp. 368-374.
Delzeit, L. et al., "Multiwalled Carbon Nanotubes by Chemical Vapor Deposition Using Multilayered Metal Catalysts", *J. Phys. Chem. B.*, vol. 106 (2002), pp. 5629-5635.
Derycke, V. et al., "Carbon Nanotube Inter- and Intramolecular Logic Gates", *Nano Letters*, vol. 1, No. 9 (Sep. 2001), pp. 453-456.

Dong, L. et al., "Effects of catalysts on the internal structures of carbon nanotubes and corresponding electron field-emission properties", *Applied Physics A—Materials Science & Processing*, vol. 78 (2004), pp. 9-14.

Duesberg, G. S. et al., "Growth of Isolated Carbon Nanotubes with Lithographically Defined Diameter and Location", *Nano Letters*, vol. 3, No. 2 (2003), pp. 257-259.

Doraiswami, R. "Nano Nickel-Tin Interconnects and Electrodes for Next Generation 15 Micron Pitch Embedded Bio Fluidic Sensors in FR4 Substrates." 1-4244-0152-6, 2006 IEEE, 2006 Electronic Components and Technology Conference, pp. 1323-1325.

Emmenegger, C. et al., "Carbon nanotube synthesized on metallic substrates", *Applied Surface Science*, vol. 162-163 (2000), pp. 452-456.

Eres, G. et al., "In situ control of the catalyst efficiency in chemical vapor deposition of vertically aligned carbon nanotubes on predeposited metal catalyst films", *Applied Physics Letters*, vol. 84, No. 10 (Mar. 8, 2004), pp. 1759-1761.

Ferrari, A. C. et al., "Is stress necessary to stabilise $sp^3$ bonding in diamond-like carbon?", *Diamond and Related Materials*, vol. 11 (2002), pp. 994-999.

Frank, S. et al., "Carbon nanotube quantum resistors", *Science*, vol. 280 (Jun. 12, 1998), pp. 1744-1746.

Franklin, N. R. et al., "Integration of suspended carbon nanotube arrays into electronic devices and electromechanical systems", *Applied Physics Letters*, vol. 81, No. 5 (Jul. 29, 2002), pp. 913-915.

Fuhrer, M. S. et al., "High-Mobility Nanotube Transistor Memory", *Nano Letters*, vol. 2, No. 7 (2002), pp. 755-759.

Gerdes, S. et al., "Combing a carbon nanotube on a flat metal-insulator-metal nanojuction", *Europhysics Letters*, vol. 48, No. 3 (1999), pp. 292-298.

Graham, A. P. et al., "How do carbon nanotubes fit into the semiconductor roadmap?", *Applied Physics A—Materials Science & Processing*, vol. 80 (Mar. 11, 2005), pp. 1141-1151.

Guillorn, M. A. et al., "Individually addressable vertically aligned carbon nanofiber-based electrochemical probes", *Journal of Applied Physics*, vol. 91, No. 6 (Mar. 15, 2002), pp. 3824-3828.

Guo, J. et al., "Assessment of Silicon MOS and Carbon Nanotube FET Performance Limits Using a General Theory of Ballistic Transistors", *International Electron Devices Meeting (IEDM) Digest*, (2002), pp. 711-714.

Guo, T. et al., "Catalytic growth of single-walled nanotubes by laser vaporization", *Chemical Physics Letters*, vol. 243 (1995), pp. 49-54.

Hash, D. B. et al., "An investigation of plasma chemistry for dc plasma enhanced chemical vapour deposition of carbon nanotubes and nanofibres", *Nanotechnology*, vol. 16 (Apr. 19, 2005), pp. 925-930.

Hausler, K. et al., "Ordering of nanoscale InP islands on strain-modulated InGaP buffer layers", *Solid-State Electronics*, vol. 40, Nos. 1-8 (1996), pp. 803-806.

Heidari, B. et al., "Large scale nanolithography using nanoimprint lithography", *J. Vac. Sci. Technol. B*, vol. 17, No. 6 (Nov./Dec. 1999), pp. 2961-2964.

Heinze, S. et al., "Carbon Nanotubes as Schottky Barrier Transistors", *Physical Review Letters*, vol. 89, No. 10 (Sep. 2, 2002), pp. 106801.1-106801.4.

Helveg, S. et al., "Atomic-scale imaging of carbon nanofibre growth", *Nature*, vol. 427 (Jan. 29, 2004), pp. 426-429.

Hertel, T. et al., "Manipulation of Individual Carbon Nanotubes in Their Interaction with Surfaces", *J. Phys. Chem. B*, vol. 102, No. 6 (1998), pp. 910-915.

Hoenlein, W. et al., "Carbon nanotubes for microelectronics: status and future prospects", *Materials Science and Engineering C*, vol. 23 (2003), pp. 663-669.

Iijima, S. et al., "Carbon nanotubes: past, present, and future", *Physica B*, vol. 323 (2002), pp. 1-5.

Javey, A. et al., "Carbon Nanotube Field-Effect Transistors with Integrated Ohmic Contacts and High-κ Gate Dielectrics", *Nano Letters*, vol. 4, No. 3 (Jan. 10, 2004), pp. 447-450.

Kabir, M. S., "Towards the Integration of Carbon Nanostructures into CMOS Technology", Thesis for the Degree of Doctor of Philosophy, Department of Microtechnology and Nanoscience, Chalmers University of Technology, Goteborg, Sweden, (Aug. 2005).

Kabir, M. S. et al., "Fabrication of individual vertically aligned carbon nanofibres on metal substrates from prefabricated catalyst dots", *Nanotechnology*, vol. 17, No. 3 (Jan. 10, 2006), pp. 790-794.

Kabir, M. S. et al., "Plasma-enhanced chemical vapour deposition growth of carbon nanotubes on different metal underlayers", *Nanotechnology*, vol. 16, No. 4 (Feb. 11, 2005), pp. 458-466.

Kempa, K. et al., "Photonic crystals based on periodic arrays of aligned carbon nanotubes", Nano Letters, vol. 3, No. 1 (2003), pp. 13-18.

Khomutov, G. B. et al., "Interfacial nanofabrication strategies in development of new functional nanomaterials and planar supramolecular nanostructures for nanoelectronics and nanotechnology", *Microelectronic Engineering*, vol. 69 (2003), pp. 373-383.

Kiselev, N. A. et al., "Carbon micro- and nanotubes synthesized by PE-CVD technique: Tube structure and catalytic particles crystallography", *Carbon*, vol. 42 (2004), 149-161.

Klein, D. L. et al., "An approach to electrical studies of single nanocrystals", *App. Phys. Lett.*, vol. 68, No. 18 (Apr. 29, 1996), pp. 2574-2576.

Kong, J. et al., "Chemical vapor deposition of methane for single-walled carbon nanotubes", *Chemical Physics Letters*, vol. 292 (1998), pp. 567-574.

Kreupl, F. et al., "Carbon nanotubes in interconnect applications", *Microelectronic Engineering*, vol. 64 (2002), pp. 399-408.

Kuang, M. H. et al., "Catalytically active nickel {110} surfaces in growth of carbon tubular structures", *Applied Physics Letters*, vol. 76, No. 10 (Mar. 6, 2000), pp. 1255-1257.

Lacerda, R. G. et al., "Growth of high-quality single-wall carbon nanotubes without amorphous carbon formation", *Applied Physics Letters*, vol. 84, No. 2 (Jan. 12, 2004), pp. 269-271.

Laplaze, D. et al., "Carbon nanotubes: the solar approach", *Carbon*, vol. 36, No. 5-6 (1998), pp. 685-688.

Lee, B. et al., "A Novel SET/MOSFET Hybrid Static Memory Cell Design", *IEEE Transactions on Nanotechnology*, vol. 3, No. 3 (Sep. 2004), pp. 377-382.

Lee, S. B. et al., "Characteristics of multiwalled carbon nanotube nanobridges fabricated by poly(methylmethacrylate) suspended dispersion", *J. Vac. Sci. Technol. B.*, vol. 20, No. 6 (Nov./Dec. 2002), pp. 2773-2776.

Lee, S. W. et al., "A Three-Terminal Carbon Nanorelay", *Nano Letters*, vol. 4, No. 10 (Jul. 15, 2004), pp. 2027-2030.

Li, J. et al., "Carbon Nanotube Interconnects: A Process Solution", *Proceedings of the 2003 IEEE International*, (2003), 271-272.

Li, M. et al., "Low-temperature synthesis of carbon nanotubes using corona discharge plasma reaction at atmospheric pressure", *Journal of Materials Science Letters*, vol. 22 (2003), pp. 1223-1224.

Liao, K. et al., "Effects of Ni-catalyst characteristics on the growth of carbon nanowires", *Carbon*, vol. 42 (2004), pp. 509-514.

Liu, Z. et al., "Porous silicon: a possible buffer layer for diamond growth on silicon substrates", *Materials Research Society Symposium Proceedings*, vol. 358 (1995), pp. 805-809.

Lundstrom, M., "A Top-Down Look at Bottom-Up Electronics", *2003 Symposium on VLSI Circuits Digest of Technical Papers*, (2003), pp. 5-8.

Maeng, S. L. et al., "A carbon based bottom gate thin film transistor", *Diamond and Related Materials*, vol. 9 (2000), pp. 805-810.

Martel, R. et al., "Ambipolar Electrical Transport in Semiconducting Single-Wall Carbon Nanotubes", *Physical Review Letters*, vol. 87, No. 25 (Dec. 17, 2001), pp. 256805.1-256805.4.

Martel, R., "Nanotube Electronics: High-performance transistors", *Nature Materials*, vol. 1 (Dec. 2002), pp. 203-204.

Merkulov, V. I. et al., "Growth rate of plasma-synthesized vertically aligned carbon nanofibers", *Chemical Physics Letters*, vol. 361 (2002), pp. 492-498.

Meyyappan, M. et al., "Carbon nanotube growth by PECVD: a review", Plasma Sources Sciences and Technology, vol. 12 (2003), pp. 205-216.

Morjan, R. E. et al., "Selective growth of individual multiwalled carbon nanotubes", *Current Applied Physics*, vol. 4, No. 6 (Nov. 2004), pp. 591-594.

Nabet, B. et al., "Local Variation of Metal-Semiconducting Carbon Nanotube Contact Barrier Height", *Proceedings of the 2002 2nd IEEE Conference on Nanotechnology, IEEE-NANO 2002*, (Aug. 28, 2002), pp. 435-438.

Naeemi, A. et al., "Monolayer Metallic Nanotube Interconnects: Promising Candidates for Short Local Interconnects", *IEEE Electron Device Letters*, vol. 26, No. 8 (Aug. 2005), pp. 544-546.

Natsuki, T. et al., "Effects of carbon nanotube structures on mechanical properties", *Applied Physics A—Materials Science & Processing*, vol. 79 (Feb. 27, 2004), pp. 117-124.

Ng, H. T. et al., "Growth of Carbon Nanotubes: A Combinatorial Method to Study the Effects of Catalysts and Underlayers", *J. Phys. Chem. B*, vol. 107, No. 33 (2003), pp. 8484-8489.

Nihei, M. et al., "Carbon nanotube vias for future LSI interconnects", *Proceedings of the IEEE 2004 International Interconnect Technology Conference*, (2004), pp. 251-253.

Nikolaev, P. et al., "Gas-phase catalytic growth of single-walled carbon nanotubes from carbon monoxide", *Chemical Physics Letters*, vol. 313 (1999), pp. 91-97.

Nolan, P. E. et al., "Carbon Deposition and Hydrocarbon Formation on Group VIII Metal Catalysts", *J. Phys. Chem. B*, vol. 102 (1998), 4165-4175.

Nuzzo, R. G. et al., "Adsorption of Bifunctional Organic Disulfides on Gold Surfaces", *J. Am. Chem. Soc.*, vol. 105 (1983), pp. 4481-4483.

Oberlin, A. et al., "High resolution electron microscope observations of graphitized carbon fibers", *Carbon*, vol. 14 (1976), pp. 133-135.

Odom, T. W. et al., "Atomic structure and electronic properties of single-walled carbon nanotubes", *Nature*, vol. 391 (Jan. 1, 1998), pp. 62-64.

Ondrejcek, M. et al., "Low energy electron microscopy investigations of kinetics and energetics on clean close-packed metal surfaces", *Journal of Physics: Condensed Matter*, vol. 17 (Apr. 8, 2005), pp. S1397-S1406.

Popov, V. N., "Carbon nanotubes: properties and application", *Materials Science and Engineering R.*, vol. 43 (2004), pp. 61-102.

Prylutskyy, Y. I. et al., "Molecular dynamics simulation of mechanical, vibrational and electronic properties of carbon nanotubes", *Computational Materials Science*, vol. 17 (2000), pp. 352-355.

Raffaelle, R. P. et al., "Carbon nanotubes for power applications", *Materials Science and Engineering B*, vol. 116 (2005), pp. 233-243.

Raja, T. et al., "A Tutorial on the Emerging Nanotechnology Devices", *Proceedings of the 17th International Conference on VLSI Design (VLSID '04)*, (2004), 18 pages.

Saito, R. et al., "Chapters 1.1 and 1.2: Carbon Materials", *Physical Properties of Carbon Nanotubes*, Imperial College Press, London, England, (1998), pp. 1-15.

Saito, Y. et al., "Interlayer spacings in carbon nanotubes", *Physical Review B*, vol. 48, No. 3 (Jul. 15, 1993), pp. 1907-1909.

Sapmaz, S. et al., "Carbon nanotubes as nanoelectromechanical systems", *Physical Review B*, vol. 67 (2003), pp. 235414.1-235414.7.

Sato, S. et al., "Carbon nanotube growth from titanium-cobalt bimetallic particles as a catalyst", *Chemical Physics Letters*, vol. 402 (Dec. 22, 2004), pp. 149-154.

Seidel, R. et al., "High-Current Nanotube Transistors", *Nano Letters*, vol. 4, No. 5 (Mar. 25, 2004), pp. 831-834.

Shan, B. et al., "Ab initio study of Schottky barriers at metal-nanotube contacts", *Physical Review B*, vol. 70 (Dec. 9, 2004), pp. 233405.1-233405.4.

Sinnott, S. B. et al., "Model of carbon nanotube growth through chemical vapor deposition", *Chemical Physics Letters*, vol. 315 (1999), pp. 25-30.

Stan, M. R. et al., "Molecular Electronics: From Devices and Interconnect to Circuits and Architecture", *Proceedings of the IEEE*, vol. 91, No. 11 (Nov. 2003), pp. 1940-1957.

Tanemura, M. et al., "Growth of aligned carbon nanotubes by plasma-enhanced chemical vapor deposition: Optimization of growth parameters", *Journal of Applied Physics*, vol. 90, No. 3 (Aug. 1, 2001), pp. 1529-1533.

Tang, Z. K. et al., "Mono-sized single-wall carbon nanotubes formed in channels of $AlPO_4$-5 single crystal", *Applied Physics Letters*, vol. 73, No. 16 (Oct. 19, 1998), pp. 2287-2289.

Tans, S. J. et al., "Individual single-wall carbon nanotubes as quantum wires", *Nature*, vol. 386 (Apr. 3, 1997), pp. 474-477.

Teo, K. B. K. et al., "Characterization of plasma-enhanced chemical vapor deposition carbon nanotubes by Auger electron spectroscopy", *J. Vac. Sci. Technol. B*, vol. 20, No. 1 (Jan./Feb. 2002), pp. 116-121.

Teo, K. B. K. et al., "Plasma enhanced chemical vapour deposition carbon nanotubes/nanofibres—how uniform do they grow?", *Nanotechnology*, vol. 14, No. 2 (2003), pp. 204-211.

Thompson, S. et al., "A 90 nm Logic Technology Featuring 50nm Strained Silicon Channel Transistors, 7 layers of Cu Interconnects, Low k ILD, and 1 $um^2$ SRAM Cell", *IEDM: International Electron Devices Meeting* (held at San Francisco, California on Dec. 8-11, 2002) *Technical Digest*, (Aug. 12, 2002), pp. 61-64.

Tseng, Y. et al., "Monolithic Integration of Carbon Nanotube Devices with Silicon MOS Technology", *Nano Letters*, vol. 4, No. 1 (2004), pp. 123-127.

Vander Wal, R. L. et al., "Diffusion flame synthesis of single-walled carbon nanotubes", *Chemical Physics Letters*, vol. 323 (2000), pp. 217-223.

Yang, R. T. et al., "Mechanism of Carbon Filament Growth on Metal Catalysts", *Journal of Catalysis*, vol. 115 (1989), pp. 52-64.

Yang, X. et al., "Fabrication and Characterization of Carbon Nanofiber-Based Vertically Integrated Schottky Barrier Junction Diodes", *Nano Letters*, vol. 3, No. 12 (2003), pp. 1751-1755.

Yao, Y. et al., "Cross-sectional TEM investigation of nickel-catalysed carbon nanotube films grown by plasma-enhanced CVD", *Journal of Microscopy*, vol. 219, Pt. 2 (Aug. 2005), pp. 69-75.

Ye, Q. et al., "Large-Scale Fabrication of Carbon Nanotube Probe Tips for Atomic Force Microscopy Critical Dimension Imaging Applications", *Nano Letters*, vol. 4, No. 7 (May 24, 2004), pp. 1301-1308.

International Search Report for PCT Application No. PCT/IB2006/004279, mailed Apr. 24, 2008, 3 pages.

International Search Report and Written Opinion for PCT Application No. PCT/SE2006/000983, mailed Feb. 12, 2007, 12 pages.

International Search Report and Written Opinion for PCT Application No. PCT/SE2007/000951, mailed Feb. 6, 2008, 9 pgs.

International Search Report and Written Opinion for PCT Application No. PCT/SE2008/000506, mailed Jan. 30, 2009, 10 pages.

First Notification of Office Action for Application No. 200680035406.7, dated Jun. 17, 2010, 10 pages.

English Translation of Japanese Office Action mailed Oct. 4, 2011, for JP Patent Application No. 2008-50795, 6 Pages.

\* cited by examiner

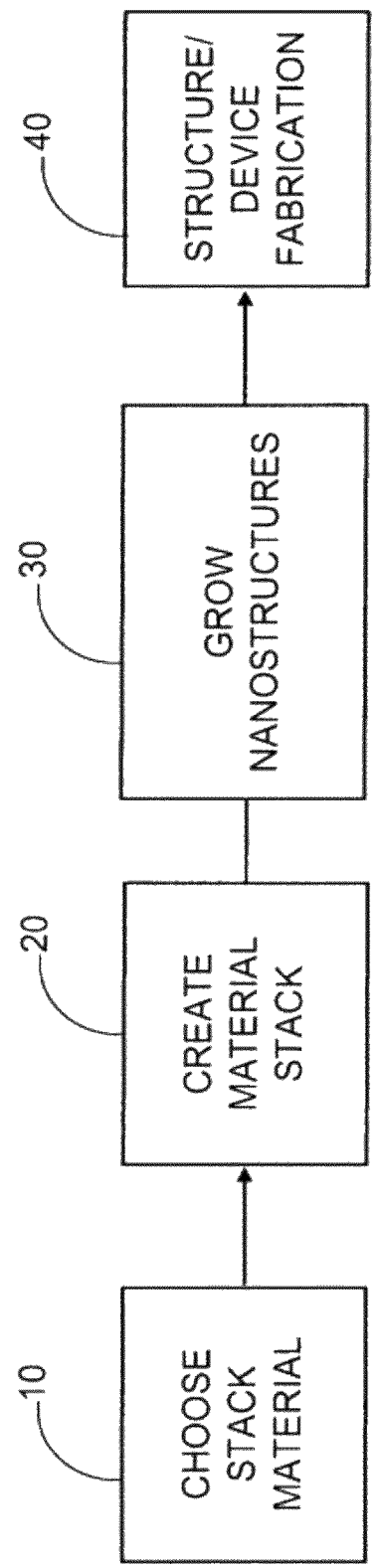

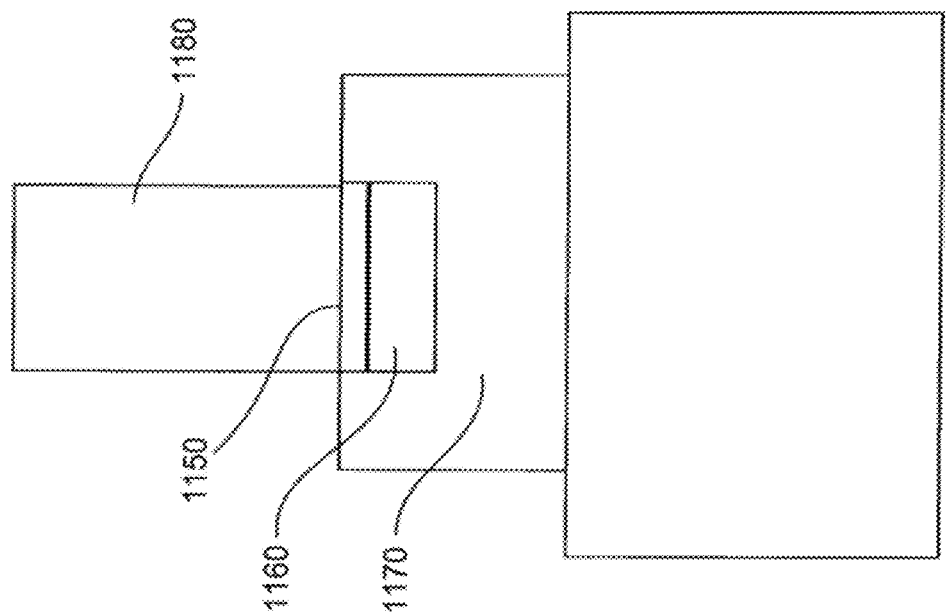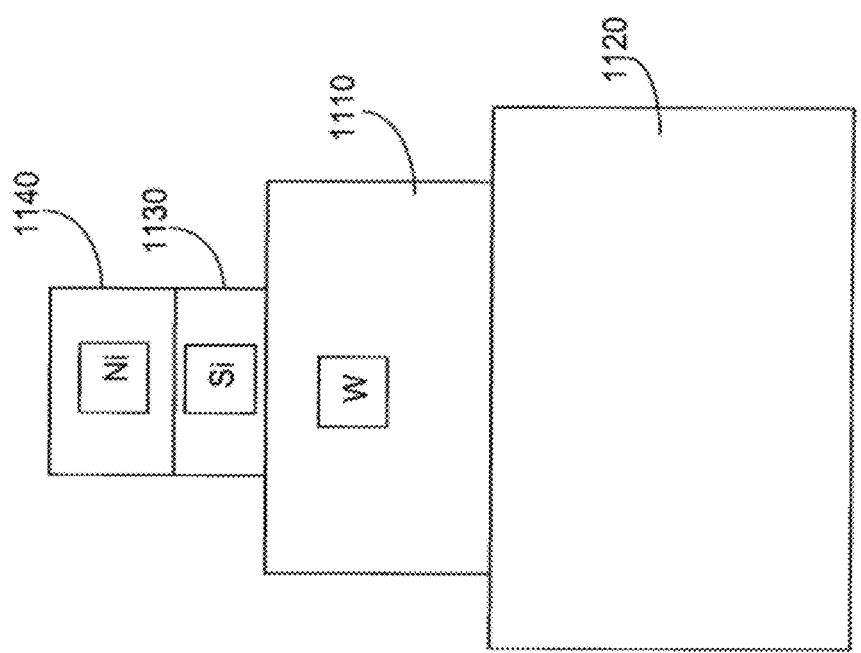
FIG. 11

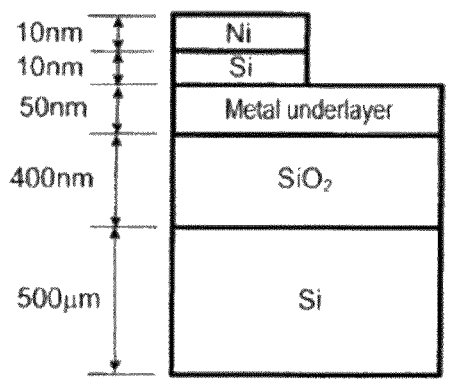
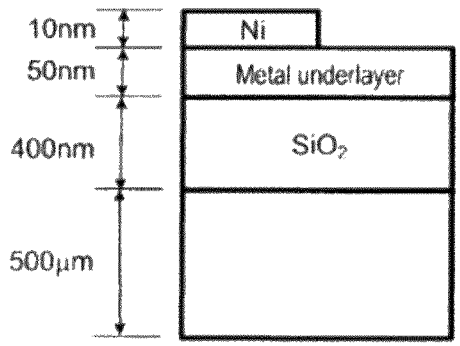
FIG. 18A    FIG. 18B
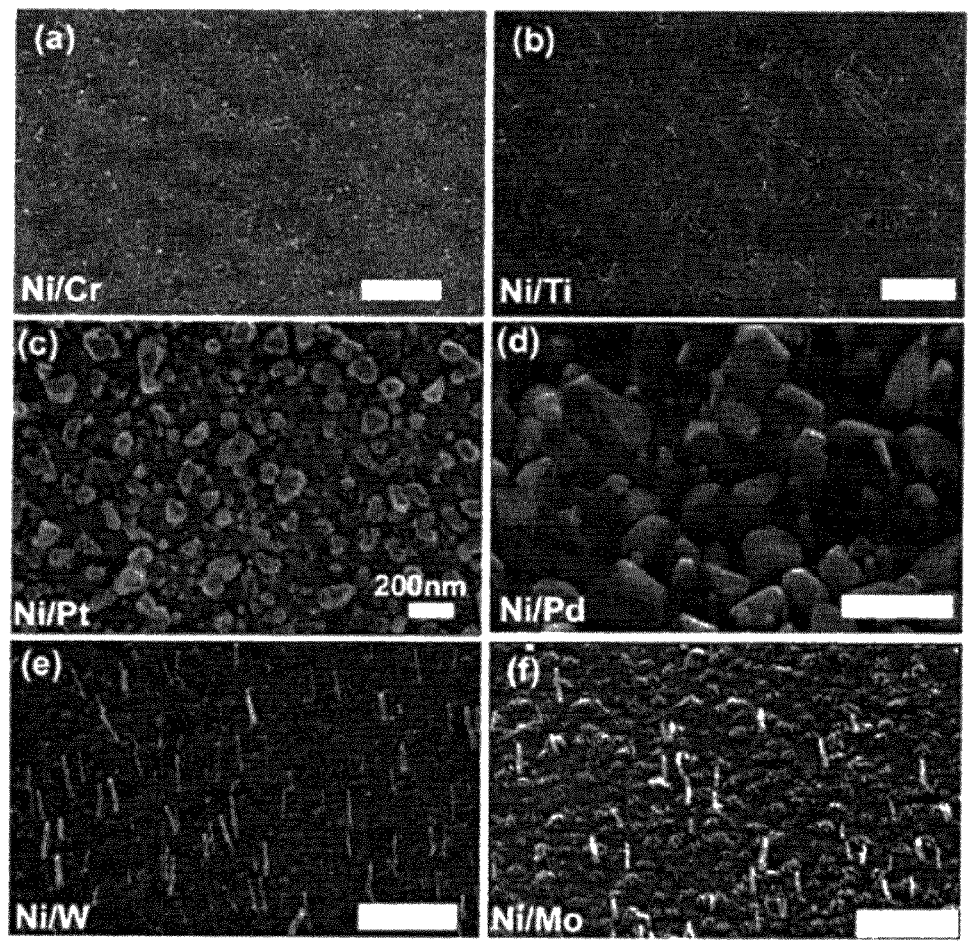
FIG. 19

INTEGRATED CIRCUITS HAVING INTERCONNECTS AND HEAT DISSIPATORS BASED ON NANOSTRUCTURES

CROSS-REFERENCE TO RELATED APPLICATIONS

This application is a divisional of prior application Ser. No. 11/511,867, filed Aug. 28, 2006, which claims the benefit of priority of Swedish provisional application serial no. 0501888-2, filed Aug. 26, 2005, and to U.S. provisional application Ser. No. 60/772,449, filed Feb. 10, 2006, and which is a continuation-in-part of U.S. patent application Ser. No. 11/412,060, filed Apr. 25, 2006. All of above prior applications are incorporated herein by reference in their entirety.

FIELD OF THE INVENTION

The present invention generally relates to nanostructures and methods for their growth. The present invention more particularly relates to methods of controlling the growth of nanostructures, such as carbon nanofibers, which enables manufacture of semiconducting devices that utilize such nanostructures as interconnects and as heat dissipation media.

BACKGROUND

Relentless efforts at miniaturization are bringing traditional CMOS devices to the limit where the device characteristics are governed by quantum phenomena; in such regimes, perfect control is impossible to achieve. This has engendered a need for finding alternative new materials to fabricate devices that will possess at least the same or even better performance than existing CMOS devices but with greater control.

The miniaturization of CMOS devices has hitherto been governed by a trend—often called Moore's law—in which electronic components shrink in size by half every 30 months. The International Technology Roadmap for Semiconductors (ITRS) has established a projected growth curve according to this model. The demands for speed, high integration level, high performance and low production costs attendant on such a rate of progress are very stringent. Consequently, the problems associated with the physical and electrical characteristics of traditional materials used for making devices have escalated. Hence there is a need to search for alternative solutions to the problems that will impede the progress of silicon technology in the immediate future. This means that devising innovative materials and processes is critical to sustaining the projected rate of growth.

The ITRS emphasizes the high speed transmission needs of the chip as the driver for future interconnect development for both high performance microprocessors (MPs) and dynamic random access memory (DRAM). State of the art microprocessors are mostly made of a two dimensional layer of silicon based components, connected to one another with up to nine layers of metal interconnects (see, e.g., Graham, A. P.; Duesberg, G. S.; Seidel, R.; Liebau, M.; Unger, E.; Kreupl, F.; Honlein, W., *Diamond and Related Materials*, (2004), 13, (4-8), 1296). Therefore, interconnect technology plays a vital role in semiconductor technology and merits special emphasis.

The choice of new materials is however limited by factors such as compatibility with existing production methods, reproducibility of manufacture and cost. In general, the challenges of interconnect technology arise from both material requirements and difficulties in processing (Jun, L.; Qi, Y.; Cassell, A.; Hou Tee, N.; Stevens, R.; Jie, H.; Meyyappan, M. *Applied Physics Letters,* 82, (15), 2491, (2003)). Some problems that existing materials used in semiconductor technology have faced are as follows.

Currently, device performance is degraded due to high leakage current through gate oxide (which is very thin). This in turn increases the leakage current in the off state, and hence increases power consumption, which in turn can reduce the lifetime of a battery.

Cu interconnects perform poorly. Due to its low resistivity, copper is used for making interconnects that connect various components to one another, as well as to external devices and circuits. Due to the dramatic reduction in the size of the components, interconnects based on copper material are now showing poor performance in terms of current carrying capacity and lifetime of the wires, and are also becoming more difficult and costly to fabricate. In particular, a phenomenon known as electromigration threatens the reliability of nanometer-size copper interconnects at high current densities ($10^6$ A/cm$^2$ and above). This is a matter of concern since by the year 2013 it will be a requirement for interconnects to handle such current densities (see, e.g., Jun, L., et al., *Applied Physics Letters,* 82, (15), 2491, (2003); ITRS, *Semiconductor Roadmap,* (2003)). Electromigration causes internal and external cavities that lead to wire failure. Moreover, due to interface roughness and small grain size, the electrical resistivity of metals increases with a decrease in dimensions (Jun, L., et al., *Applied Physics Letters,* 82, (15), 2491, (2003)). Such size induced effects of metal interconnects are difficult to avoid. All of these factors in turn reduce the lifetime of a processor. No solution currently exists for interconnects that will efficiently connect the devices in a circuit with those outside of the circuit, in time to meet the projected demand for current density over the next several years.

Demand is increasing for high aspect ratio structures. Today the aspect ratio of contact holes for interconnects in DRAM stacked capacitors has reached 12:1 and is expected to increase to 23:1 by the year 2016 (ITRS, *Semiconductor Roadmap,* (2003)). Creating such high aspect ratio contacts with straight walls poses substantial technological challenges, not least because void-free filling with metals (also known as vias) of such high aspect ratio features is extremely difficult.

Modern microprocessors generate inordinate amounts of heat. Heat dissipation has been increasing steadily as the transistor count and clock frequency of computer processors has increased (see, e.g., Thompson, S., et al., in *A 90 nm logic technology featuring 50 nm strained silicon channel transistors, 7 layers of Cu interconnects, low kILD, and 1 $\mu m^2$ SRAM cell,* San Francisco, Calif., United States, Institute of Electrical and Electronics Engineers Inc., 2002 at p 61). In particular, for example, copper interconnects of the sizes required for current and future devices generate so much heat that their electrical resistance is increased, thereby leading to a decreased capacity to carry current. Although device and system manufacturers have so far managed to channel that heat away, the task is becoming more difficult and challenging as microprocessors get faster and smaller. A practical solution for cooling of such systems that will not eventually exceed the power budget for processors has yet to be found.

In short, for all these reasons, it has become necessary to search for alternative materials and processing technology.

Carbon nanostructures, including carbon nanotubes (CNT's) and carbon nanofibers (CNF's), are considered to be some of the most promising candidates for future developments in nano-electronics, nano-electromechanical systems (NEMS), sensors, contact electrodes, nanophotonics, and nano-biotechnology. This is due principally to their one dimensional nature and their unique electrical, optical and mechanical properties. In contrast to the fullerenes, such as $C_{60}$ and $C_{70}$, whose principal chemistry is based on attaching specific functionalities to produce specific properties, CNTs offer almost limitless variation through design and manufacture of tubes of different diameters, pitches, and lengths. Furthermore, whereas the fullerenes offer the possibility of making a variety of discrete molecules with specific chemical properties, carbon nanotubes and carbon nanofibers provide the possibility to make molecular-scale components that have excellent electrical and thermal conductivity, and strength. (See, e.g., *Nanoelectronics and Information Technology*, R. Waser (Ed.), Wiley-VCH, 2003, at chapter 19.)

Carbon nanotubes and carbon nanofibers have been considered for both active devices and as interconnect technology at least because of their electrical and thermal properties and their strength. For example, the high electron mobility of carbon nanotubes (79,000 $cm^2/Vs$) surpasses that of state-of-the-art MOSFET devices (see, e.g., Durkop, T., et al., *Nano Letters*, 4(1), 35, (2004)). Furthermore, the extremely high current carrying capacity of carbon nanotubes ($10^{10}$ A/cm2) (see, e.g., Wei, B. Q., et al., *Appl. Phys. Lett.*, 79(8), 1172, (2001)), when compared with copper interconnects (~$10^6$ $A/cm^2$), means that carbon nanostructures potentially possess the solution to the severe problems for interconnects projected in ITRS. Additionally, copper burns out at around $10^6$ $A/cm^2$ while nanotubes and nanofibers can carry up to $10^9$ $A/cm^2$. Bundles of densely packed nanostructures can also have substantially lower resistance than copper.

Furthermore, the anisotropic thermal conductivity of nanotubes/nanofibers (6,000 W/Km) (see, e.g., Hoenlien, W., et al., *IEEE Trans. Compon. and Packaging Tech.*, 27(4), 629, (2004)) is also exceptionally promising for solving the growing problems of heat dissipation in semiconductor devices.

The added value for a CNT/CNF via or interconnect is scalability to nanometer dimensions with a large aspect ratio. Kreupl, et al. made a comparative analysis on the resistance between CNT's and gold wires of the same dimension, and by taking size effects into account they showed that CNF's can readily compete with ordinary metallization schemes and can offer the possibility of achieving orders of magnitude lower resistance (see, e.g., Kreupl, F.; Graham, A. P.; Duesberg, G. S.; Steinhogl, W.; Liebau, A.; Unger, E.; Honlein, W., *Microelectronic Engineering*, (2002), 64, (1-4), 399). Recent theoretical work performed by Naeemi et al. on CNT as interconnects revealed that performance enhancement at the 45 nm node (projected in the year 2010) is negligible compared to today's copper interconnects, but at the 22 nm node (projected in the year 2016) nanotube interconnects will be up to 80% faster than copper wires. In that case, bundles of CNTs are more preferable than single CNTs due to low density of states present in the quantum wires, which induces a large kinetic inductance per unit length, which then causes slow wave propagation. Hence CNF could perhaps be better interconnect materials, since they presumably possess a higher density of states than CNT due to their structural configuration. In terms of stability during current flow, Wei et al. observed no degradation of MWCNTs after a period of 350 hours at current densities exceeding $10^9$ $A/cm^2$ (Wei, B. Q.; Vajtai, R.; Ajayan, P. M., *Applied Physics Letters*, (2001), 79, (8), 1172).

In general, it is highly desirable to fabricate electronic devices that are compatible with existing complementary metal oxide semiconductor (CMOS) fabrication techniques. A prerequisite for exploring CNTs in an industrial process is to be able to control mass production of devices with high reproducibility. Due to high purity and high yield, chemical vapor deposition (CVD) is a popular and advantageous growth method that offers the potential to grow nanotubes at an exact location with control over their length, diameter, shape and orientation.

Hence for many electronic, nanoelectromechanical systems and interconnect applications the integration possibilities of carbon nanostructures into existing CMOS-based industrial manufacturing processes is expected to be a ground breaking technological development. However, there are many engineering and materials issues inherent to CMOS-compatible device fabrication processes that need to be addressed before such integration can take place. Solutions to these issues have so far been long-awaited.

For instance, there are difficulties in growing nanostructures. Although numerous techniques have been developed and demonstrated to produce carbon based nanostructures, all have drawbacks for mass production and integration into existing industry manufacturing processes. Prominent drawbacks are: (a) control over predictable morphology with either semiconducting or metallic properties; (b) precise localization of the individual structures as and when they are grown, and (c) predictable electrical properties at the interface between the grown nanostructures and the substrate. There is no known single solution to solve all the aforementioned drawbacks. The most prominent techniques for synthesizing carbon nanostructures include arc discharge (see, e.g., Iijima, S., *Nature*, 354, 56, (1991); and Kratschmer, W.; Lamb, L. D.; Fostiropoulos, K.; Huffman, D. R., *Nature*, 347, 354, (1990)), laser vaporization (see, e.g., Kroto, H. W.; Heath, J. R.; O'Brien, S. C.; Curl, R. F.; Smalley, R. E. *Nature*, 318, 162, (1985)), catalytic chemical-vapor deposition (CCVD), also referred to as CVD, (Cassell, A. M.; Raymakers, J. A.; Jing, K.; Hongjie, D., *J. Phys. Chem. B*, 103, (31), (1999)), and catalytic plasma enhanced chemical-vapor deposition (C-PECVD) (Cassell, A. M.; Qi, Y.; Cruden, B. A.; Jun, L.; Sarrazin, P. C.; Hou Tee, N.; Jie, H.; Meyyappan, M., *Nanotechnology*, 15(1), 9, (2004); and Meyyappan, M.; Delzeit, L.; Cassell, A.; Hash, D., *Plasma Sources, Science and Technology*, 12(2), 205, (2003)), all of which references are incorporated herein by reference in their entirety. Due to high purity and high yield, chemical vapor deposition (CVD) is a popular and advantageous growth method, and indeed, among all of the known growth techniques, CMOS compatibility has been demonstrated only for the CCVD method. (See, Tseng, et al. (Tseng, Y.-C.; Xuan, P.; Javey, A.; Malloy, R.; Wang, Q.; Bokor, J.; Dai, H., *Nano Lett.*, 4(1), 123-127, (2004), incorporated herein by reference) where a monolithic integration of nanotube devices was performed on n-channel semiconductor (NMOS) circuitry.)

There are specific problems related to control of the properties of materials grown by the various methods, however. Even though numerous different growth methods exist for growing carbon nanostructures, controlling the interface properties between the nanostructures and the substrates, the body of the nanostructures, and the tip of the nanostructures have not yet been demonstrated to be well controlled by utilizing a single method of growth.

CVD typically employs a metal catalyst to facilitate carbon nanostructure growth. The main roles of the catalyst are to break bonds in the carbon carrying species, to absorb carbon at its surface, and to reform graphitic planes by diffusion of carbon through or around an interface (see, e.g., Kim, M. S.; Rodriguez, N. M.; Baker, R. T. K., *Journal of Catalysis*, 131, (1), 60, (1991); and Melechko, A. V.; Merkulov, V. I.; McKnight, T. E.; Guillorn, M. A.; Klein, K. L.; Lowndes, D. H.;

Simpson, M. L., *J. App. Phys.*, 97(4), 41301, (2005), both of which are incorporated herein by reference).

The growth of nanotubes is usually carried out on silicon or other semiconducting substrates. Growth from metal catalysts on CMOS-compatible conducting metal substrates or metal underlayers is almost lacking in the art and has proved to be far from trivial, at least because different metals require different conditions. This is because it has been found that it is hard to make a good contact between a growing nanostructure and a conducting substrate and produce good quality grown nanostructures. It has also proven difficult to control the diameter, length and morphology of the resulting nanostructures and with predictable interface properties between the nanostructures and the substrate. Nevertheless, for making CMOS-compatible structures, it is necessary to use a conducting substrate. In particular, this is because a metal substrate, or base layer, acts as bottom electrode for electrical connection to the nanostructures.

A method for producing arrays of carbon nanotubes on a metal underlayer, with a silicon buffer layer between the metal underlayer and a catalyst layer, is described in U.S. Patent Application Publication No. 2004/0101468 by Liu, et al. According to Liu et al., the buffer layer prevents catalyst from diffusing into the substrate and also prevents the metal underlayer from reacting with carbon source gas to, undesirably, form amorphous carbon instead of carbon nanostructures. In Liu, the process involves, inconveniently, annealing the substrate in air for 10 hours at 300-400° C. to form catalyst particles via oxidation of the catalyst layer, prior to forming the nanostructures. Each catalyst particle acts as a seed to promote growth of a nanostructure. The method of Liu, however, does not permit control of the composition or properties of the nanostructures, and the nanotubes produced are curved and disorganized.

Accordingly, there is a need for a method of growing carbon nanostructures on a metal substrate in such a way that various properties of the nanostructures can be controlled and so that interconnects and heat dissipators based on carbon nanostructures can be reliably fabricated.

The discussion of the background to the invention herein is included to explain the context of the invention. This is not to be taken as an admission that any of the material referred to was published, known, or part of the common general knowledge as at the priority date of any of the claims.

Throughout the description and claims of the specification the word "comprise" and variations thereof, such as "comprising" and "comprises", is not intended to exclude other additives, components, integers or steps.

SUMMARY OF THE INVENTION

A nanostructure assembly comprising: a conducting substrate; a nanostructure supported by the conducting substrate; and a plurality of intermediate layers between the conducting substrate and the nanostructure, the plurality of intermediate layers including at least one layer that affects a morphology of the nanostructure and at least one layer to affect an electrical property of an interface between the conducting substrate and the nanostructure.

A multilayer interface between a catalyst and a substrate having: at least one layer to control morphology, and at least one layer to control an electrical interface between a nanostructure and base layer. In the multilayer interface, at least one layer is preferably of a semiconducting material such as silicon or germanium.

A nanostructure supported upon a metal substrate, wherein metal is interdiffused with a semiconducting layer between the nanostructure and the substrate.

The present invention also contemplates forming nanostructures at high temperatures but without prior annealing of a catalyst layer on which the nanostructures are grown. Preferably the temperatures employed are less than 750° C.

The present invention also contemplates a "lift-off" method of fabricating individual fibers: lift-off of polymer layer to provide individual layers.

Nanostructures formed according to the present invention may be used as interconnects, current carrying conductors, anisotropic heat directing media such as heat dissipators, and can be integrated into components: active/passive devices like diodes, transistors, capacitors, inductors, field emitting devices, optical devices, X-ray emitting devices, sensors, electrochemical probes etc.

A precursor for a nanostructure assembly, comprising: a conducting substrate; a catalyst layer; and a plurality of intermediate layers between the conducting substrate and the catalyst layer, the plurality of intermediate layers including at least one layer to affect morphology of a nanostructure to be formed on the catalyst layer and at least one layer to affect electrical properties of an interface between the support layer and the nanostructure.

A carbon nanostructure assembly comprising: a metal layer; a carbon nanostructure; and at least one intermediate layer between the metal layer and the carbon nanostructure, the at least one intermediate layer including a semiconductor material, a catalyst, and a metal from the metal layer.

A method of forming a nanostructure, comprising: depositing a layer of semiconducting material on a conducting substrate; depositing a catalyst layer on the semiconducting layer; without first annealing the substrate, causing the substrate to be heated to a temperature at which the nanostructure can form; and growing a nanostructure on the catalyst layer at the temperature.

A method of forming a nanostructure precursor, comprising: depositing a sacrificial layer on a conducting substrate; forming a plurality of apertures in the sacrificial layer; depositing an intermediate layer of semiconducting material over the sacrificial layer and on the substrate in the apertures; depositing a catalyst layer over the intermediate layer; and lifting off the sacrificial layer to leave portions of the intermediate layer and catalyst layer corresponding to the apertures on the substrate.

A method of forming interconnects or heat dissipation media, comprising: depositing an insulating layer such as silicon oxide ($SiO_2$) or any polymer insulator on formed nanostructures; etching away insulator to open up the top of the nanostructures, for example by dry or wet etching method(s), such as hydrofluoric acid (HF) (wet etching with 1-2% HF(aq) for 1-2 mins.), or $CF_4$ plasma (dry etching 100-150 W plasma power); depositing a sacrificial layer and forming a plurality of apertures in the sacrificial layer; depositing a layer of metal material over the sacrificial layer and on the substrate in the apertures and lifting off (for example by dipping in acetone at 60° C., then in IPA) the sacrificial layer to leave portions of the metal layer corresponding to the apertures on the substrate.

A method of forming an interconnect, the method comprising: depositing a layer of conducting material on a semiconducting substrate; depositing a semiconducting layer on the conducting material; depositing a catalyst layer on the semiconducting layer; without first annealing the substrate, causing the substrate to be heated to a temperature at which a nanostructure can form; and growing the nanostructure on the catalyst layer at the temperature.

An integrated circuit, comprising: a insulating substrate; a conducting layer, on the insulating substrate; a nanostructure embedded in the insulating layer, wherein the nanostructure is configured to dissipate heat from the integrated circuit into an area surrounding the circuit, and wherein the nanostructure comprises: a plurality of intermediate layers on the conducting layer, the plurality of intermediate layers including at least one layer that affects a morphology of the nanostructure and at least one layer that affects an electrical property of an interface between the conducting layer and the nanostructure.

An integrated circuit, comprising: a semiconducting substrate; a conducting layer, on the semiconducting substrate; an interconnect supported by the conducting layer, wherein the interconnect comprises at least one nanostructure, and wherein the nanostructure comprises: a plurality of intermediate layers on the conducting layer, the plurality of intermediate layers including at least one layer that affects a morphology of the nanostructure and at least one layer that affects an electrical property of an interface between the conducting layer and the nanostructure.

BRIEF DESCRIPTION OF THE DRAWINGS

FIG. 2 shows a flow-chart of an overall process for device fabrication according to the present invention.

FIG. 11 shows an example of growth of a nanostructure.

FIGS. 18A & B show schematics of layers on a conducting underlayer on a support, with Si as intermediate layer (FIG. 18A), and Ni catalyst deposited directly on the metal underlayer (FIG. 18B).

FIG. 19: Scanning electron microscopy (SEM) micrographs of metal underlayers after growth sequence. Only W and Mo metal underlayers facilitated appreciable CNT growth. In this set of experiments Ni was evaporated directly on the metal underlayers. Standard growth conditions ($V_B$=−400 V, $C_2H_2$:$NH_3$=1:5, time=15 min., T=700° C.) were used for all cases. All scale bars are 1 µm except FIG. 27(c) (200 nm).

DETAILED DESCRIPTION

Overview

Figure 1:
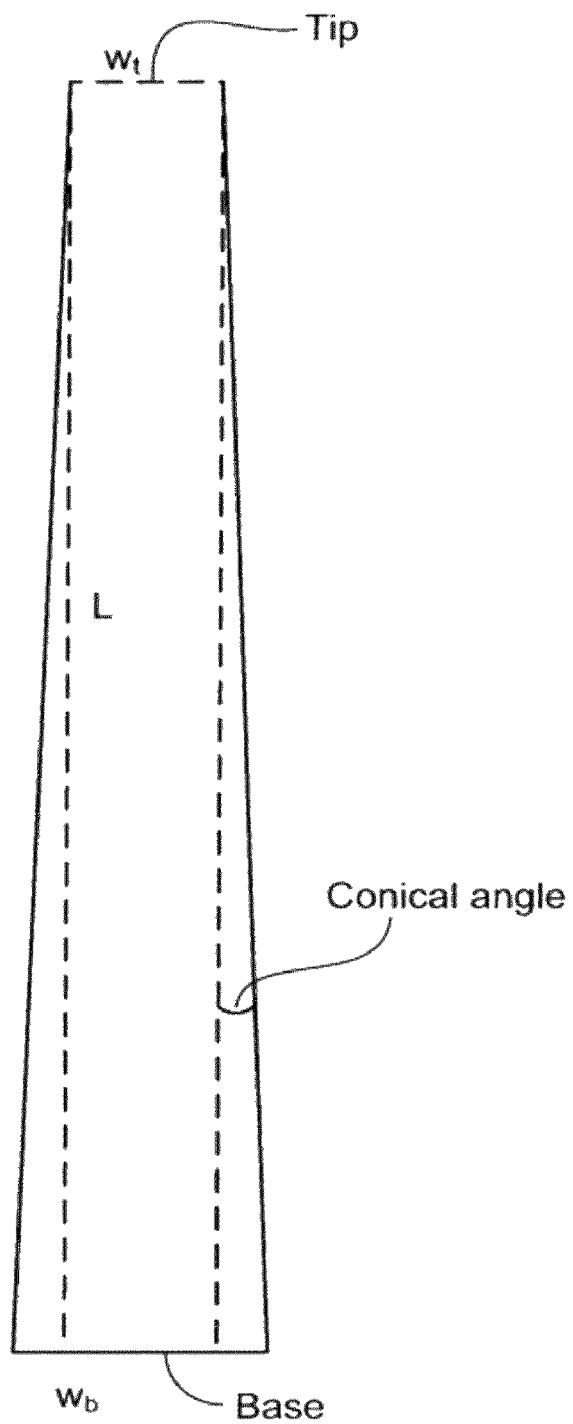
FIG. 1 shows a schematic of a carbon nanofiber.

The present invention is directed to interconnects and heat dissipators based on carbon nanostructures, and processes for making the same. Nanostructures may be made singly, or in arrays, on a conducting or insulating substrate. It is to be understood that, when referring to a conducting or insulating substrate herein, the conducting or insulating substrate may itself reside upon a support such as a semiconducting support, e.g., a silicon wafer or die. In particular, the processes of the present invention permit choices of material, and sequences of materials, lying between the substrate and the base of the nanostructure, to control various properties of the interface between the nanostructure and the substrate, properties of the body of the nanostructure, and the composition of the tip of the nanostructure. It is preferable that the nanostructures form columns that grow perpendicularly, or almost perpendicularly up from the substrate. However, this does not exclude the possibility to grow the nanostructures at other angles from the substrate such as parallel to the substrate, or at an inclined angle between 0° and 90°.

Accordingly, the present invention relates to interconnects and heat dissipators made by a method of growing/depositing nanostructures utilizing existing CMOS technology; a method of growing nanostructures for use as interconnects and heat dissipators on CMOS compatible conducting substrates, glass substrates, and flexible polymer substrates, as used in areas that utilize thin film technology. The present invention further comprises a method to control chemical interactions and hence to control the chemical compounds in the ends of the nanostructures. The present invention still further comprises a method to control the chemical reactions that form the nanostructures by having multilayer material stacks consisting of at least one intermediate layer between the substrate and a catalyst layer, wherein the intermediate layer is not of the same material as either the catalyst layer or the conducting substrate.

The present invention therefore provides a method for integrating nanostructures into CMOS technology, and achieving downscaling, higher component density, and new functionality in, e.g., integrated circuits.

The ability to grow nanostructures on different metal underlayers (metal substrates) is important for several other reasons, including the fact that the identity of the metal is an additional parameter that can be tuned to control parameters of grown nanostructures such as height, diameter, density, etc., and because different metal work functions can be exploited to control the height of a resulting Schottky barrier between the metal underlayers and the nanostructures, thus permitting control over device functionality.

By controlling the composition of material stacks, and the sequence of different materials in the stacks, the layers in a stack can be used to control properties of the grown/deposited nanostructures that are ultimately used in interconnects.

In particular, by varying the materials and sequence of the materials the properties of the following can be controlled: the interface between the nanostructure and the substrate can be controlled to have properties that include, but are not limited to, Ohmic barriers, Schottky contacts, or controllable tunneling barrier(s); the body of the nanostructures; and the chemical compositions of the tip of the nanostructures.

By controlling the properties of these three parts (the interface, the body, and the tip), different structures, components and devices can be fabricated which can be used in different applications. By controlling the properties of these three parts in combination with different structures, components and devices, different functionality can be achieved. For example, the tip of the nanostructure can be tailored to have a particular chemical property, or composition. Such tailoring permits the tip of the nanostructure to be functionalized in different ways.

Nanostructures

The nanostructures formed by the methods of the present invention and used as interconnects and as heat dissipators are preferably made predominantly from carbon. However, other chemical compositions are consistent with the methods of the present invention and are further described herein.

Nanostructures as referred to herein, encompass, carbon nanotubes, nanotubes generally, carbon nanostructures, other related structures such as nanofibers, nanoropes, and nanowires, as those terms are understood in the art.

By carbon nanotube, is meant a hollow cylindrical molecular structure, composed principally of covalently bonded sp$^2$-hybridized carbon atoms in a continuous network of edge-fused 6-membered rings, and having a diameter of from about 0.5 to about 50 nm. Typically a nanotube is capped at one or both ends by a hemispherical carbon cap having fused 5- and 6-membered rings of carbon atoms, though the nanotubes of the present invention are not necessarily capped. Carbon nanotubes may be, in length, from a few nanometers, to tens or hundreds of microns, to several centimeters.

The typical make-up of a CNT is analogous to a sheet of graphitic carbon wrapped on itself to form a closed surface, without any dangling bonds. Thus, CNT's typically consist of a closed network of 6-membered carbon rings, fused together at their edges. Most CNT's have a chirality that can be envisaged as arising if a sheet of graphitic carbon is sheared slightly before it is bended back on itself to form a tube. CNT's of any chirality may be formed by the present invention. It is also consistent with the present invention, however, that the carbon nanotubes also may have a number of 5-membered rings, fused amongst the 6-membered rings, as is found in, for example, the related "fullerene" molecules, and where necessary to, for example, relieve strain or introduce a kink.

Carbon nanotubes have electrical properties that range from metallic to semiconductors, depending at least in part on their chirality.

By suitable choice of materials lying in between the substrate and the base of the nanostructure, and their sequence, the morphology of the nanostructure that is formed can be tailored. Such nanostructures include, but are not limited to, nanotubes, both single-walled and multi-walled, nanofibers, or a nanowire. Such tailoring can arise from, e.g., the choice of texture of the catalyst layer that is positioned between the substrate and the nanostructure.

Carbon nanotubes made by the methods of the present invention may be of the single-walled variety (SWCNT's), having a cylinder formed from a single layer of carbon atoms such as a single layer of graphitic carbon, or of the multi-walled variety (MWCNT's), having two or more concentrically arranged sheaths of single layers. MWCNT's may consist of either concentric cylinders of SWCNT's or stacks of frusto-conical shaped single-walled structures.

A carbon nanofiber (CNF) is typically not hollow, but has a "herring-bone" or "bamboo"-like structure in which discrete segments of carbon fuse together one after another. The typical diameter ranges from 5 nm to 100 nm. A conical segment of catalyst-containing material is typically found at the tip of such a nanofiber. Carbon nanofibers are thus not crystalline and have different electrical conductivity from carbon nanotubes. Carbon nanofibers are effective interconnects in electronic circuits because they support electric current densities of around $10^{10}$ A/cm$^2$. Carbon nanofibers thus have a higher atomic density, given by numbers of carbon atoms per unit volume of fiber, than the hollow nanotubes.

Carbon nanofibers made according to the present invention also can be generally straight, and have a conical angle <2°, see FIG. 1, where the conical angle definition assumes that the base of the nanostructure is broader than its tip. Since an angle $\theta \approx \tan \theta$ when $\theta$ is small, the conical angle $\approx (w_b - w_t)/2$ L, where $w_b$ and $w_t$ are the width of respectively the base and the tip of the nanostructure, and L is its length, measured along its central (longitudinal) axis.

A carbon nanorope has a diameter in the range 20-200 nm, and thus is typically larger in diameter than a carbon nanotube. A carbon nanorope is typically constructed by intertwining several nanotubes in a manner akin to the way in which a macroscopic rope consists of several strands of fiber wound around one another. The various nanotubes in a nanorope may be twisted around one another or may line up substantially parallel to one another; the individual nanotubes are held together principally by van der Waals forces between the adjacent surfaces of the nanotubes. Such forces, although individually weaker than a covalent bond between a pair of atoms, are in the aggregate very strong when summed over all of the pairs of atoms in adjacent tubes.

The Interface

According to the present invention, by suitable choice of materials and their sequence, the interface between the base of the nanostructure and the substrate can be chosen to have various electrical properties. For example, it can be chosen to be an Ohmic contact, a Schottky barrier, or a controllable tunnel barrier. This can be useful when the nanostructure is used as an interconnect An Ohmic contact is a metal-semiconductor contact with very low resistance, independent of applied voltage (and which may therefore be represented by a constant resistance). The current flowing through an Ohmic contact is in direct proportion to an applied voltage across the contact, as would be the case for an Ohmic conductor such as a metal. To form an Ohmic contact, the metal and semiconductor must be selected such that there is no potential barrier formed at the interface (or so that the potential barrier is so thin that charge carriers can readily tunnel through it).

A Schottky barrier is a semiconductor-metal interface in which the metal-semiconductor contact is used to form a potential barrier.

A tunnel barrier is a barrier through which a charge carrier, such as an electron or a hole, can tunnel.

FIG. 2 is a flow-chart that describes in overview a process of making nanostructures on a substrate as may be used with the present invention. First, one chooses a stack material, step 10. Then, a stack is created from the chosen materials, step 20, for example by deposition, sputtering or evaporation on to a substrate. Then, nanostructures are grown on the stack, step 30, for example in a growth/deposition chamber. Finally, the structure is incorporated into a device such as in the form of an interconnect of a heat dissipator, by one or more additional fabrication techniques, step 40.

Chemical Vapor Deposition (CVD) is the preferred method for growth of nanostructures for use with the present invention. However, there are different kinds of CVD methods that can be used, e.g., thermal CVD, PECVD, RPECVD, MOCVD (metallo-organic CVD), etc. It would be understood by one of ordinary skill in the art, that other variants of CVD are compatible with the present invention and that the practice of the present invention is not limited to those methods previously referenced.

It is preferable that the substrate for use with the present invention is a conducting substrate. Accordingly, it is preferably a metal, or a metal alloy substrate. This substrate may itself be disposed on a semiconducting support such as a silicon die.

By the methods of the present invention, step 10 can influence the properties of the nanostructures that are grown. In particular, the nature and properties of the nanostructure are governed by the nature and extent of interdiffusion of the layers between the substrate and the nanostructure. Permitting interdiffusion can control the diameter and morphology of the nanostructure, the number of nanotubes that grow per unit area of substrate, as well as the density of an individual nanostructure, and the electrical properties of the interface. On the other hand, using materials that impede diffusion between the substrate and the carbon nanostructure can control chemical interactions with the interface materials on both sides of the material, as well as the electrical properties of the interface.

The layers of materials in the stack can be deposited as a continuous film in the case where it is desired to grow many, e.g., an array of several hundreds or many thousands of, nanostructures on a single substrate. A patterned film can also be used to control the properties of the individual nanostructures but in specific localized areas, leading to fabrication of individual devices. The deposited film thickness may vary from 0.5 nm to more than 100 nm, e.g., as much as 150 nm, 200 nm, or even 500 nm, depending on the substrate underneath. Preferably, however, the thickness of the film is from 1 to 10 nm, and even more preferably, from 5 to 50 nm.

The nanostructures of the present invention can also be grown individually rather than as a dense "forest" of many nanostructures grown simultaneously. For example, such nanostructures may be discrete carbon nanofibers. This is the case where catalyst layer and sizes of catalyst areas are defined by lithography, for example. For the case where a continuous film (in the form of stripes and squares larger than 100 nm×100 nm) is used, more densely packed structures are possible (approximately 15 nm spacing between two adjacent nanostructures is preferred). In such continuous film configurations, the packing density and resulting diameter of the nanostructures can still be controlled by the choice of support layer.

In particular, the body of the nanostructures can be designed to be structures that have the following characteristics: hollow with electrical properties such as semiconducting or metallic; not hollow with different electrical properties (mainly metallic); hollow with different mechanical properties; and not hollow with different mechanical properties.

Controlling Nanostructure Properties

The present invention encompasses nanostructures grown from substrates, and interface layers situated therebetween, having the following characteristics. The substrate is preferably a metal layer, which may be disposed on a support. The support is typically a wafer of silicon or other semiconducting material, glass, or suitable flexible polymer used in thin film technology. The metal is preferably selected from the group consisting of molybdenum, tungsten, platinum, palladium, and tantalum. The thickness of the metal layer is preferably in the range 1 nm to 1 μm and even more preferably in the range 1 nm to 50 nm. The metal layer is preferably deposited by any one of several methods known in the art, including but not limited to: evaporative methods such as thermal or vacuum evaporation, molecular beam epitaxy, and electron-beam evaporation; glow-discharge methods such as any of the several forms of sputtering known in the art, and plasma processes such as plasma-enhanced CVD; and chemical processes including gas-phase processes such as chemical vapor deposition, and ion implantation; and liquid-phase processes such as electroplating, and liquid phase epitaxy. Examples of deposition technologies are found in *Handbook of Thin Film Deposition*, K. Seshan, Ed., Second Edition, William Andrew, In., (2002).

The interface layers, also called intermediate layers or an intermediate layer, comprise one or more layers, in sequence, disposed upon the conducting substrate. On top of the interface layers is a layer of catalyst. The nanostructure is grown from on top of the catalyst layer.

The interface layers may consist simply of a single layer of material. In this circumstance, the single layer is preferably silicon or germanium. The layers can be deposited in the form of amorphous or crystalline by techniques such as evaporation, or sputtering. The preferable thickness ranges from 1 nm to 1 μm, and even more preferably in the range 1 nm to 50 nm.

The interface layers may comprise several layers of different materials and may be, arbitrarily, classified according to function. For example, the layers in the vicinity of the substrate are characterized as layers that influence the electrical properties of the interface. The layers in the vicinity of the catalyst are characterized as layers that influence the composition and properties such as electrical/mechanical properties of the nanostructure.

Various configurations of interface layers are compatible with the present invention. For example, a sequence of up to 3 layers may be deposited on the substrate, for the purpose of controlling the electrical properties of the interface. Such configurations include, but are not limited to: a sequence of insulator, conductor or semiconductor, and insulator; a sequence of insulator adjacent to the substrate, and a semiconducting layer; a sequence of semiconductor, insulator, semiconductor; a sequence of two insulating barrier layers adjacent to the substrate, and a semiconductor; a single layer of a metal that is different from the metal of the substrate; and a sequence of a metal that is different from the metal of the substrate, and a semiconducting layer. In such configurations, the insulator may be selected from the group consisting of: $SiO_x$, $Al_2O_3$, $ZrO_x$, $HfO_x$, $SiN_x$, $Al_2O_3$, $Ta_2O_5$, $TiO_2$, and ITO.

The semiconductor may be silicon or germanium. The metal, where present, may be palladium, platinum, molybdenum, or tungsten. Where two layers of the same character are present, e.g., two semiconducting layers, it is not necessary that the layers have the same composition as one another.

The uppermost layer of the foregoing interface layers may itself abut against the catalyst layer. This is particularly the case where the uppermost layer is a semiconductor such as silicon or germanium. However, it is additionally possible for the foregoing interface layers to have disposed upon them a further layer or sequence of layers that lies between them and the catalyst layer. Such additional, or second, interface layers are thought of as controlling the properties and composition of the nanostructure. The second interface layers may be a pair of layers, such as a metal layer and on top thereof a semiconductor layer adjacent to the catalyst layer. Alternatively, the second interface layers may simply consist of a single layer of semiconductor. The metal layer, where present in the second interface layers, is preferably selected from the group consisting of tungsten, molybdenum, palladium, and platinum. The semiconducting layer in the second interface layers is preferably silicon or germanium.

The catalyst layer is typically a layer of metal or metal alloy, and may contain very fine particles of metal or metal alloy instead of being a continuous film. The catalyst layer preferably comprises a metal selected from the group consisting of nickel, palladium, iron, nickel-chromium alloy containing nickel and chromium in any proportions, and molybdenum.

The invention is primarily focused on a multi-stack configuration of at least one material layer between the catalyst layer and the conducting substrate, wherein the material is not of the same kind as the catalyst or the conducting substrate, and wherein the material controls the chemical reactions between the various layers. Thus, the growth of the nanostructures on different conducting substrates can be controlled. Thereby the morphology and properties of the grown structures as well as the tip materials of the grown structures can be controlled. The current invention can be extended to having several stacks of materials of different kinds (semiconducting, ferroelectric, magnetic, etc.) which can be used to control the properties at base/interface, the body, and the tip of the nanostructure. It is also possible that the nanostructure is grown upon a conducting layer which is itself deposited on a substrate that itself can be of any kind, such as conducting, insulating or semiconducting.

High-k dielectric materials are mainly used as gate materials for CMOS devices. In the present invention such materials are utilized in part in multi-layer stacks to define the properties of the grown nanostructure as well as to control the interface properties between the nanostructure and the conducting layer.

According to the methods of the present invention, the presence of two or more intermediate layers will influence the texture/crystallographic structures of each other and the final catalyst particles.

Accordingly, the present invention preferably includes a conducting layer, at least one intermediate layer directly on the conducting layer, at least one catalyst layer directly on the intermediate layer, and a nanostructure on the catalyst layer.

The substrate may be disposed on a support commonly used in semiconductor processing, such as a silicon wafer, or oxidized silicon wafer. The support may alternatively be a glass or metal or thin flexible polymer film used in the thin film technology as substrate.

It is to be understood that the at least one intermediate layer is chosen to control various electrical properties of the interface between the substrate and the nanostructure.

It is further to be understood that the choice of at least one catalyst layer controls various properties of the nanostructure.

The grown nanostructures are preferably carbon-based materials such as carbon nanotubes (CNT), and carbon nanofibers (CNF). Carbon nanostructures form when the entire structure is placed in a mixture of carbon-containing gases. Preferred gases are hydrocarbons such as $CH_4$, $C_2H_2$, and $C_2H_4$, and generally aliphatic hydrocarbons having 5 or fewer carbon atoms, of any level of saturation.

The nanostructures can also be of different semiconducting materials referred to as III-V, or II-VI materials, such as InP, GaAs, AlGaAs, depending on the choice of catalyst and subsequent chemical chamber conditions used. Keeping all the other materials stack same as for a carbon nanostructure described herein, simply changing the catalyst type and/or the composition of gases can facilitate growth of these non-carbon nanostructures. Therefore without deviating from the other aspects of the invention described herein, a person of ordinary skill in the art can grow solid state nanostructures of different compositions. Examples of conditions for forming such nanostructures are as follows.

SiC nanostructures: chamber—MOCVD (metallo organic CVD); gas composition—dichloromethylvinylsilane [$CH_2CHSi(CH_3)Cl_2$]; catalyst—Ni; and temperature: 800-1200° C.

Si nanostructures: chamber type—vapor-liquid-solid (VLS)/CVD; gas composition—$SiH_4$, $Si_2H_6$; catalyst—Ni; and temperature 500-1000° C.

InP/GaP nanostructures: chamber—MOCVD/CVD; gas composition—elemental indium and gallium with triphenyl phosphine, trimethyl-gallium and $N_2$; catalyst; and temperature: 350-800° C.

GaN nanostructures: chamber—MOCVD (metallo organic CVD); gas composition—elemental gallium and ammonia gas; catalyst—Ni; and temperature: 800-900° C.

ZnO nanostructures: chamber—MOCVD/CVD; gas composition—oxidation of Zinc carrying elements; catalyst—Ni; temperature 300-700° C.

The grown nanostructures for materials other than carbon can be of the form of forests consisting of uniform structures covering the substrate area and/or arrays, or individual structures.

The choice of catalyst plays an important role because the growth of carbon nanostructures is ordinarily catalytically controlled. Since the crystallographic orientation of the catalysts assists in defining the morphology of the nanostructure, it is expected to obtain different growth mechanisms from different types of catalyst. Besides catalyst crystallographic orientation, there are many other growth conditions that influence the structure formation, such as the mixture of gases, current density for the case when plasma density is controlled, voltage between the cathode and anode, temperature of the substrate, chamber pressure, etc. (see, e.g., Kabir, M. S.; Morjan, R. E.; Nerushev, O. A.; Lundgren, P.; Bengtsson, S.; Enokson, P.; and Campbell, E. E. B., *Nanotechnology* 2005, (4), 458, incorporated herein by reference).

FIGS. 3A, 3B, and 4-12 show exemplary nanostructures, fabricated according to methods described herein, that can form the basis of interconnects and heat dissipators. Typically, the fabricating of interconnects and heat dissipators from structures shown in FIGS. 3A, 3B, and 4-12 is according to the steps for making such structures, and is followed by: deposition of an insulating layer that surrounds and covers the nanostructure in question; etching or polishing the insulator back so that the upper surface of the insulating layer exposes the top of the nanostructure; and depositing a further metal layer on top of the exposed nanostructure.

Figure 3A:
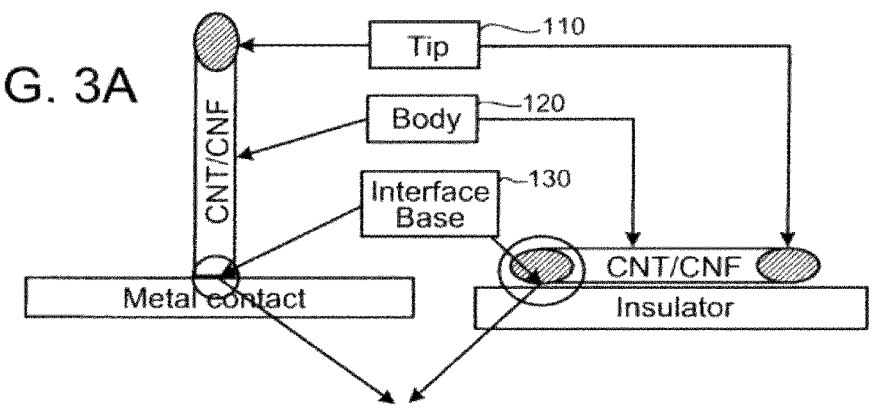
FIGS. 3A and 3B show various configurations of nanostructures of the present invention.
Figure 3B:
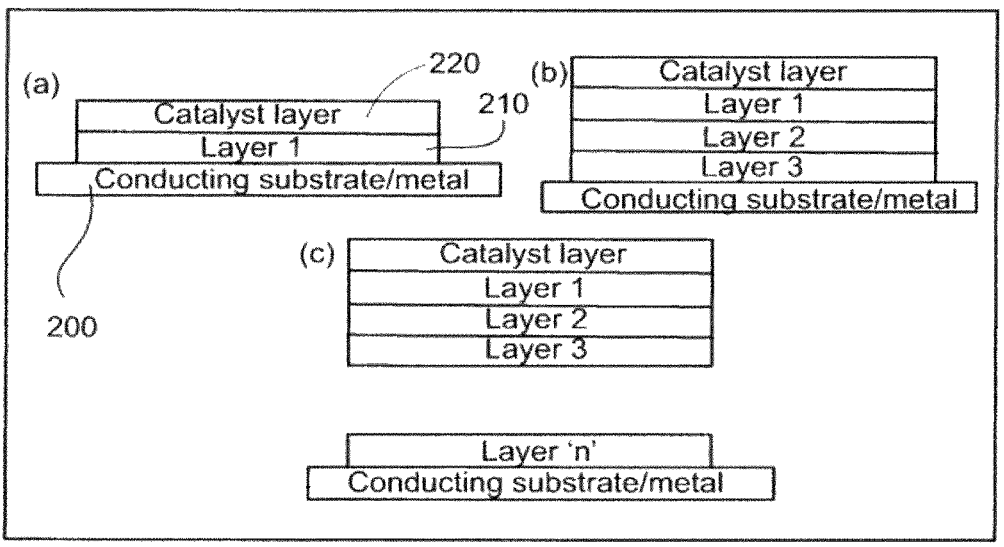

FIGS. 3A and 3B show an overview of various structures according to the invention. FIG. 3A shows how a carbon nanostructure having a tip 110, body 120 and a base 130, and made by processes described herein, is positioned vertically on a metal substrate as in the left-hand side of FIG. 3A, or horizontally on an insulating substrate as in the right-hand side of FIG. 3A. Positioning a nanostructure on an insulating substrate will allow for further processing for making functional devices and is particularly important for heat-dissipating embodiments. A bottom substrate (not shown) underneath the insulating layer can be used as a bottom gate dielectric, and a substrate underneath an oxide layer as bottom gate electrode to e.g., modulate the resistance of a semiconducting nanostructure. See FIG. 3B.

FIG. 3B shows various configurations of one or more intermediate layers 210 between a conducting substrate 200 and a catalyst layer 220. The invention proposes a platform comprising at least one material stack (denoted, e.g., layer 1) between the catalyst layer and the conducting substrate. The purpose of the multiple materials stacks (denoted, e.g., layer 1, layer 2, . . . layer n) is to control the interface properties between the conducting substrate and the grown nanostructures (for example, ranging from Ohmic contact to Schottky barrier), the properties of the grown nanostructures (morphology, mechanical, and electrical properties), and the properties of the tip 110 of the grown nanostructures.

Figure 4:
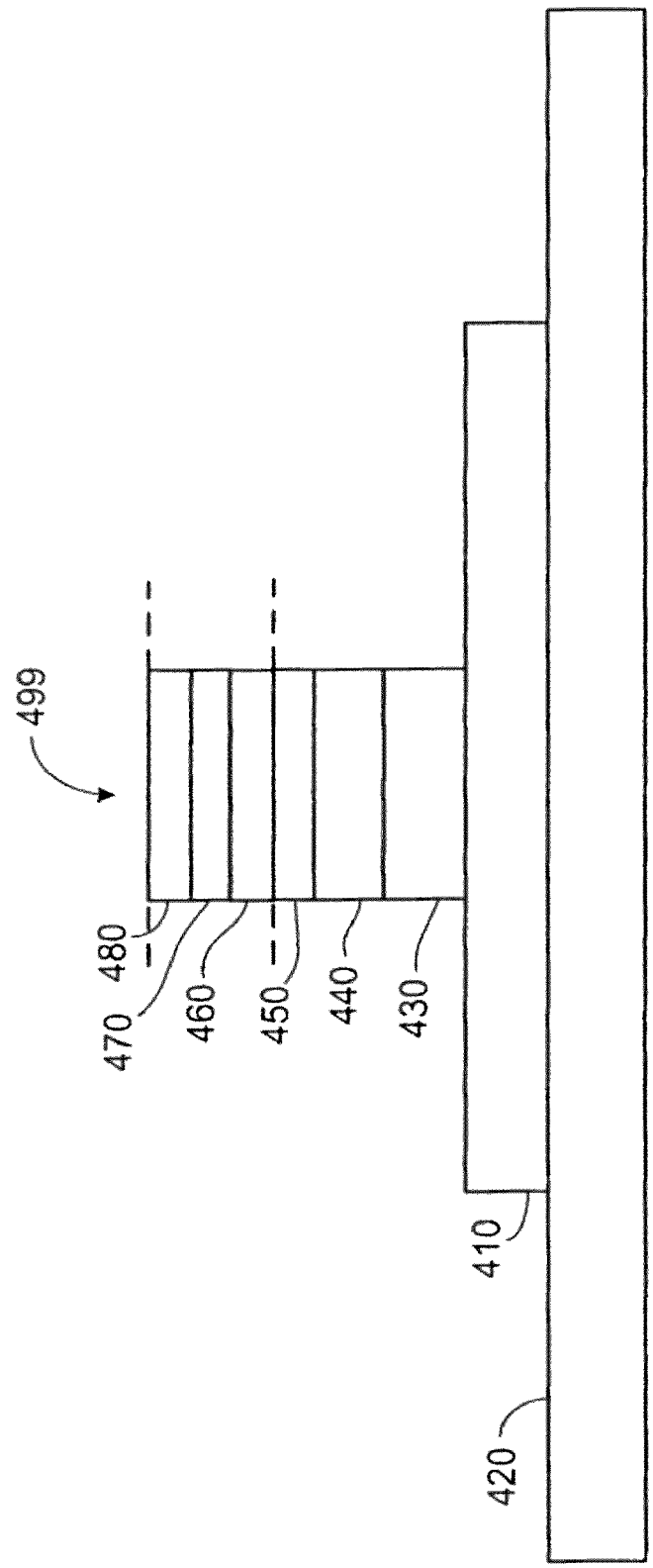
FIG. 4 shows a multilayer stack between a metal layer and a nanostructure, having various segments of different functionalities.

FIG. 4 shows a representative embodiment having a multilayer stack supporting a partially formed nanostructure 499. A metal layer 410 acts as a substrate, and is disposed on a support 420, e.g., a wafer of silicon. A 3-layer stack acts as an intermediate layer between the metal substrate and a second stack of catalytic layers and controls the electrical properties of the interface. The intermediate layer comprises, in order, starting with a layer in contact with the metal: a first control layer 430, of e.g., an insulator such as $SiO_x$, or $Al_2O_3$; on top of the first control layer is a metal/semi-metal layer 440, e.g., Ge; on top of the metal/semi-metal layer is a second control layer 450 of, e.g., $ZrO_x$ or $HfO_x$ or any other material with high k dielectric value such as $SiN_x$, $Ta_2O_5$, $Al_2O_3$, and $TiO_2$. The subscript 'x' in a chemical formula denotes a variable stoichiometry, usually controllably variable. The two control layers control diffusion from respectively the metal/semi-metal layer into the substrate and into the catalyst stack. The thickness and composition of the two control layers provide two variables with which such control may be achieved. The thickness for a single layer ranges from less than 10 nm to several hundreds of nanometers and the thickness of the total material stack ranges from less than 10 nm up to microns and above. Together, the first control, metal/semi-metal, and second control layers permit control of electrical properties of the interface between the metal and the carbon nanostructure. To obtain different electron/hole tunneling properties, it is a matter of choosing different oxides for the control layers to give a variation of electrical tunneling properties and hence varying electrical properties of the interface between the nanostructure and the base substrate 410. Principally, such choices are determined by the dielectric constant of the control layer materials such as oxides.

Also referring to FIG. 4, a multilayer stack disposed on the second control layer 450 controls properties of the carbon nanostructure that grows above it. In the example shown, adjacent to the second control layer is a first metal layer 460, e.g., tungsten, molybdenum, palladium, platinum; adjacent to the first metal layer is a silicon layer 470; and on top of the silicon layer is a second metal layer 480 composed of, e.g., nickel or palladium.

Figure 5:
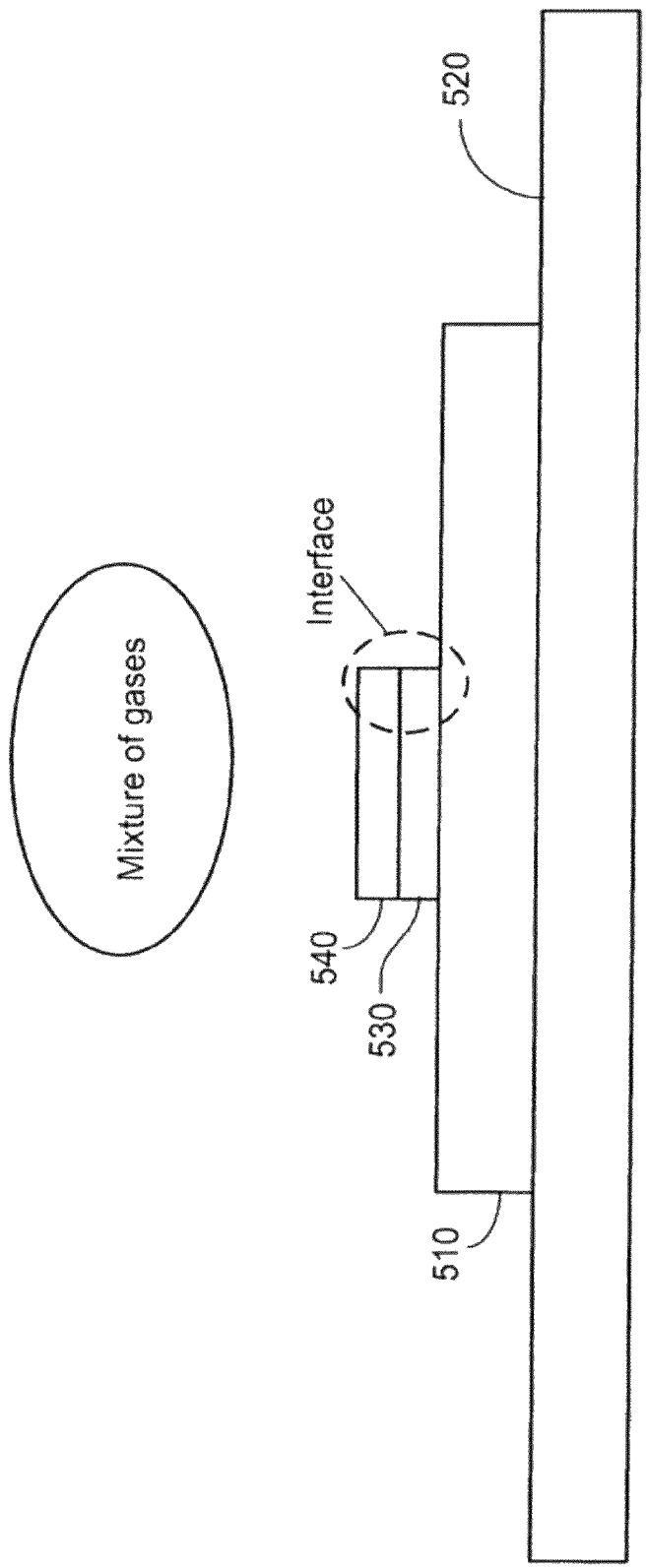
FIG. 5 shows a step in creation of an individual nanostructure.
Figure 6:
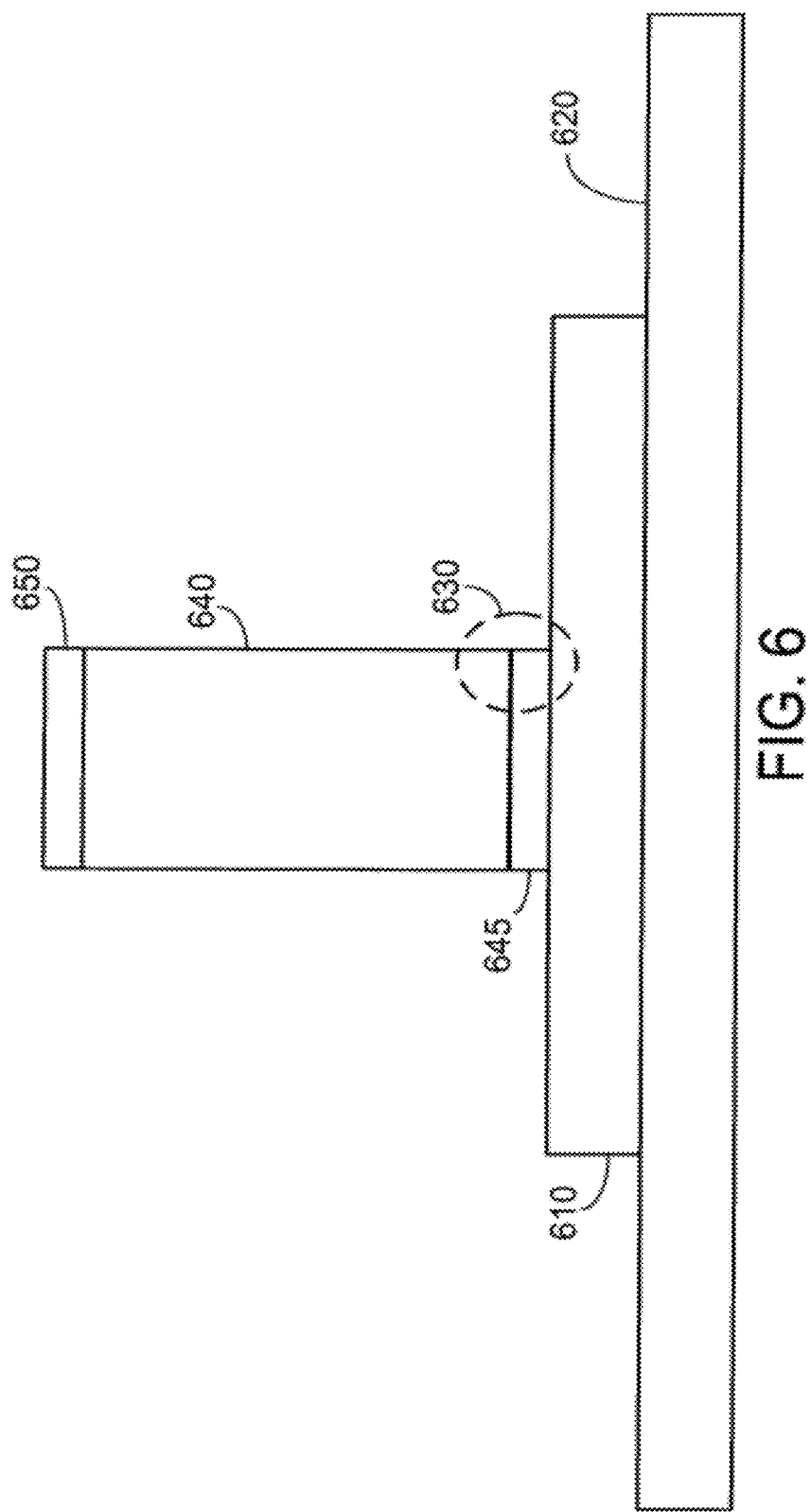
FIG. 6 shows an individual nanostructure with a single layer between the nanostructure body and a metal substrate.

FIGS. 5 and 6 show embodiments of a device having a single intermediate layer. In FIG. 5, a metal layer 510 is on a wafer 520; an intermediate layer of silicon 530 is on the metal layer; and a catalyst layer 540, typically Ni, or Fe, or others such as NiCr or Pd, is on the intermediate layer 530. Together, layers 530 and 540 are referred to as the interface.

In FIG. 6, another typical individual nanostructure is shown. In this structure, a metal layer 610 is on a wafer 620; an interface 630 between the metal layer and a body of a nanostructure 640 is formed from an intermediate layer of semi-conducting material 645 such as silicon. The tip 650 of the nanostructure contains a mixture of materials, including principally catalyst that has diffused up the body of the nanostructure as the nanostructure has grown, and also some metal.

Figure 7:
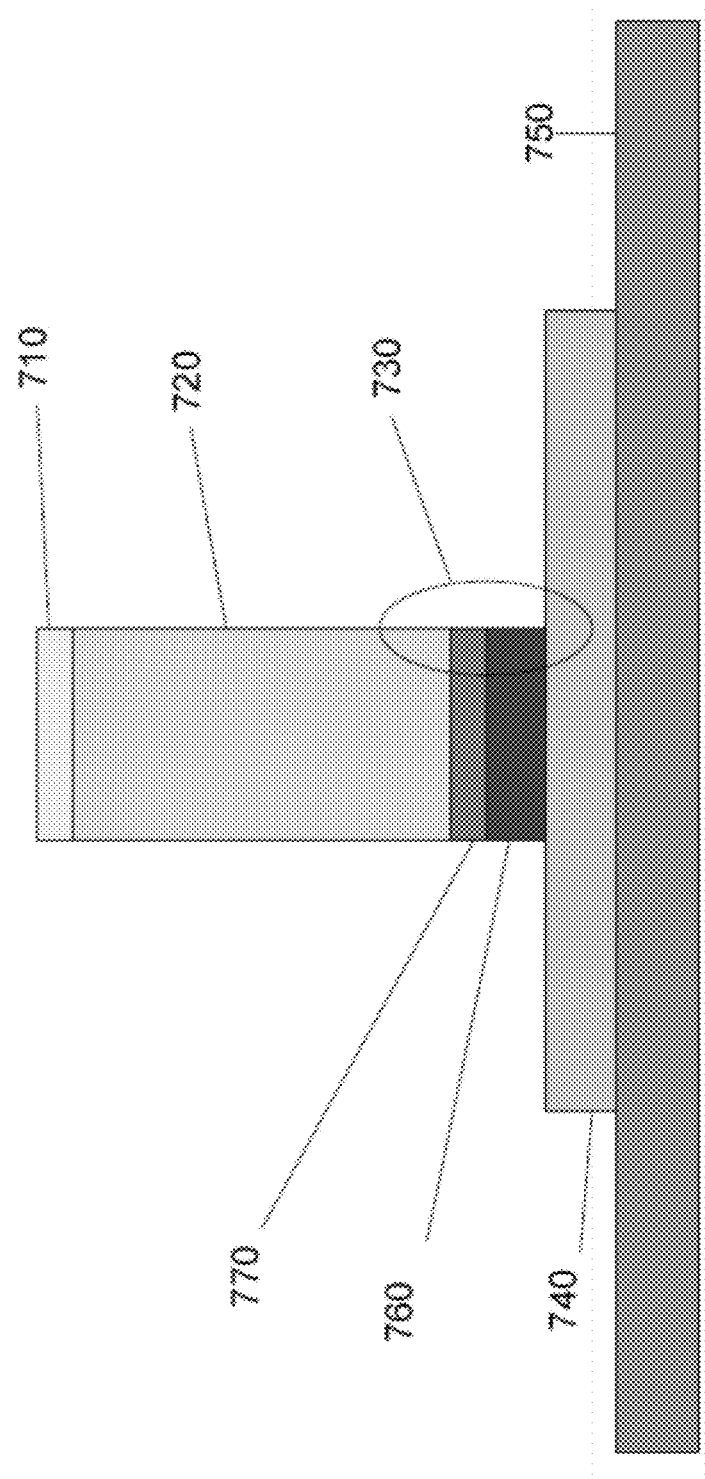
FIG. 7 shows an individual nanostructure.

FIG. 7 shows another embodiment of a nanostructure having a tip 710, a body 720, and an interface 730. A metal layer 740 is disposed on a wafer 750 and consists of a metal selected from the group consisting of molybdenum, tungsten, platinum, tantalum, and palladium. A two-layer interface 730 is on the metal layer 740 and has a first intermediate layer 760 of oxide, such as $SiO_x$, $ZrO_x$, $HfO_x$, or $TiO_x$; a second intermediate layer 770, composed of silicon, is disposed on the first intermediate layer and is in contact with the body of the nanostructure. The tip 710 of the nanostructure contains Ni, Fe, Mo, or Pd, or an alloy such as NiCr or a mixture of the materials found in the material stack. The metal content of the tip originates with a layer of catalyst (not shown in FIG. 7) that was situated between the uppermost intermediate layer and the bottom of the nanostructure.

Figure 8:
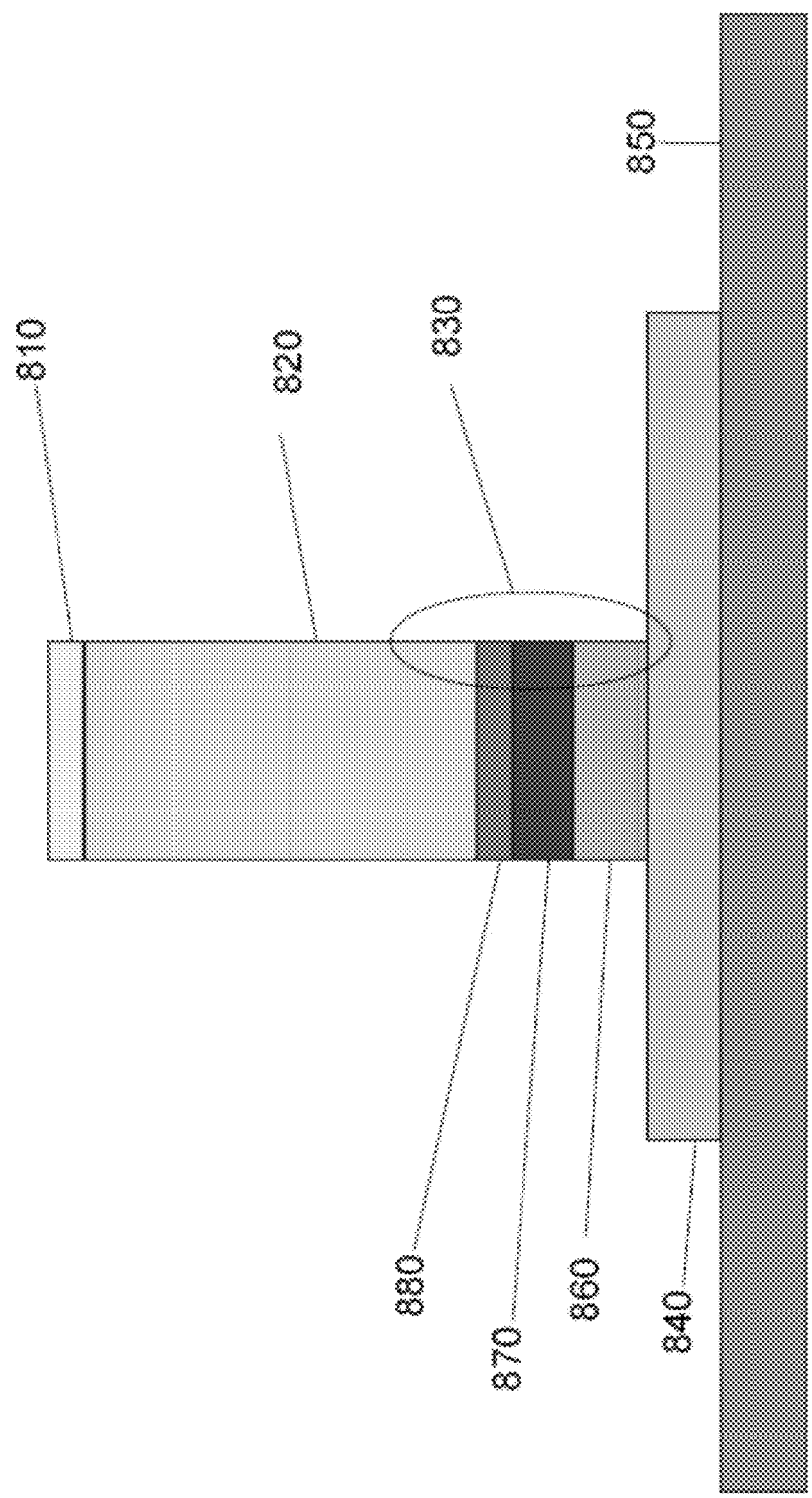
FIG. 8 shows an individual nanostructure having a multilayer stack.

FIG. 8 shows another nanostructure having a tip 810, a body 820, and an interface 830 which comprises a multi-layer stack. A metal layer 840 is disposed on a wafer 850. A three-layer interface 830 is on the metal layer 840 and has a first intermediate layer 860 of semi-metal such as germanium; a second intermediate layer 870 of oxide, such as $SiO_x$, $ZrO_x$, $HfO_x$, or $TiO_x$; and a third intermediate layer 880, composed of silicon, which is in contact with the body of the nanostructure. The tip of the nanostructure contains Ni, Fe, Mo, or Pd, or an alloy such as NiCr or a mixture of the materials found in the interface.

Figure 9:
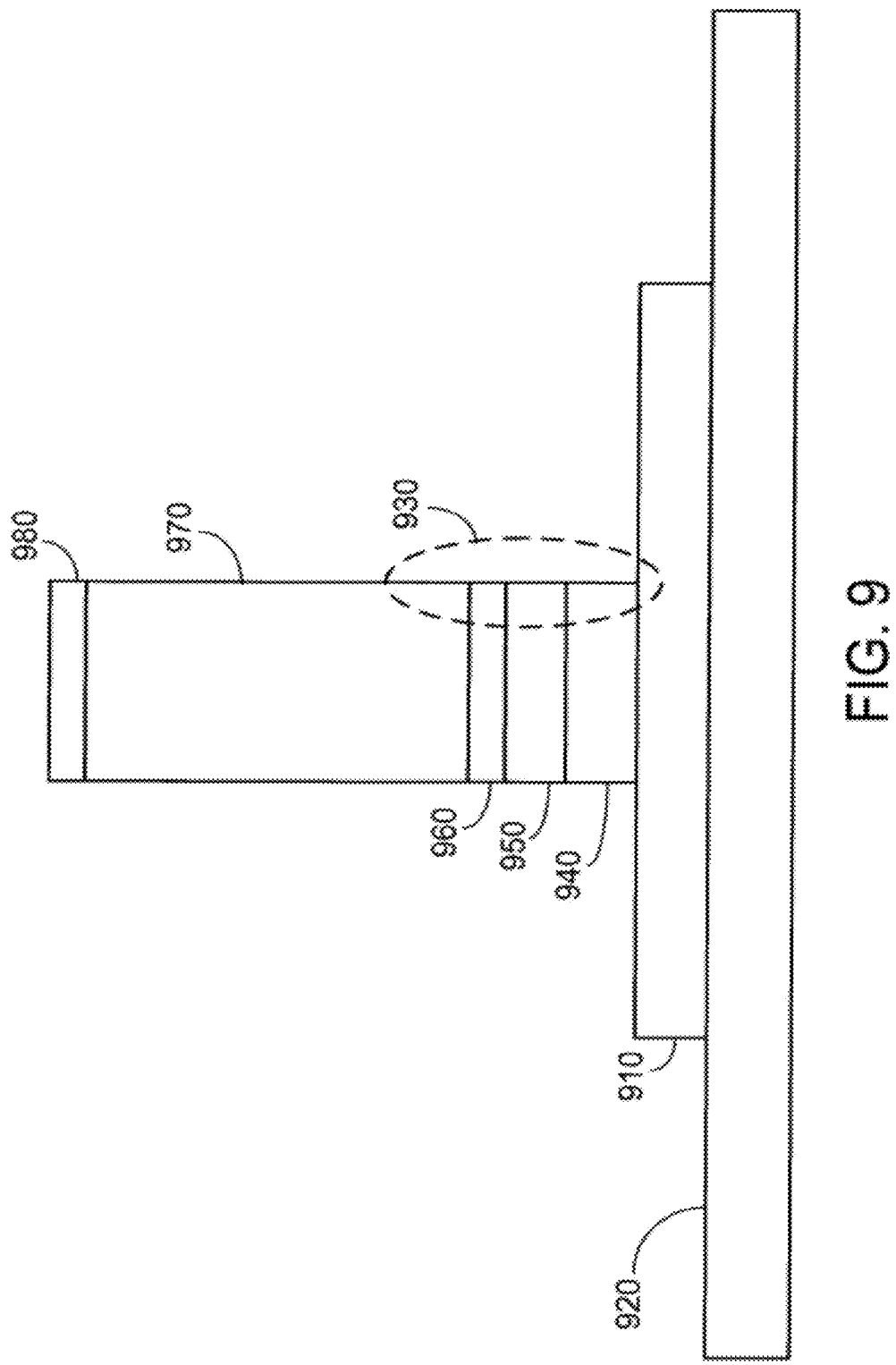
FIG. 9 shows an embodiment of a nanostructure.

FIG. 9 shows another embodiment of a nanostructure: a metal layer 910 is disposed on a wafer 920; an interface 930 having three intermediate layers is disposed on the metal layer 910. The three intermediate layers, in sequence moving away from the metal, are: a second barrier layer 940, a first barrier layer 950 and a semiconducting layer 960, in contact with the body of the nanostructure 970. The first barrier layer can be used as a barrier to diffusion of material upwards/downwards, and the second barrier layer can be used as defining the electrical tunnel barrier. The body of the nanostructure can have electrical properties either as a semiconductor or a conductor. The tip 980 of the nanostructure contains catalyst.

Figure 10:
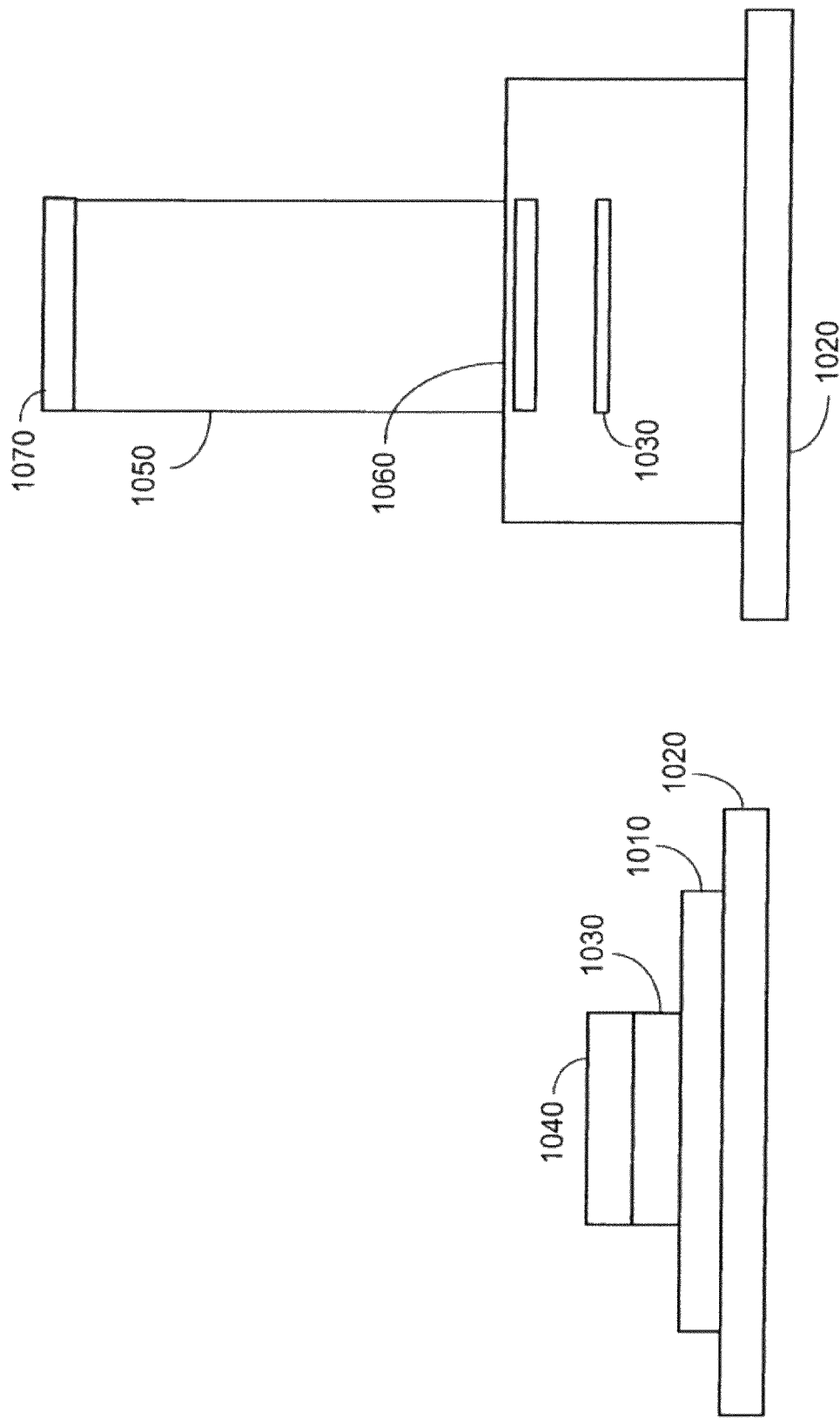
FIG. 10 shows an intermediate stage in a process of making a nanostructure.

As is seen from FIGS. 6-9, catalyst diffuses into the body of the nanostructure during growth initiation. This process is described in further detail in FIG. 10. In FIG. 10, a metal underlayer 1010 of a metal such as W, Mo, Pt, Pd, is on a wafer 1020. An intermediate layer of a semiconducting material 1030 such as silicon or germanium, or a compound of III-V elements from the periodic table, is on the metal underlayer. A catalyst layer 1040 having a metal such as Ni, Fe, Co, or an alloy such as NiCr is on the intermediate layer.

A stage during growth of the nanostructure is shown in the right-hand panel of FIG. 10. An expanded view of the metal underlayer is shown. An interface 1060 between the metal underlayer and the body 1050 of the growing nanostructure contains an alloy of catalyst with metal underlayer, metal silicides, and the metal underlayer The intermediate layer 1030 is used to start the growth process. However it diffuses into the metal underlayers creating metal compounds such as metal-silicides if the intermediate layer is silicon, which function as Ohmic contacts with the metal underlayer. Accordingly the nanostructure is grown by direct contact with metal underlayer where no intermediate layer is present in between the initial catalyst and metal underlayer. A small portion of catalyst is present at the bottom. The tip consists of catalyst rich metal underlayer: a large portion of catalyst is present at the tip of the nanostructure together with a small portion of metal underlayer.

In FIG. 11, an embodiment of nanostructure growth uses a tungsten (W) metal underlayer 1110 on a wafer 1120. A stack having a layer of silicon 1130 on top of the metal underlayer, and a layer of nickel 1140 on top of the silicon is in contact with a growing nanostructure 1180. The material stack conditions before growth (FIG. 11, left hand panel) show discrete layers. The material stack conditions after growth (FIG. 11, right hand panel) show that interdiffusion amongst the layers has occurred: there are now distinct regions of nickel-tungsten alloy 1150, tungsten-silicon alloy 1160, and undiffused tungsten 1170. It is also consistent with the conditions that the regions of, e.g., nickel and tungsten have a gradation of properties without a discontinuity in the concentrations of the respective metals or a sharp concentration gradient.

Figure 12:
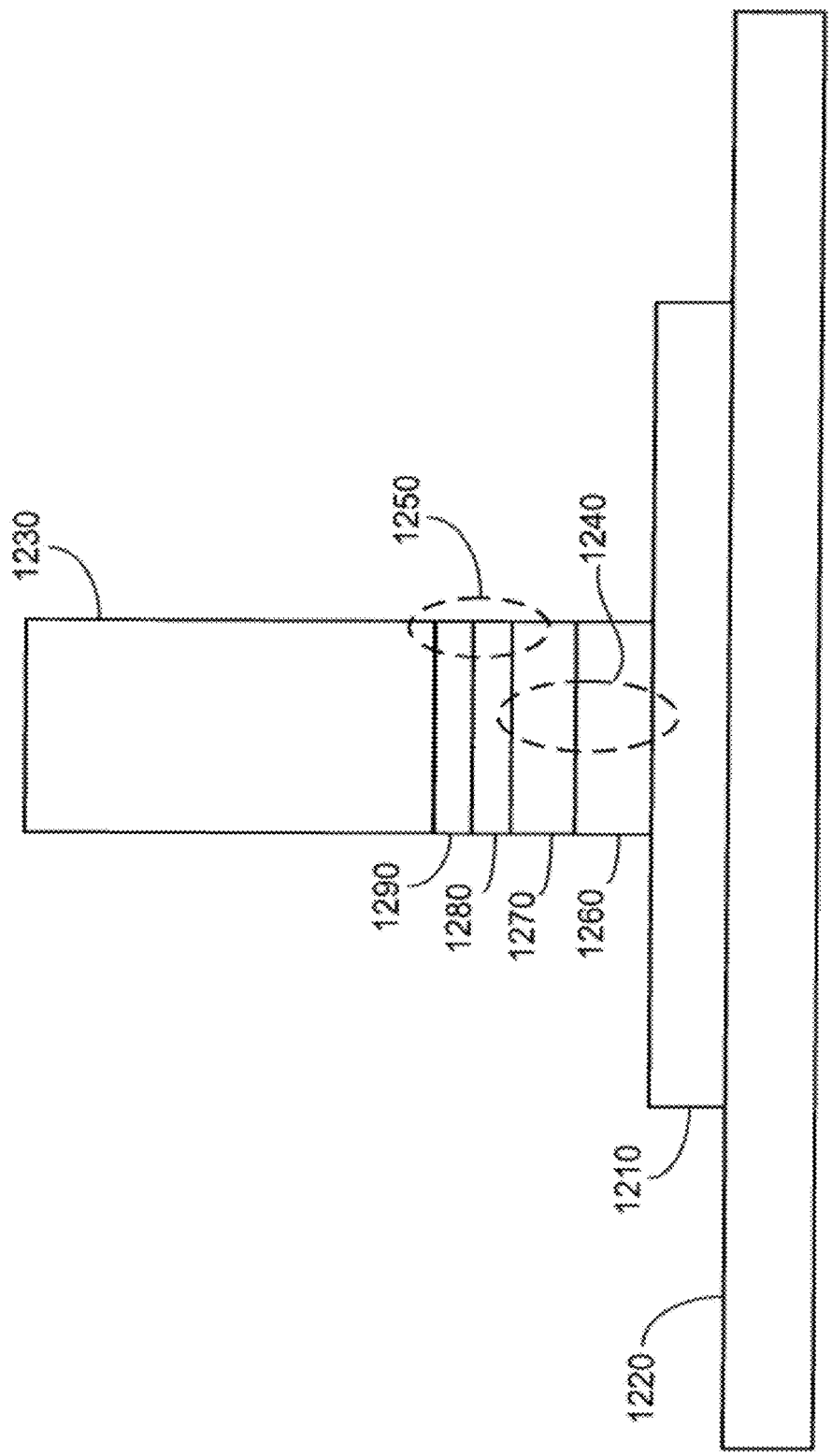
FIG. 12 shows layers that control properties of an individual nanostructure.

FIG. 12 shows a multilayer stack between a metal underlayer 1210 and a nanostructure body 1230. The multilayer stack comprises two interfaces, a first interface 1240 to control electrical properties of the interface, and a second interface 1250 to control physical properties of the nanostructure body. Metal underlayer 1210 is on a wafer 1220. First interface 1240 comprises two layers disposed on the metal control the electrical properties of the interface. A layer of germanium 1260 is directly on the metal 1210, and a layer 1270 of an oxide such as $SiO_x$, $ZrO_x$, $HfO_x$, or $TiO_x$ is directly on the germanium. The oxide layer acts as a buffer. Two further layers, disposed on the oxide layer, serve to control physical properties of the body of the nanostructure. A first layer 1280 of silicon is directly on the oxide layer, and a layer 1290 of metal catalyst such as nickel, iron, or palladium is in between the silicon layer and the body of the nanostructure.

Process for Forming Nanostructures

The present invention further comprises a process for forming nanostructures. The process comprises first depositing an electrode on a substrate. The substrate, as further described herein, may be a wafer of silicon, and preferably has an insulating coating, such as an oxide, for example $SiO_2$. The electrode functions as an underlayer for the nanostructure, and is made of a conducting material, preferably a metal such as molybdenum, niobium, or tungsten. The method of depositing the electrode can be any one familiar to one of ordinary skill in the art, but is preferably a method such as electron beam evaporation. The electrode layer is between 10 and 100 nm thick, and is preferably 50 nm thick.

Optionally, a resist is then deposited on the electrode layer. Such a resist is usually used for technologies that utilize lift-off processes for metal depositions. An exemplary resist is a double-layer resist consisting of 10% co-polymer and 2% PMMA resist, that is applied by consecutive spin coating and baking. The resist is then patterned/exposed by a radiation source, such as UV light or an electron beam, to transfer the design into the resist layer.

A catalyst layer, either as a sheet or as dots, is fabricated on the metal substrate or on the resist, where present. Dots of catalyst facilitate controlled growth of individual nanostructures in precise locations. Catalyst dots may be constructed by electron beam lithography. Their dimensions can be controlled using the shot modulation technique. With this technique, catalyst dot sizes can be determined with nanometer precision, and dots as small as 5-10 nm in dimension can be formed. The catalyst layer is not heated during this stage.

On the catalyst layer, layers of other materials are deposited. Such layers include at least one layer of semiconducting material and may include at least one layer of a metal different from the metal of the underlying electrode. The semiconducting material is preferably deposited using an electron beam evaporator. The semiconducting material is preferably amorphous silicon, and the layer has a thickness of 5-100 nm, preferably 10 nm.

After the various layers, including one layer of semiconducting material, are deposited a layer of catalyst material is deposited, thereby forming an uppermost layer upon which nanostructures are ultimately fabricated. The catalyst layer is deposited by standard techniques known in the art such as electron beam evaporation or sputtering.

Optionally, if a resist has been applied, it can now be removed by a lift-off process, for example by washing the structures in acetone at 60° C., followed by washing with iso-propyl alcohol. After these washings, the structures are rinsed in deionized water and blow-dried with nitrogen gas.

Nanostructures can now be grown upon the remaining areas where catalyst layers are exposed. The preferred technique for effecting such growth is plasma-enhanced chemical vapor deposition. As previously described herein, the composition of the vapor will determine the types of nanostructures that are grown. For example, carbon nanotubes can be grown at 5 mbar pressure in a (1:5) mixture of $C_2H_2$:$NH_3$ gas. Growth of nanostructures typically occurs at high temperatures, in the range 600-1,000° C., such as 700° C. The substrate (with electrode, semiconducting material, and catalyst layers thereon) is brought to such high temperatures by ramping the temperature up relatively rapidly. Exemplary rates are from 1-10° C./s, preferred rates being in the range 3-6° C./s. Such conditions have been referred to in the art as 'annealing', and preferably occur in a vacuum. A low vacuum (e.g., 0.05-0.5 mbar pressure) suffices. The source gases for the nanostructures are introduced into the chamber when the maximum temperature is reached.

The nanostructures are typically cooled to room temperature before they are permitted to be exposed to air.

Control over individual nanostructure formation is thus achieved because specifically tailored catalyst dots are created, rather than relying on non-uniform break up of a layer of catalyst by prolonged heating prior to nanostructure formation.

Application to Interconnects

Figure 13:
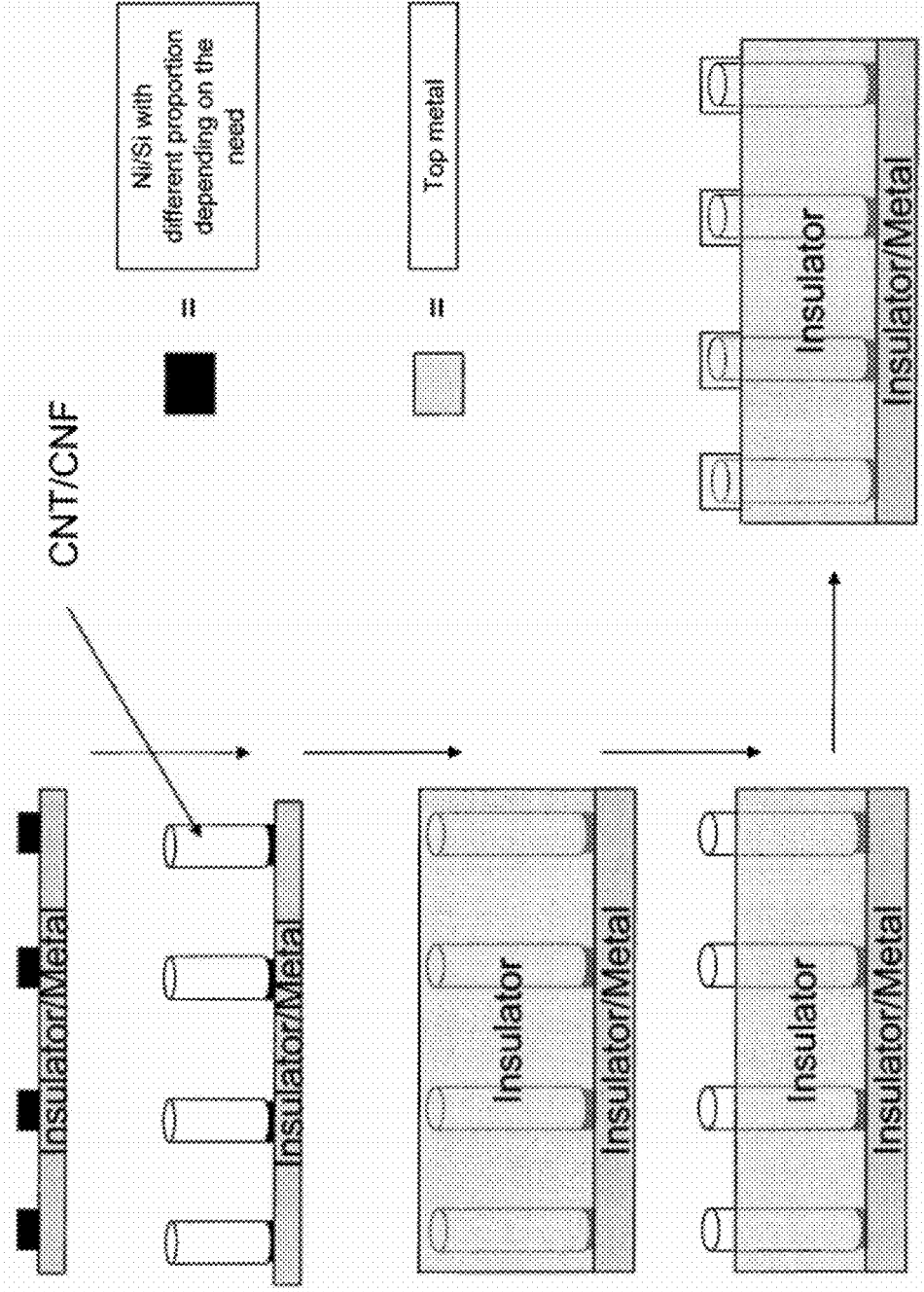
FIG. 13 shows an exemplary process for fabricating vertically-oriented device interconnects or heat dissipating media.

In FIG. 13 is shown an exemplary process for fabricating a vertically-configured device having interconnects that are fabricated above the first metal contact of a CMOS circuit. Although not explicitly delineated in FIG. 13, the nanostructures are grown from layer structures as previously described herein. A layer, or multiple layers of silicon and a catalyst such as nickel, in proportions that depend on the application, is deposited in chosen (discrete) areas on a metal or insulator. An insulating substrate is used if the nanostructures are to be used as heat dissipation only, rather than as interconnects. In such an embodiment, the nanostructures are typically embedded in the insulator. A conducting substrate such as a metal substrate is used if the grown nanostructures are to be used as interconnects only, or both as interconnects and heat dissipating media. Preferably, a first interface layer of semiconductor such as silicon or germanium is deposited on to the metal or insulator substrate. Then, a layer of catalyst such as nickel is deposited on the silicon. Carbon nanostructures are grown, according to the methods described herein, on top of the catalyst and silicon layers. As further described herein, the catalyst travels up the nanostructure as it is grown, and remains at the upper tip of the nanostructure. Further insulator, such as silicon oxide, is then deposited to completely surround the nanostructures. Then an upper layer of the insulator is etched away by wet etching, such as HF etch, or dry etching, such as $CF_4$ plasma etch to reveal the upper tips of the nanostructures. Chemical mechanical polishing (CMP) may also be used to achieve this. The etching or polishing may take away part of the catalyst that is found at the nanostructure tip. The amount of exposure of the upper tips is approximately 1-1000 nm (where 1,000 nm is an upper limit for nanostructures of 10 microns in length) and preferably 1-50 nm. Then a layer of metal is deposited, in discrete areas, upon the exposed tips of the nanostructures, thereby forming individual metal contacts. Accordingly, heat can be dissipated through, and/or electric current can flow through, the nanostructures to the upper metal contacts. This embodiment can therefore be used as interconnects to carry electrical signals (current) out of the device or circuit to an upper level of interconnects if the nanostructures are placed on top of the metal layer.

Figure 14:
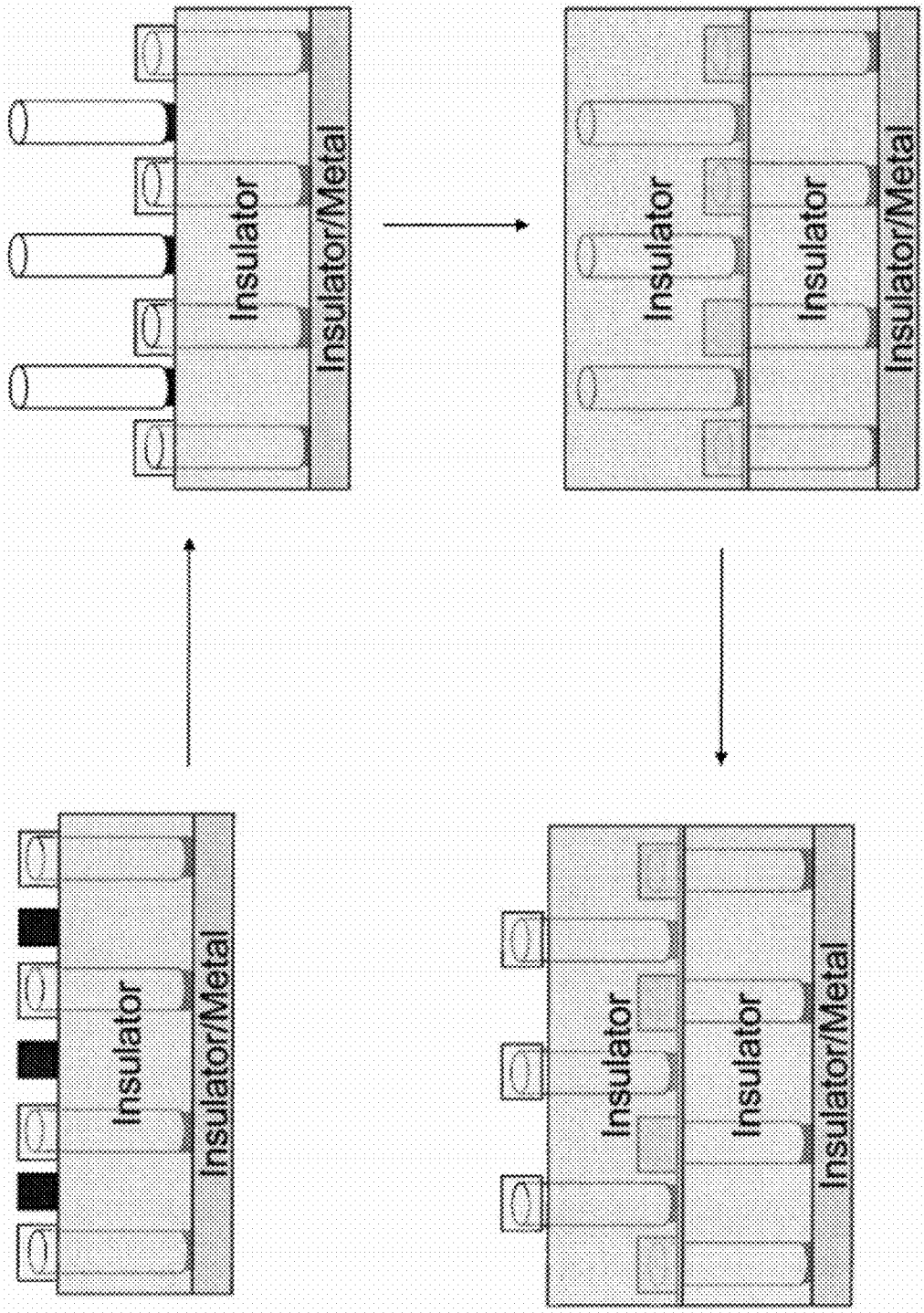
FIG. 14 shows steps in a process for fabricating multiple stacks of interconnects.

In FIG. 14, is shown steps in a process for forming a multi-layer stack. The first step starts after the steps defined in FIG. 13. Thus, layers of silicon and catalyst are deposited in discrete locations upon the insulator, and interspersed between the metal contacts. Thereafter, a second layer of carbon nanostructures is grown up on the regions of silicon and catalyst, and further insulating material is deposited to surround and cover the second layer of nanostructures. The uppermost portion of the insulating material is etched or polished away to expose the upper tips of the second layer of nanostructures, and a further layer of metal is deposited on the upper tips. A layer of catalytic materials can also be deposited on top of the metal tips directly to form a continuous connection between the two formed interconnects layers. There can be other connections as well. Deposition of the foregoing sequence of layers can be repeated to thereby form multi-layer stacks having three, four, five, six, seven, or more layers of vertically aligned nanostructures above one another. In principle, there is no limitation on the number of stacks.

Figure 15:
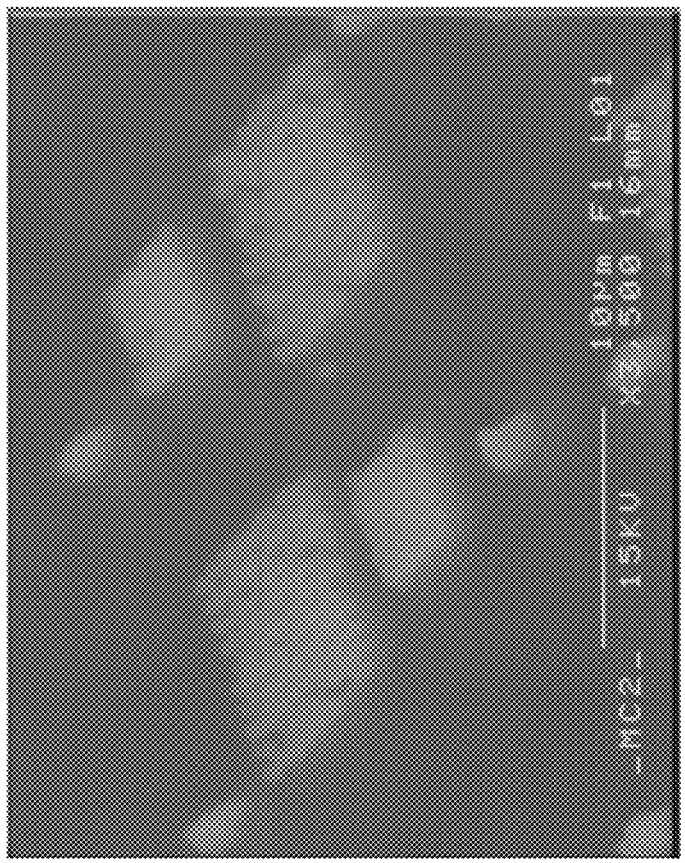
FIG. 15 shows carbon nanostructure interconnects after oxide deposition.
Figure 16:
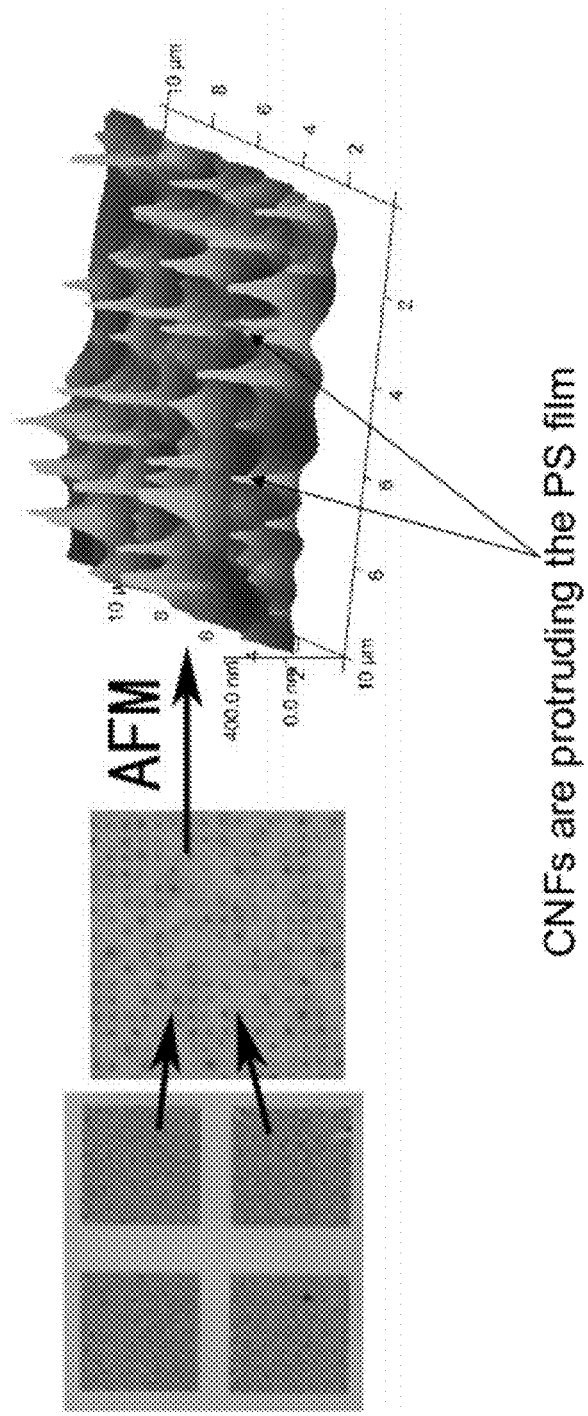
FIG. 16 shows polystyrene membranes overlying carbon nanofibers.

FIGS. 15 and 16, show how carbon nanostructure interconnects appear after depositing insulators of different kinds on top, under a SEM. In FIG. 15, oxide is shown (the dome-shaped white spots are oxide layers deposited on CNF's). In FIG. 16, a polystyrene (PS) layer is shown after spin-coating. In the left-hand picture is the membrane; black spots are nanofibers. In the right-hand figure is an AFM image showing nanofibers protruding through the polymer. The polymer is soft enough so that the nanofibers don't break and survive spin-coating at e.g., 6,000 rpm). FIGS. 15 and 16 do not show top electrode metal pads, which are subsequently deposited to form the top metal contacts.

A nanostructure fabricated according to the methods described herein can be used simultaneously to dissipate heat, and as an interconnect, e.g., within circuitry. When a nanostructure is used for dissipating heat alone, it is situated, e.g., around the side of the transistor. The axes of the nanostructures are preferably perpendicular to the edge of circuit.

Nanostructures used as heat dissipators can have the same dimensions as nanostructures used as interconnects. The density of nanostructures used as heat dissipators can be varied according to the amount of heat needed to be taken away.

EXAMPLES

Example 1

Control

Figure 17A:
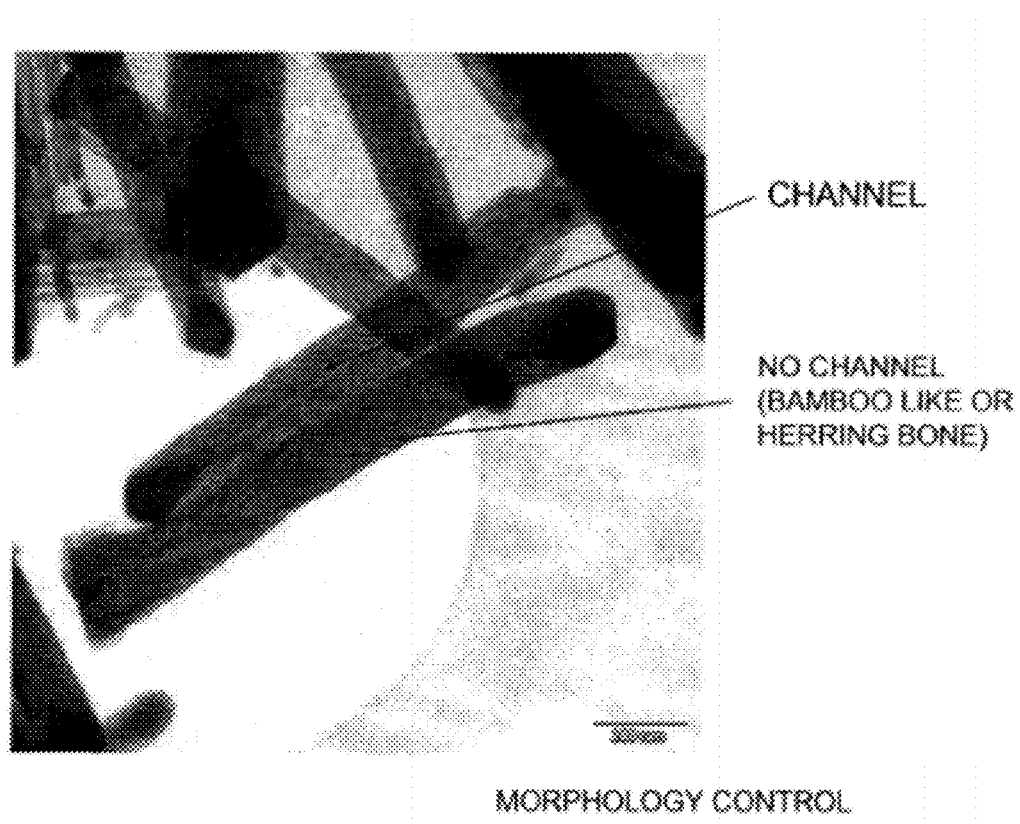
FIG. 17A is a transmission electron microscopy (TEM) micrograph of a carbon nanofiber grown on a tungsten underlayer.
Figure 17B:
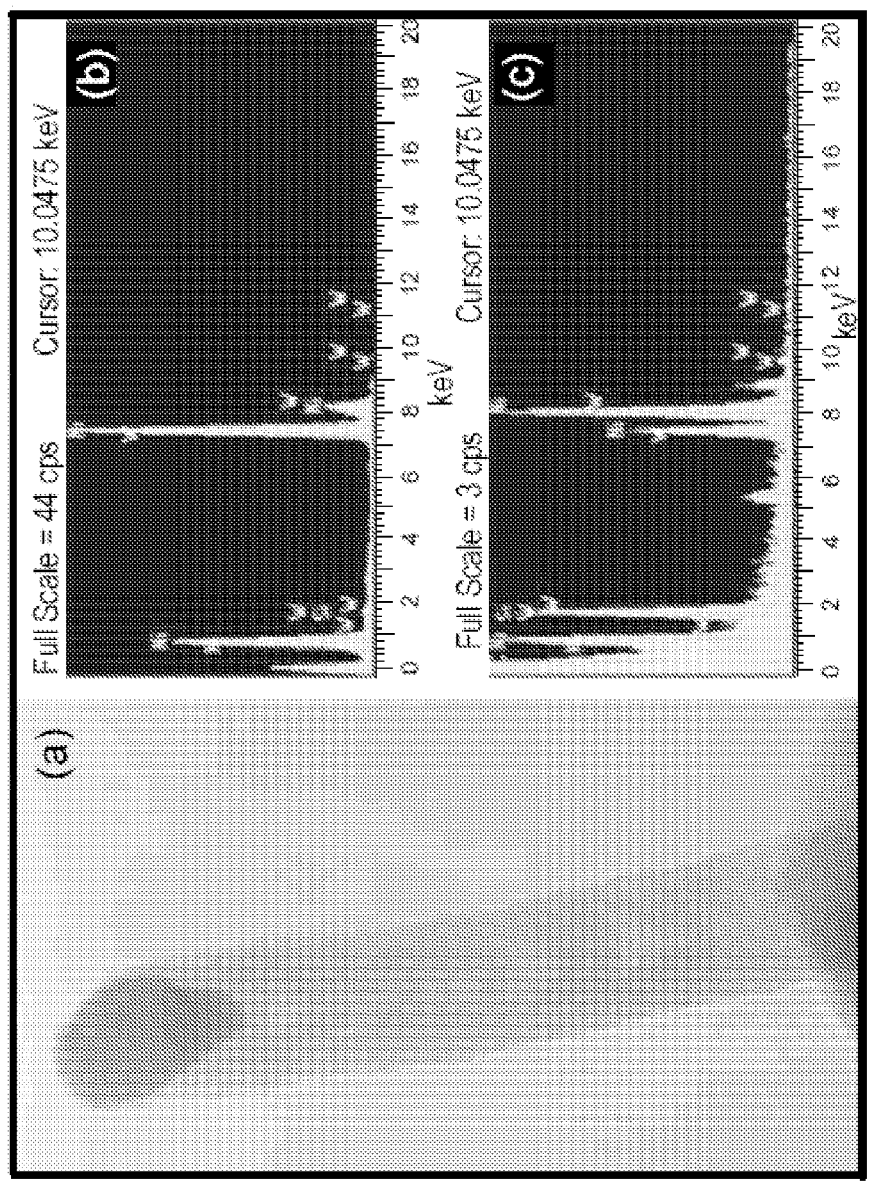
FIG. 17B shows: (a) TEM micrograph of a nanofiber grown on a W metal underlayer; (b) a corresponding EDS spectrum taken at the tip of the fibers (catalyst region); and (c) an EDS spectrum taken at the base of the fibers (underlayer region).

This example presents results that evidence control over the morphology and control over the chemical composition present at the base and the tip of grown carbon nanostructures, see FIGS. 17A and 17B. FIG. 17A is a transmission electron microscopy (TEM) micrograph showing a carbon nanofiber grown on a W metal underlayer. FIG. 17A shows how the morphology can differ based on sample preparation recipe.

FIG. 17B shows an example of how the chemical composition at the interface (base) and at the tip can be obtained. In FIG. 17B panel (a) there is a TEM image of a grown carbon nanofiber; in panel (b) an EDS spectrum shows the chemical elements at the tip of the fibers (catalyst region); and in panel (c) an EDS spectrum shows the chemical elements at the base of the fibers (underlayer region).

The CNF grew from a flat catalyst surface and no significant catalyst film break up was observed (see, e.g., Kabir, M. S.; Morjan, R. E.; Nerushev, O. A.; Lundgren, P.; Bengtsson, S.; Enokson, P.; Campbell, E. E. B., *Nanotechnology*, (4), 458, (2005), incorporated herein by reference).

Example 2

Incorporating Nanostructures into a CMOS Device

Nanostructures as described herein can be incorporated into a CMOS device as vertical interconnects. To accomplish this, a filler layer such as an insulator is deposited over a substrate and the nanostructures situated thereon, and then polished/etched back until the nanostructure is exposed at the top. The catalyst layer can be removed, e.g., by etching, once the nanostructure is grown if required.

Example 3

Lift-off Method for Growing Localized Nanostructures

The present invention also encompasses a method of making nanostructures that are localized at specific positions, rather than being formed in arrays from a continuous film on a substrate. This method obviates the requirement of other processes in the art to anneal a film of catalyst to create discrete particles of catalyst in an uncontrolled manner.

According to this method, a metal layer, e.g., on a silicon substrate, is coated with a polymer layer. Such a polymer layer may be a photo-sensitive layer. The polymer layer is patterned by one of the several methods known in the art to define regions where one or more nanostructures are desired. The regions of polymer so patterned, i.e., where the nanostructures are intended to be positioned, are then removed, thus forming cavities in the polymer layer. A layer of insulator, e.g., amorphous silicon, is deposited over the polymer, followed by another layer of catalyst. The surrounding polymer layer is then removed, leaving defined regions such as dots of silicon, with catalyst on top. Such regions are bases upon which nanostructures can then be further constructed according to the various methods further described herein.

Examples 4-6

In these examples, the results of experiments concerning the PECVD growth of nickel-catalyzed free-standing carbon nanotubes on six CMOS compatible metal underlayers (Cr, Ti, Pt, Pd, Mo, and W) are reported. These experiments focus in part on determining the optimum conditions for growing vertically aligned carbon nanotubes (VACNTs) on metal substrates using DC PECVD. Two sets of experiments were carried out to investigate the growth of VACNTs: (i) Ni was deposited directly on metal underlayers, and (ii) a thin amorphous layer of Si was deposited before depositing the Ni catalyst of the same thickness (10 nm). The introduction of an amorphous Si layer between the metal electrode and the catalyst was found to produce improved growth activity in most cases.

For many electronic applications it is desirable to use a metal which has a work function close to that of CNTs, i.e., ~5 eV, for interconnects with nanotubes. Metals with work functions ranging from 4.33 to 5.64 eV were chosen. In these examples, the result of investigations related to the electrical integrity of the metal electrode layer after plasma treatment, the quality of the metal underlayers as interconnects and the quality of the grown CNTs is reported.

Experimental Conditions For Examples 4-6

Oxidized silicon substrates 1 cm$^2$ in area and 500 μm thick with an oxide (SiO$_2$) thickness of 400 nm were used. Cross sections of the prepared substrates are shown schematically in FIGS. 18A and 18B. (The relative thicknesses of the layers are not to scale.) First, the metal electrode layer (for example, Cr, Ti, Pt, Pd, Mo, or W) was evaporated directly on the substrate by electron beam evaporation to a thickness of 50 nm. Thereafter, either a 10 nm thick Ni film was deposited partially covering the underlying metal layer (FIG. 18B), or an intermediate 10 nm thick amorphous silicon layer was deposited prior to the deposition of the Ni layer (FIG. 18A). Si and Ni were evaporated at ~3×10$^{-7}$ mbar chamber pressure to avoid the formation of any non-stoichiometric SiO$_x$ on the surface.

A DC plasma-enhanced CVD chamber was used to grow the nanotubes on the structures of FIGS. 18A and 18B. The experimental set-up and detailed growth procedure were as described in Morjan, R. E., Maltsev, V., Nerushev, O. A. and Campbell, E. E. B., *Chem. Phys. Lett.*, 383, 385-90, (2004). The substrate was placed on a 2 cm diameter molybdenum grounded cathode that contains an Ohmic heater. The temperature of the cathode was measured via a thermocouple connected to a temperature controller. Thermal gradients across the heater body did not exceed a few Kelvin; additional testing without plasma revealed that heat losses from the surface were reasonably small, and that the substrate temperature was lower than the heater body by 10-15 K. The opposite effect of heating the substrate from the plasma sheath is estimated to be negligibly small due to the low current density and total power released in the discharge (two orders of magnitude less than used in other work such as: Cassell, A. M., Ye, Q., Cruden, B. A., Li, J., Sarraazin, P. C., Ng, H. T., Han, J., and Meyyappan, M., *Nanotechnology*, 15, 9, (2004); and Teo, K. B. K., Chhowalla, M., Amaratunga, G. A. J., Milne, W. I., Pirio, G., Legagneux, P., Wyczisk, F., Pribat, D. and Hasko, D. G., *Appl. Phys. Lett.*, 80, 2011-3, (2002)). The nanotube growth was carried out in a C$_2$H$_2$:NH$_3$ (1:5) gaseous mixture at 5 mbar chamber pressure for all of the experimental runs. The substrate was heated up to the growth temperature of 700° C. under a low vacuum pressure of 0.13 mbar with 3.8° Cs$^{-1}$ ramping rate. The breakdown voltage applied at the anode for plasma ignition was 1 kV. After introducing the gas mixture in the chamber, the voltage dropped to 400V. The current density at the cathode surface was 0.5-1 mA cm$^{-2}$. The growth period was 15 minutes for all investigated substrate configurations. Note that a desire for accurate temperature control imposed a limitation on set-up design. The heater body and substrate are grounded, and the I-V characteristic of the discharge is limited by normal glow discharge conditions, i.e., the current density is almost constant and the total power released in the discharge is governed by the operational pressure. The potential drop between the cathode and anode is inversely proportional to the gas density and depends on the inter-electrode distance and gas composition.

After growth, the samples were cooled down to room temperature before air exposure. Films grown in this way were then imaged with a JEOL JSM 6301F scanning electron microscope (SEM). Atomic force microscopy (AFM) was also employed to qualitatively study the substrate morphology after the different processing steps. All the experiments were repeated to verify their reproducibility.

Example 4

Catalyst Deposited Directly on Metals (No Intermediate Si Layer)

FIG. 19 shows SEM images of the substrates after the growth sequence where a layer of nickel catalyst was deposited directly on top of the metal underlayer. In most cases no CNT growth is observed. The lack of growth observed on both Cr and Ti metal underlayers is contrary to previous work. For example, Ti and Cr have been used before as buffer layers between the catalyst and the native oxide covering of a silicon substrate to avoid the formation of nickel silicides during PECVD growth of carbon nanotubes or nanofibers (see, e.g., Han, J. H., and Kim, H. J., *Mater. Sci. Eng.* C 16, 65-8, (2001); and Merkulov, V. I., Lowndes, D. H., Wei, Y. Y., and Eres, G., *Appl. Phys. Leu.*, 76, 3555, (2000)). Also, Ti and Cr have been found to be the optimum metal underlayers for plasma-enhanced CVD growth of nanotubes using Ni and Co/Ni catalysts (see, e.g., Cassell, A. M., Ye, Q., Cruden, B. A., Li, J., Sarraazin, P. C., Ng, H. T., Han, J. and Meyyappan, M., *Nanotechnology*, 15, 9, (2004)). However, the difference between the instant results and those reported previously may be related to the difference in experimental conditions. In particular, the Ti and Cr layer was deposited directly on an Si substrate with native oxide in the case of Cassell, A. M., Ye, Q., Cruden, B. A., Li, J., Sarraazin, P. C., Ng, H. T., Han, J. and Meyyappan, M., *Nanotechnology*, 15, 9, (2004) and not on a thick layer of SiO$_2$ as here.

In the instant example, a much thicker (400 nm) oxide layer was used to provide a good insulating layer between the silicon and the metal electrode. The films where Ni has been deposited on Cr and Ti look rather smooth in the SEM pictures. AFM investigations of the substrates after heating, without the growth step, show that Ni on Cr and Ti does indeed produce a smooth surface after heating. Usage of other underlayers shows the presence of islands after heating, with average dimensions of 20-50 nm diameter and 1-5 nm height.

The SEM picture of a Ni film on a Pt underlayer after growth (FIG. 19) panel (c) shows the presence of 20-40 nm islands. This is very similar to the structure of the substrate after heating, which was also investigated with AFM. No evidence for nanotube formation can be found in this sample. In contrast, the Ni—Pd combination (FIG. 19, panel (d)) leads to the formation of large irregular shaped columns after the growth process. In this case some small nanotube-like structures can be seen with diameters below 100 nm but with very low density of surface coverage.

Figure 20:
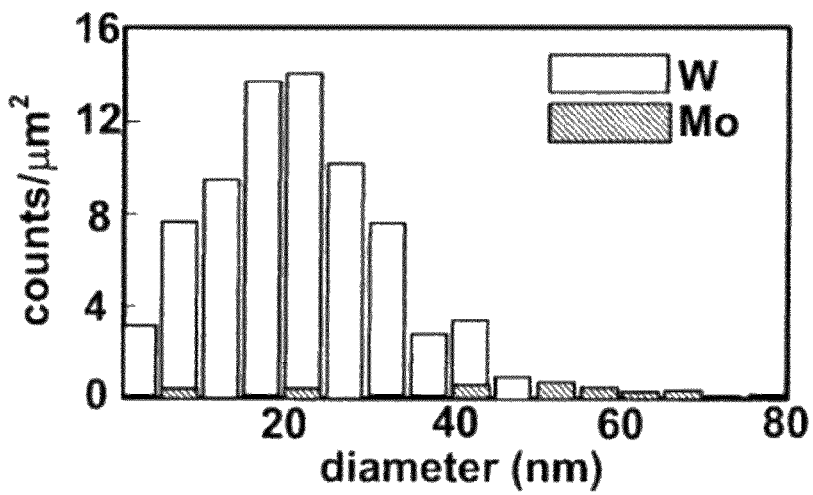
FIG. 20. Density of individual nanostructures $\mu m^{-2}$ for the case of Mo and W metal underlayers without amorphous Si layer.

AFM topographical images revealed the formation of small particles after the heating step in the Ni—Pd sample, though the impact of particle formation is not evident after the growth sequence. Only the Ni/Mo and Ni/W combinations (FIG. 19, panels (e) and (f)) lead to the formation of VACNT's under these growth conditions. The structures all showed good vertical alignment with the catalyst particle at the tip. The diameter was rather small, in the range 5-40 nm, with lengths in the range 0.5-1 μm. The density was, however, very low, with values of 5 nanotubes μm$^{-2}$ for Ni/Mo and 73 nanotubes μm$^{-2}$ for Ni/W. The diameter distribution is plotted in FIG. 20.

Example 5

Effects of an Intermediate Si Layer on the Growth of Nanotubes

Since the first application of PECVD for growth of vertical aligned nanotube arrays on Ni films (Ren, Z. F., Huang, Z. P., Xu, J. W., Wang, J. H., Bush, P., Siegal, M. P., and Provencio, P. N., *Science*, 282, 1105-7, (1998), incorporated herein by reference), researchers have discussed the role of surface morphology, catalyst thickness and etching reactions at the surface for the formation of catalyst particles. Silicide formation has been considered to be disadvantageous for nanotube growth and metal layers were used to prevent the formation of silicides (see, e.g., Han, J. H., and Kim, H. J., *Mater. Sci. Eng.* C 16, 65-8, (2001); and Merkulov, V. I., Lowndes, D. H., Wei, Y. Y. and Eres, G., *Appl. Phys. Lett.*, 76 3555, (2000), both of which references are incorporated herein by reference in their entirety). Recently, the detailed investigation of catalyst particles found in nanotubes grown on an iron catalyst was performed with energetically filtered TEM (Yao Y., Falk, L. K. L., Morjan, R. E., Nerushev, O. A. and Campbell, E. E. B., *J. Mater. Sci.*, 15, 583-94, (2004), incorporated herein by reference). It was shown that the particles contain significant amounts of Si. Similar observations were made for CNTs grown with PECVD on Ni catalysts. Thus, silicides do not poison the nanotube growth and the question about the stoichiometry of the most favourable catalytic particles is still open. The results reported here exploit the silicidation process for catalyst island formation. By introducing Si as a sandwich layer between the catalyst and the metal underlayer, a significant improvement in growing nanotubes on different metal underlayers was achieved. This can clearly be seen in the series of SEM pictures shown in FIG. 21. Very low density growth was found for Ti, (FIG. 21, panel (a)) and no growth for Cr metal (FIG. 21, panel (b)) underlayers. In the case of Cr, many cracks and voids were created on the film after 15 min in the plasma growth chamber. In the case of Ti, nanotubes are seen to grow from some catalyst sites. These appear to be randomly grown nanotubes with diameters ranging from 10 to 50 nm and lengths extending up to several microns. They show no vertical alignment and there is no evidence for tip growth. VACNTs grew successfully on the other four substrates, however. The samples with Pd (FIG. 21, panel (d)) also contained long non-aligned filamentous structures. Although TEM investigations have not been performed, the coexistence of those two types of carbon nanostructures looks very similar to results obtained by others (see, e.g., Melechko, A. V., Merkulov, V. I., Lowndes, D. H., Guillorn, M. A., and Simpson M. L., *Chem. Phys. Lett.*, 356, 527-33, (2002), incorporated herein by reference). Thus, long non-aligned filaments may be attributed to CNTs grown by the base-growth mode.

Figure 21:
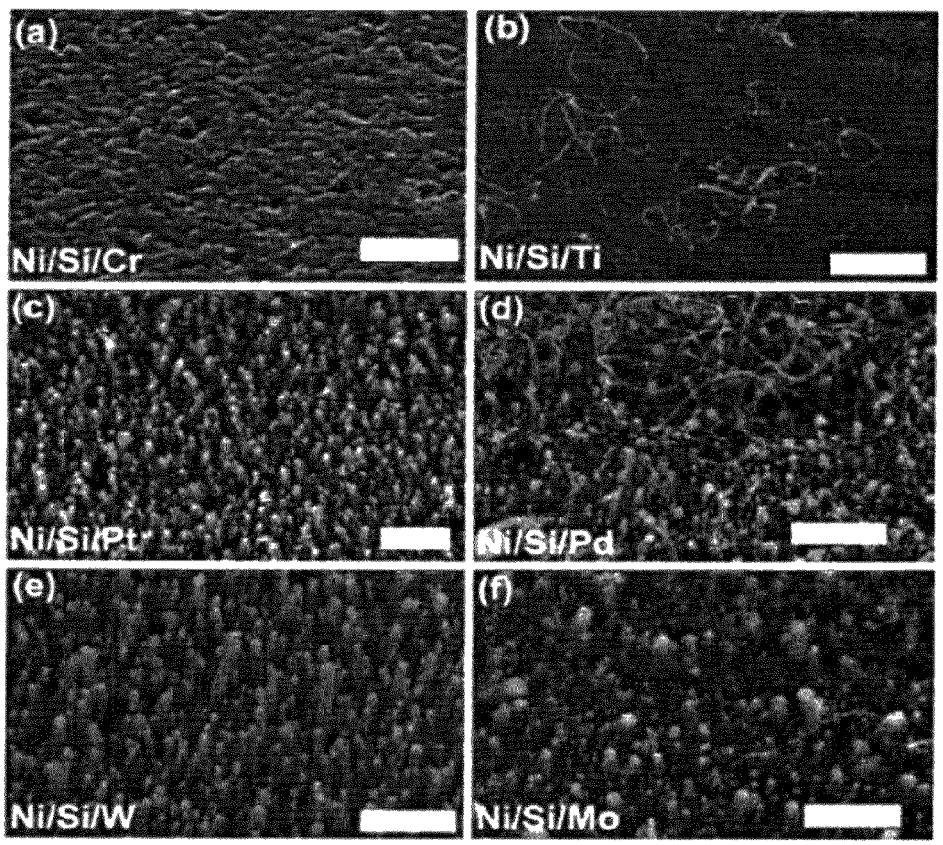
FIG. 21. SEM micrograph of the samples after 15 min. of CVD growth. The presence of Si facilitated the growth of nanotubes on some metal underlayers which was not possible in the previous set of experiments. Standard growth conditions ($V_B$=−400 V, $C_2H_2$:$NH_3$=1:5, time=15 min, T=700° C.) were used for all cases. All scale bars are 1 µm.

The highest density, 390 nanotubes $\mu m^{-2}$, and most uniform samples were grown on the Ni/Si/Pt layers on FIG. 21, panel (c)), but the average length was shorter than that of the Pd and W cases (0.2-1 µm). A longer growth time leads to longer individual structures. In order to make a quantitative comparison of different samples, a statistical analysis of the top-view SEM images was performed. The size distributions of the bright spots on the images are plotted in FIG. 22. Bright spots correspond to a top view of catalyst particles on CNT tips. Diameters were calculated on the basis of the visible area of the spots. A side view of one of the samples is shown in the insertion, FIG. 23(e). It is clearly visible that even the smallest spots correspond to vertically aligned nanotubes. The diameter varies from a few nanometres to more than 100 nm, and the length ranges from 0.2 µm up to 1 µm. Note that the nanotube diameter is slightly larger than the observed catalyst particle size, which is statistically more important for thinner objects. The molybdenum underlayer (FIG. 21, panel (f)) showed the lowest density of the four successful layers (89 nanotubes $\mu m^{-2}$) but also the longest structures (0.5-2 µm). High-resolution SEM studies (a sample is shown in FIG. 23(e)) revealed that in all four cases VACNT growth occurred via a tip growth mechanism as evidenced by the presence of the catalyst particles at the tips. Despite this fact, the grown nanotubes differ in terms of diameter, density and length.

Figure 22:
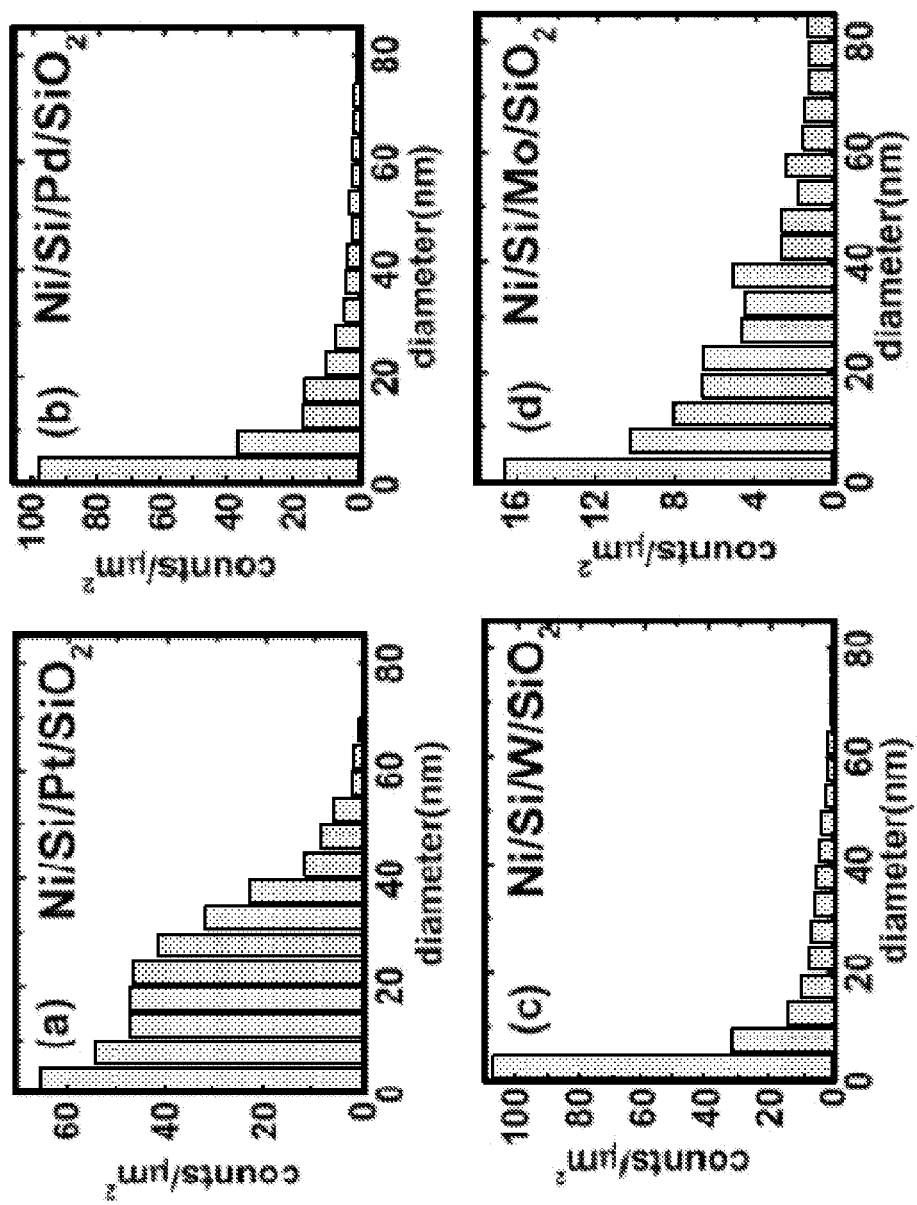
FIG. 22. Particle size distribution for four most promising metal underlayer samples: (a) platinum; (b) palladium; (c) tungsten; (d) molybdenum. The nanotube diameter distribution was plotted averaging three different images as shown in FIG. 29 for each metal underlayer.
Figure 23:
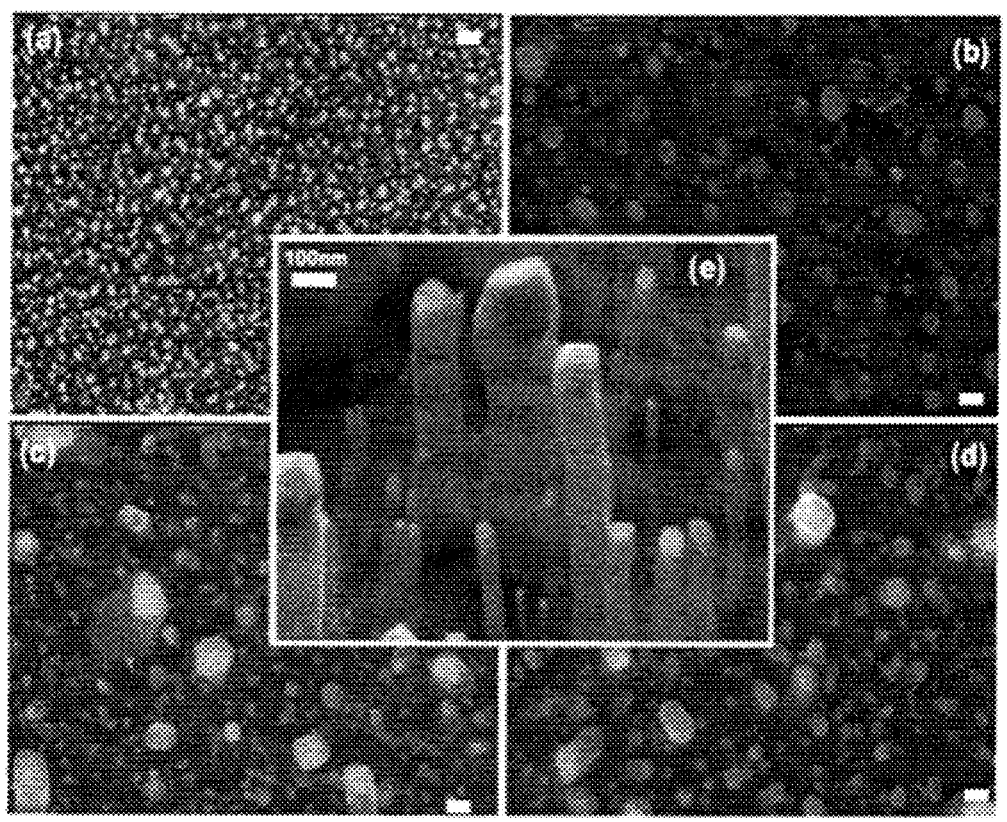
FIG. 23. Top-view SEM images of CNTs grown on (a) platinum; (b) palladium; (c) tungsten; (d) molybdenum. The middle inset (e) is a side view image showing the growth of very thin tubes (<10 nm) among thick tubes. All scale bars are 100 nm.

The particle diameter distribution, FIG. 22, is strongly shifted to smaller diameters compared to previously published results where a Ni catalyst is deposited directly on the Si substrate (see, e.g.. Chhowalla, M., Teo, K. B. K., Ducati, C., Rupesinghe, N. L., Amaratunga, G. A. J., Ferrari, A. C., Roy, D., Robertson, J. and Milne, W. I., *J. Appl. Phys.*, 90, 5308, (2001); and Meyyappan, M., Delzeit, L., Cassell, A. M. and Hash, D., *Plasma Sources Sci. Technol.*, 12, 205, (2003), both of which are incorporated herein by reference in their entirety). The average diameter of ~10 nm is much smaller than for Ni catalysed VACNT growth reported in previously published articles (see, e.g., Chhowalla, M., et al., *J. Appl. Phys.*, 90, 5308, (2001); Meyyappan, M., et al., *Plasma Sources Sci. Technol.*, 12, 205, (2003); Cassell, A. M., et al., *Nanotechnology*, 15, 9, (2004), incorporated herein by reference; and Han, J. H., and Kim, H. J., *Mater. Sci. Eng.* C 16, 65-8, (2001), incorporated herein by reference). AFM scans were performed after the heating step and showed no significant difference in surface morphology for the situations with and without the silicon intermediate layer. The formation of small catalytic particles is not only related to the heating step but is also related to the etching of these particles by species formed in the plasma (Han, J. H., et al., *Thin Solid Films*, 409, 120, (2002); and Choi, J. H., et al., *Thin Solid Films*, 435, 318, (2003), both of which references are incorporated herein by reference in their entirety) as well as metal dusting processes induced by the carbon diffused into the catalytic particles (see Emmenegger, C., Bonard, J.-M., Mauron, P., Sudan, P., Lepora, A., Grobety, B., Zuttel, A., and Schlapbach, L., *Carbon*, 41, 539-47, (2003), incorporated herein by reference).

Figure 24:
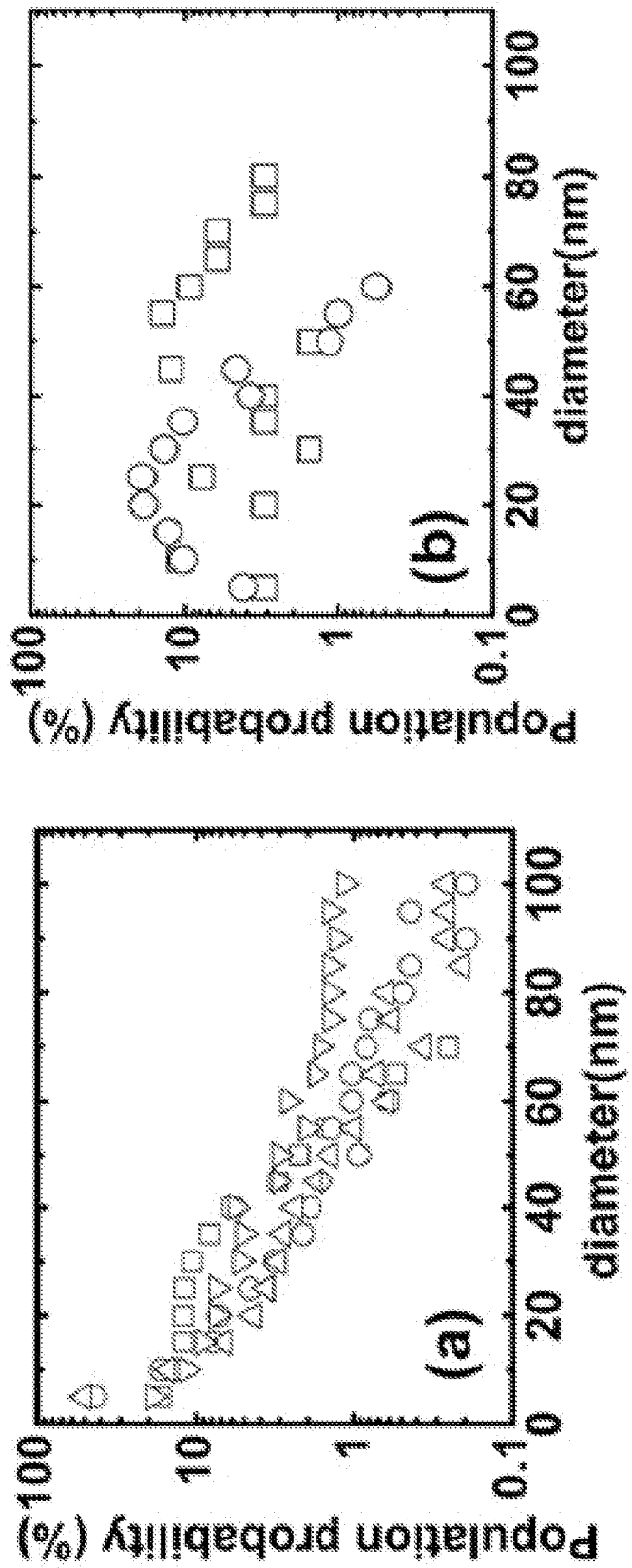
FIG. 24. Size distribution of CNTs: (a) metal underlayer with amorphous Si layer; square—platinum—390 counts $\mu m^{-2}$; circle—palladium—226 counts $\mu m^{-2}$; up-triangle—tungsten—212 counts $\mu m^{-2}$; downtriangle—molybdenum—89 counts $\mu m^{-2}$ and (b) metal underlayer without amorphous Si layer; square—molybdenum—5 counts $\mu m^{-2}$; circle—tungsten—73 counts $\mu m^{-2}$.

The size distribution of VACNTs present on the samples prepared according to this example, depends on the presence or absence of amorphous Si as an intermediate layer. In all samples with an amorphous Si intermediate layer, there is a strong inclination towards forming VACNTs with very small diameters. The distribution is plotted on a logarithmic scale in FIG. 24 (panel (a)) for the case where Si was used as an intermediate layer. More than 50% of the nanotubes have diameters $\leq 5$ nm for the case of Pd and W, with the measured population dropping rapidly for larger diameters. Samples with a Pt underlayer have a broad distribution up to 35 nm diameter accounting for about 60% of all structures before dropping rapidly. The Mo underlayer produces a higher percentage of large diameter structures. FIG. 24 (panel (b)) shows the size distribution for growth on Mo and W underlayers where no Si intermediate layer was present. The probability peaks at 22 nm for growth on W with a FWHM of 20 nm. The distribution for the Mo underlayer appears to be rather random, which is clearly seen in the SEM images (see FIG. 21(f)).

Example 6

Electrical Measurements of Carbon Nanotubes

Figure 25:
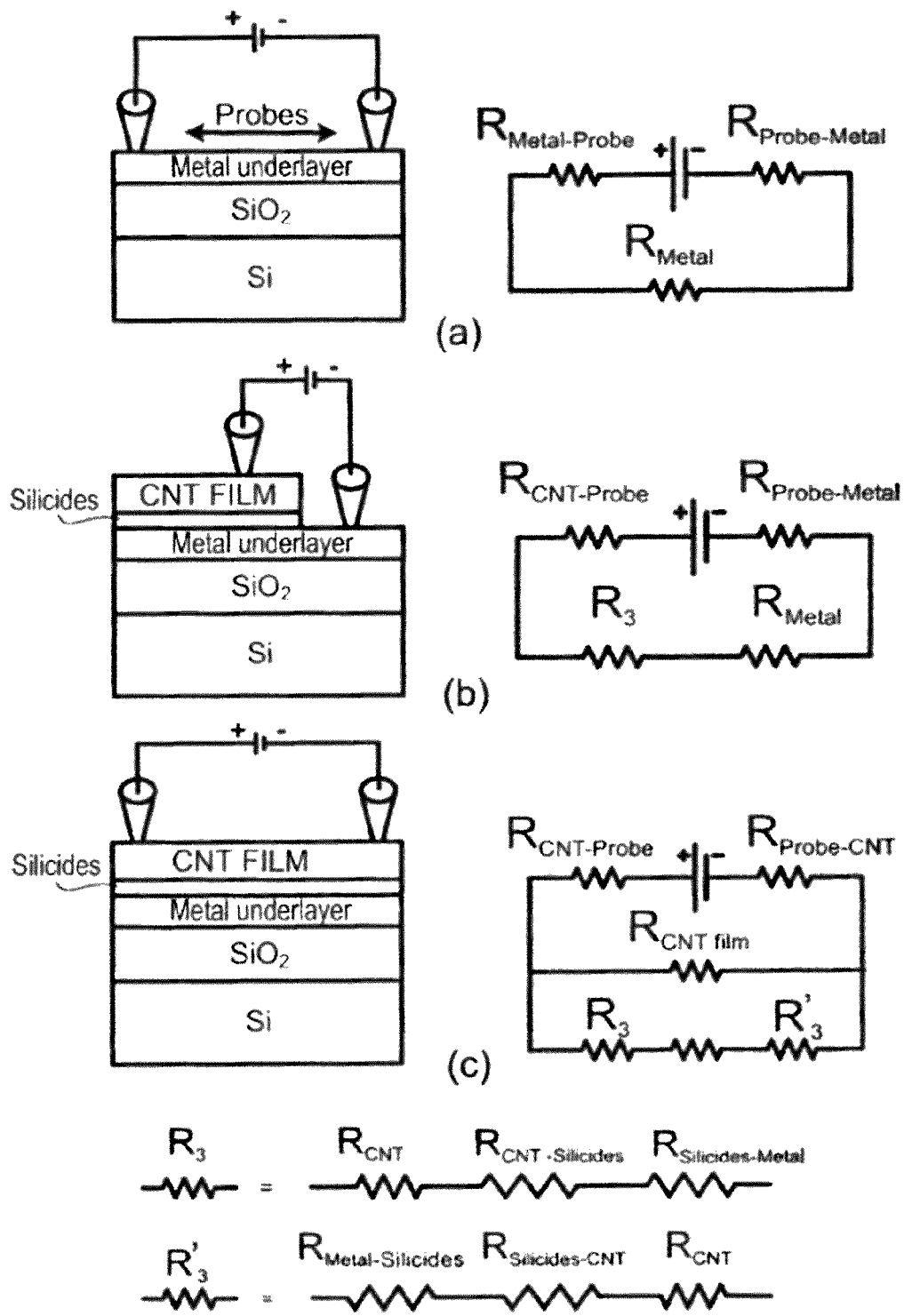
FIG. 25: Equivalent circuit diagrams for electrical measurements: (a) metal-metal configuration; (b) metal-CNT configuration; (c) CNT-CNT configuration.

The electrical integrity of the underlying metal electrode layer after plasma treatment, and the quality of the metal-nanotube contact are important issues for application of CNTs in CMOS compatible devices. Three different configurations of electrodes have been used for carrying out two-probe I-V measurements on the films: (i) both probes on the metal layer; (ii) one probe on the metal layer, and one on the nanotube surface; (iii) both probes on the nanotube surface. FIG. 25 displays the measurement configurations and equivalent DC circuit diagrams for each of these embodiments. Probes with a tip diameter around 40-50 µm connected to an HP 4156B parameter analyzer via a shielded box were used to carry out the measurements at room temperature. The probes were brought in contact with the surface (especially for the case of a CNT surface) with the help of micromanipulators while monitoring the current flow through the circuit. Thus it was ensured that the probe touched only the CNT surface and not the bottom of the film. The measurements were carried out to get qualitative results, rather than quantitative information about the film and the metal underlayers. Linear I-V profiles were measured for the CNT-metal configuration for the Mo and W underlayers (inset of FIG. 26 panel (a)) without the intermediate Si layer separating the metal from the Ni catalyst. Linearity in the I-V plots suggests ohmic contact between the nanotubes and the metallic layer. No significant conductance variation is observed in this case among the three different measurement configurations, which is expected as the density of the nanostructures is very low. The main part of FIG. 26 panel (a) shows plots for samples containing an intermediate amorphous silicon layer. The resistance is higher than for the situation without the amorphous silicon, as could be expected. However, the plots show predominantly linear behaviour, with slight nonlinearity for tungsten, suggesting varying degrees of ohmic contact between the CNT and the respective underlying metals.

Figure 26:
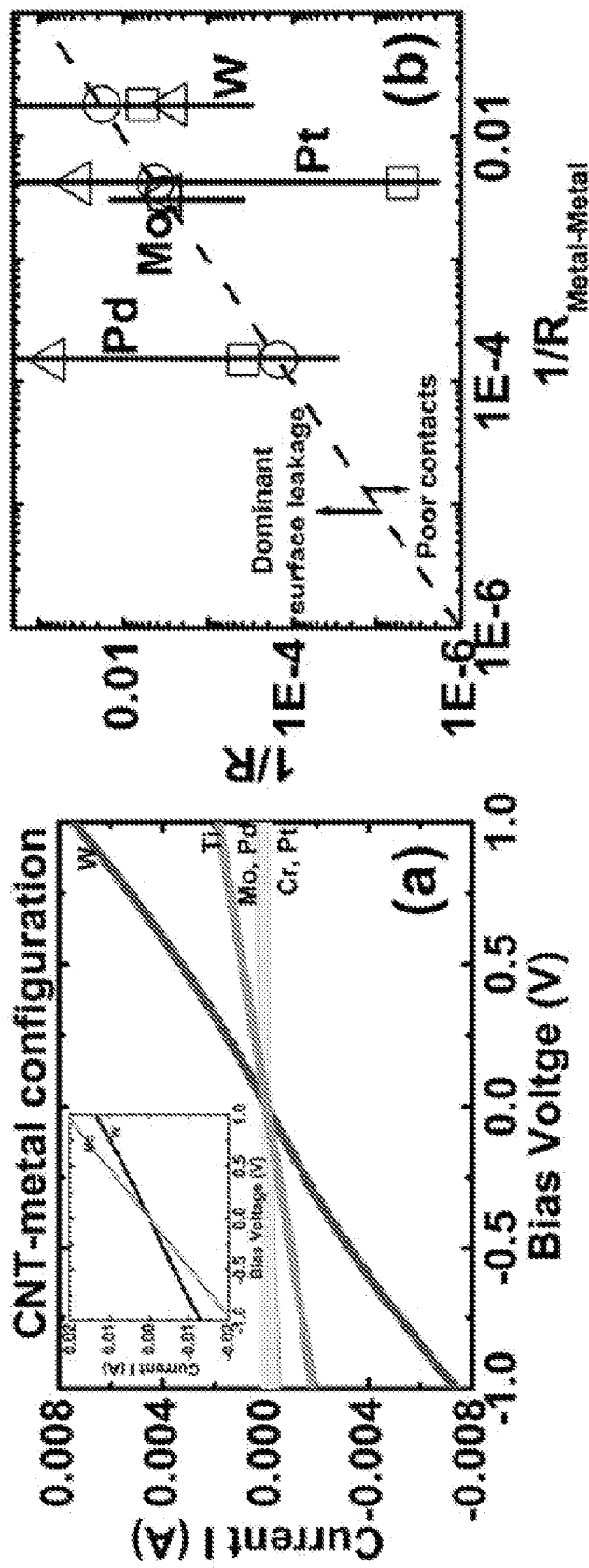
FIG. 26: (a) I-V characteristics of metal underlayers for CNT-metal configuration on samples with an amorphous Si layer; inset: the same measurements for samples without the Si layer. (b) Conductance deviations for samples with the amorphous Si layer, plotted in log-log scale. The straight dotted line represents the metal-metal conductance for different metal underlayers. Current is dominated by surface leakage if the conductance value is above the dotted line and poor contacts are considered if it is below the dotted line. Circle-metal-metal configuration; square-CNT-CNT configuration; triangle-CNT-metal configuration.

FIG. 26 panel (b) presents the deviations of conductance values from the 1/R value for the metal-metal configuration, represented by the dotted line. The dotted line is used to differentiate between surface leakage and poor contacts. The individual conductance values of different measurement configurations for given metal underlayers are evidenced by straight line indicators. The high conductance of CNT-CNT configurations for Pt and Pd is likely to be due to dominant leakage currents through the CNT film which appear in conjunction with the relatively high CNT density. It may also be related to an increased effective contact probe area due to the presence of long non-aligned CNTs (FIGS. 22(c), (d)). On the other hand, the low conductance value of the CNT-metal configuration for Pt indicates a very poor metal-CNT contact. For W the inclusion of CNTs in the measurements leads to progressively lower conductance corresponding to a contact resistance of ~150 for the probe-CNT-substrate system. The constant conductance values in all probe configurations for the case of Mo are probably due to the low density of nanostructures present per unit area. Similar results were obtained for Ni deposited directly on W and Mo as discussed above. The low surface density of the CNTs leads to an effective probe-metal-probe configuration when the electrical measurements are carried out even after the CNT growth. Growth of individual vertically aligned carbon nanostructures on prefabricated metal substrates may simplify CNT-based device fabrication processes compared to, for example, technologies which involve the use of CNT dispersions followed by assembly and integration of CNTs into functional forms by AFM manipulation, AC field trapping of CNTs or chemical functionalization. In the present case, the linearity of the I-V characteristics on the Si inclusion samples proves that the electrical integrity of the metal electrodes after plasma treatment remains stable. The values of the conductance for the metal-Si-CNT configuration scale as follows: Pt<Pd<Mo<W according to FIG. 26(b). According to the circuit diagram, the metal-metal configuration provides information concerning the resistance of the probe and the metal underlayers. The metal-CNT configuration provides information related to the resistance $R_3$ and the CNT-CNT configuration provides information related to any surface leakage induced current flowing through the circuit. For example, as indicated in the equivalent circuit diagram (FIG. 25), if $R(CNT-CNT) \leq (R_3 + R_{metal} + R_3')$, surface leakage current will dominate, whereas a poor conductance value for the metal-CNT configuration on Pt metal underlayers reveals that the resistance related to $R_3$ is the dominant factor. Moreover, because of the dominant $R_3$, Pt may not be a good choice for growing vertically aligned nanotube-based devices. Due to the low $R_3$ resistance and no R(CNT-CNT) observed, W was found to be the best metal for interconnects from this set of experiments. Mo and Pd electrodes are also good candidates for fabricating devices based on CNTs.

Example 7

Pd and Pt Metal Underlayers

For the case of Pd and Pt, AFM measurements reveal the formation of small particles after the heating step. The phase diagrams show that no predominant alloy formation is likely to happen between Ni—Pd and Ni—Pt at 700° C. (Massalski, T. B., Binary Alloy Phase Diagrams, vol. 2, Fe—Ru to Zn—Zr (1986, Metals Park, Ohio: American Society for Metals), incorporated herein by reference). In the present layer configurations, Ni—Si—Pt/Ni—Si—Pd, the first reactions are the transformation of the Pd—Si and Pt—Si interfaces to crystalline silicides ($Pd_2Si$ and $Pt_2Si$ respectively) (Aboelfotoh, M. O., Alessandrini, A. and d'Heurle, M. F., Appl. Phys. Lett., 49, 1242, (1986); Reader, A. H., van Ommen, A. H., Weijs, P. J. W., Wolters, R. A. M., and Oostra, D. J., Rep. Prog. Phys., 56, 1397-467, (1993), both of which are incorporated herein by reference in their entirety). Afterwards, at higher temperatures, the top Ni layer will start to interact with the remaining amorphous Si and most likely with the Pt/Pd silicides, thereby forming binary/ternary alloys (Kampshoff, E., Wäachli, N. and Kern, K., Surf Sci., 406, 103, (1998); Edelman, F., Cytermann, C., Brener, R., Eizenberg, M. and Well, R., J. Appl. Phys., 71, 289, (1992); and Franklin, N. R., Wang, Q., Thobler, T. W., Javey, A., Shim, M. and Dai, H., Appl. Phys. Lett., 81, 913, (2002) all of which references are incorporated herein by reference in their entirety). Thus, there is a strong chemical difference between the exclusion and inclusion of Si for both the Pd and Pt cases. Moreover, the strong reactions that occur, both at the ramping stage and at the plasma environment stage, collectively result in the formation of nanostructures with small diameters for the Si inclusion case, but no growth for the Si exclusion case. The latter case correlates to the bad growth of CNTs on an Ir underlayer observed in (Cassell, A. M., et al., Nanotechnology, 15, 9, (2004), incorporated herein by reference).

Example 8

Mo and W Metal Underlayer

Mo—Ni and W—Ni phase diagrams show the formation of Ni-rich alloys at temperatures higher than 700° C. The integrity of the Ni layer deposited on Mo/W is to some extent affected, leading to a very low density of individual nanostructures for the Si exclusion case. The lack of uniformity and low density of nanostructures from these samples agrees with the observations made by Franklin et al. (Franklin, N. R., Wang, Q., Thobler, T. W., Javey, A., Shim, M. and Dai, H., Appl. Phys. Lett., 81, 913, (2002), incorporated herein by reference) where the presence of W/Mo electrodes under the catalyst layer inhibited the growth of nanotubes, but disagrees with previously published results where Mo/W compounds are used as catalysts for nanotube growth (Lee, C. J., Lyu, S. C., Kim, H. W., Park, J. W., Jung, H. M., and Park, J., Chem. Phys. Lett., 361, 469, (2002); and Moisala, A., Nasibulin, A. G. and Kauppinen, E. I., J. Phys.: Condens. Matter, 15, S3011, (2003), both of which are incorporated herein by reference in their entirety). Mo and W start to consume Si at ~800° C. and ~950° C. respectively to form silicides (Aboelfotoh, M. O., Alessandrini, A. and d'Heurle, M. F., Appl. Phys. Lett., 49, 1242, (1986); and Murarka, S. P., J. Vac. Sci. Technol., 17, 775, (1980), both of which references are incorporated herein by reference in their entirety). At present, the investigated processes are below these temperatures. Thus by introducing an Si interlayer a stable Si—Mo and Si—W system was achieved to facilitate a pure Si—Ni surface which apparently enhanced the density of individual nanostructures in the film. Moreover, these metals form a barrier for Si and Ni diffusion in both directions and limit the amount of Si that can react with Ni in comparison to the case where the Ni film is deposited directly on bulk silicon with a native oxide layer.

The effect of the Si interlayer may be compared with experiments on bulk Si having a native oxide layer (~1 nm), which were also carried out in the same set-up and under similar conditions. By comparing the catalyst particle/nanotube density (117/75 counts $\mu m^{-2}$) for growth on an Ni film (10 nm) deposited on silicon substrates with an Si amorphous interlayer (10 nm) between the metal and the catalyst, it was observed that the density of nanostructures is increased by a factor of ~5, 3, 2, 1 for the Pt, Pd, W and Mo cases respectively. Thus, by tuning the thickness of the amorphous Si interlayer, one can control the density and particle distribution by changing the stoichiometry of the catalytic particles.

In summary, nanotubes have been successfully grown on four out of six chosen CMOS compatible metal underlayers by using silicon as an intermediate layer. An important observation from this set of experiments is that the size of the nickel islands formed after the heating sequence is not the only deciding factor for nanotube growth. Consequently, these experiments show that Si plays a vital role in the growth of carbon nanotubes. Moreover, the Si layer thickness is an additional tool for tuning the growth of carbon nanotubes with good quality and quantity as required for a particular application, along with the growth temperature, chamber pressure and different gas ratios. In particular, the insertion of a Si layer produces individual vertically aligned nanotubes with small diameter (≦10 nm) which can be advantageous for many applications.

The studies reported herein showed a poor growth of nanostructures on Ti and Cr metal underlayers, which is in apparent contradiction with the results obtained by other laboratories. The main reason for such a difference is attributed to Ti silicidation on the thick silicon oxide layer with a high release of oxygen that influences the Ni/Ti interface.

As metal interconnects, a W underlayer was found to be the best underlayer metal for the production conditions described herein. Nevertheless, structural and electrical integrity seems to remain intact for all the metal underlayers even after the harsh chemical and plasma treatment.

Example 9

Effects of Silicidation on the Growth of Individual Free Standing Carbon Nanofibers This example addresses vertically free standing carbon nanotubes/nanofibers and their integration into functional nanodevices. In this example, growth of individual free-standing carbon nanofibers on pre fabricated catalyst dots on tungsten and molybdenum metal underlayers are shown, exploiting an amorphous silicon layer as part of the catalyst layer. In summary, more than 95% of the catalyst dots facilitated nucleation for growth on the W metal underlayer. Silicidation occurring during the growth sequence is suggested to play a vital role for growth kinetics. EDX chemical analysis revealed that the tip of the nanofibers consists of an alloy of Ni and an underlayer metal and the base shows the signature of Ni, Si and underlayer metal.

The growth conditions and growth kinetics on different metal underlayers differ substantially from the growth mechanism that is postulated for Si substrates. This example provides an explanation for the growth results on W and Mo in terms of silicide formation. Individual nanofibers were characterized in a transmission electron microscope (TEM). The elemental compositions were determined by fine probe energy dispersive X-ray spectroscopy (EDX).

Oxidized silicon substrates 1 cm² in area with an oxide thickness of 400 nm were used. First the metal (W or Mo) underlayer was evaporated directly onto the substrate by electron beam evaporation to a thickness of 50 nm. Stripes and dots (100 nm and 50 nm edge to edge distance) were fabricated by e-beam lithography. Experimental details are further described in Kabir, et al., *Nanotechnology*, 17, 790-794, (2006), incorporated herein by reference. An intermediate 10 nm thick amorphous silicon layer covered by 10 nm of Ni was used to catalyze growth. A DC PECVD chamber was used to grow the nanostructures. The experimental set-up and detailed growth procedure have been described in Morjan, R. E., et al., *Chemical Physics Letters*, 383, 385, (2004), incorporated herein by reference. The nanotube growth was carried out in a gaseous $C_2H_2:NH_3$ (1:5) mixture at 5 mbar chamber pressure at 700° C. for 20 minutes for all of the experimental runs discussed here. The substrates were first heated up to 700° C. under low vacuum conditions (0.13 mbar) with a 3.8° C./second ramping rate (heating stage). After growth, the samples were cooled down to room temperature before air exposure. As-grown nanotubes from pre-fabricated dots were then imaged with a JEOL JSM 6301F scanning electron microscope (SEM) or a JEOL ULTRA 55 SEM. Samples were then gently rubbed onto a TEM grid to transfer the grown fibers from the substrate to the grid. Individual fibers were then investigated by TEM and EDX.

Figure 27:
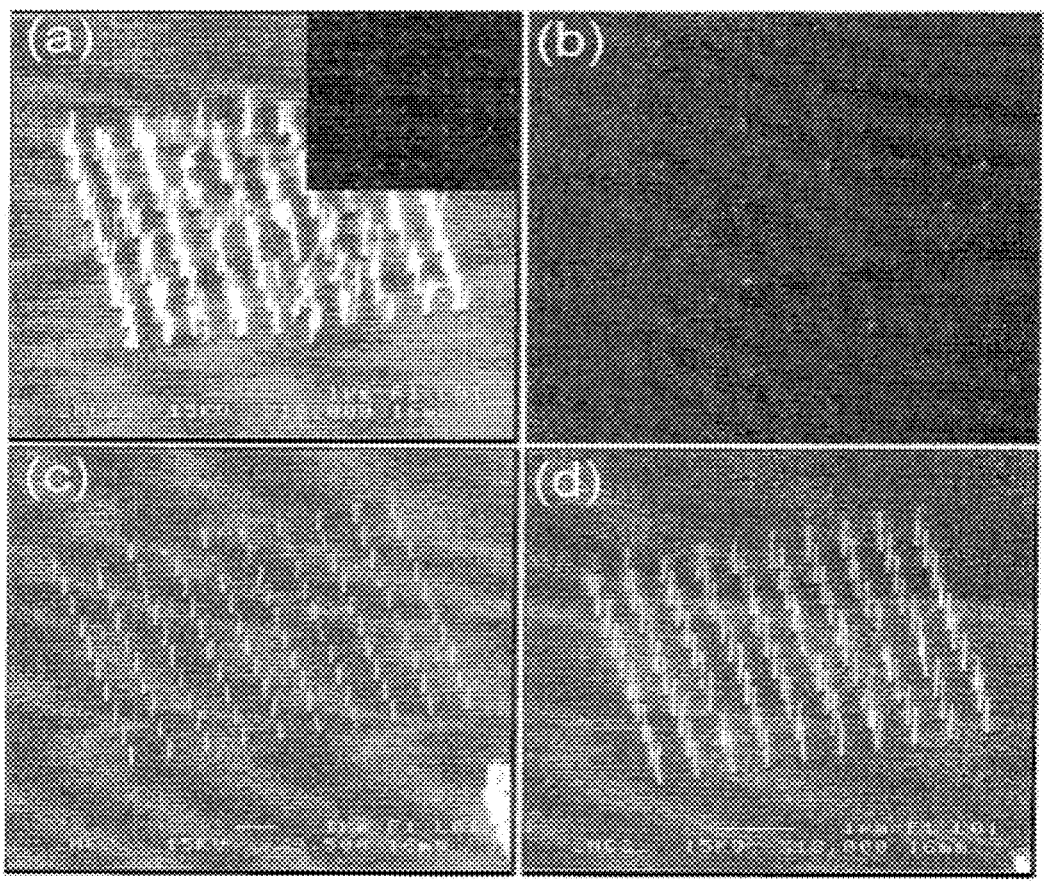
FIG. 27: SEM micrographs of grown fibers on a W metal underlayer. (a) Represents the fibers grown from 100 nm dots with 500 nm pitch. All catalyst dots nucleated for growth of more than one fiber. Inset shows no break up of the catalyst after heating. (b) After growth when Ni catalyst was deposited on W directly. No growth is observed. (c) Fibers grown from prefabricated 50 nm dots with 1 µm pitch. Most of the dots nucleated to grow individual fibers. (d) Individual fibers grown from 50 nm prefabricated catalyst dots with 500 nm pitch.
Figure 28:
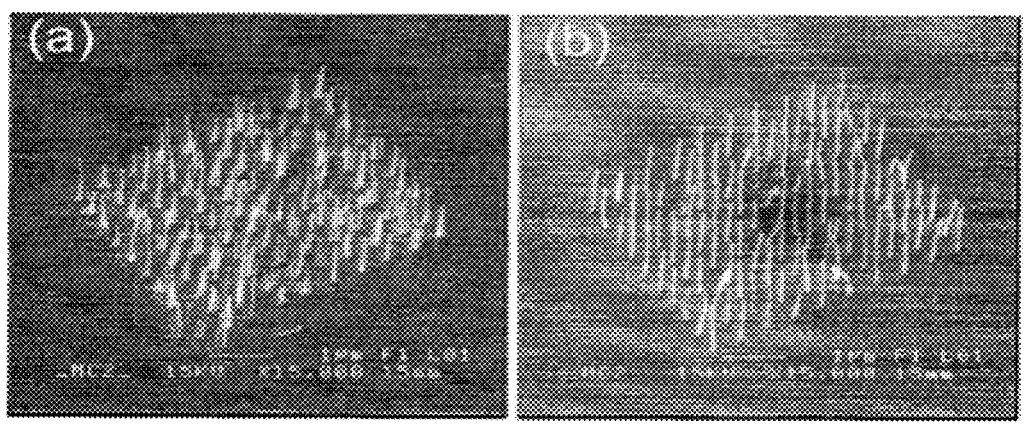
FIG. 28: SEM micrograph of grown fibers on Mo metal underlayer. (a) Represents the fibers grown from a film of Ni/a-Si catalyst layer. (b) Grown fibers from a 2 µm catalyst stripe. Inset picture is taken from the middle of the stripe. (c) Fibers grown from prefabricated 100 nm dots. Most of the dots nucleated to grow more than one fiber. (d) Individual fibers were grown from 50 nm prefabricated catalyst dots.

Morphology changes of the patterned substrate/catalyst layer may occur during the heating step of the growth sequence, but no predominant catalyst breakup or cluster formation was observed, which is in good agreement with experiments in which catalyst films were used. FIG. 27 shows SEM images of the substrates after the growth sequence for the case of W. FIG. 27 panels (a), (c) and (d) show the micrograph of grown carbon nanofibers (CNF) from patterned 100 nm side length dots with 500 nm pitch, 50 nm length with 1 µm pitch, and 50 nm length with 500 nm pitch, respectively. As can be seen, more than 95% of the catalyst dots nucleated for growth. The catalyst from 100 nm dots splits, and multiple CNFs up to 4 fibers per dots were observed. CNFs grown from 50 nm dots are individual and vertically well aligned. There are some instances of multiple CNFs growing from a single dot (~2%). All cases where nanofibers grew showed a tip growth mechanism as evidenced by the presence of the catalyst particles at the tips. No predominant pitch induced effects are evident for 1 µm and 500 nm pitch respectively. Since an amorphous Si layer is included as a part of the catalyst layer on top of metal underlayers, the interactions between the amorphous Si and the two metal layers (silicidation) are important processes for defining the final phase of the catalyst and its catalytic activity. An example is shown in FIG. 28 panel (b) where only Ni was deposited on W, resulting in no catalytic activity and no growth.

It is reported that at room temperature the stress present in the deposited film is due to the mismatch in thermal expansion coefficients but at elevated temperature silicidation occurs resulting in net volume shrinkage. The volume decrease can be very large and this could lead to large tensile stresses in the silicided films. After heating the tensile stress for Ni and Mo silicides is found to be ~$0.25 \times 10^{-9}$ dyne/cm² and ~$0.10 \times 10^{-9}$ dyne/cm² respectively, which are of the same order. This perhaps explains why no catalysts broke up during the heating process; the break up into smaller patches is controlled by the growth kinetics rather than induced by the film stress (see inset of FIG. 27(a)).

Silicides can be formed at elevated temperatures either by a solid state reaction between a metal and silicon deposited on each other, or by codepositing metal and Si. Transition metal silicides have been extensively studied and explored due to their usefulness as high temperature materials. The investigated metal underlayers and the Ni catalyst layer should undergo silicidation during nanofiber growth in this case. For commonly used silicides, when a thin film of metal M reacts with a thick Si layer the thermodynamically stable phase is $MSi_2$. Conversely, when a thin Si film reacts with a thick metal layer, a thermodynamically stable metal-rich phase is formed. When a thin metal film reacts with a thin Si layer where there is neither excess metal nor excess Si present, the equilibrium phase will be determined by the ratio of metal atoms to Si atoms. For a ternary system as described herein, the situation is complicated since two or more phases are likely to occur simultaneously. In this case the interface reactions and diffusivities will define the stable phase.

For W—Si and Mo—Si systems, Si is the predominant diffusing species for the formation of corresponding silicides. On the contrary, Ni is the metal diffusion species in Si at elevated temperatures. All moving species are thus presumed to be moving down towards the substrate in this system. The ramp rate at which the temperature of the substrate reaches the growth temperature might also play a role in defining the chemical phase of the silicides. An extensive study on the reaction of Si with W performed by Nishikawa et al. (Nishikawa, O.; Tsunashima, Y.; Nomura, E.; Horie, S.; Wada, M.; Shibata, M.; Yoshimura, T.; Uemori, R., *Journal of Vacuum Science & Technology B* (Microelectronics Processing and Phenomena) (1983), 1, (I), 6) and Tsong et al. (Tsong, T. T.; Wang, S. C.; Liu, F. H.; Cheng, H.; Ahmad, M., *Journal of Vacuum Science & Technology B* (Microelectronics Processing and Phenomena) (1983), 1, (4), 915, both of which are incorporated herein by reference in their entirety) by field ion microscopy, revealed that Si deposition on W is likely to result in the tetragonal polycrystalline $WSi_2$ structure at ~700° C., which is also the temperature used herein. However, Tsong et al. reported that a change of silicide phase occurs if heating is extended beyond ~30 s.

When silicon is the dominant diffusing species, it can continue to diffuse in at a location well beneath the Mo/W interface thus forming silicides at a distance from the interface. Thus at least two binary layers: Ni—Mo/W, and Si—Mo/W can be expected to form. It can be suggested that a Si—Mo/W layer provides a platform for the Ni rich W layer (Ni—W layer) to catalyze and facilitate CNF growth; no growth is observed for the case when Ni was deposited directly on W as shown in FIG. 27(*b*). To support this hypothesis, a TEM investigation on the nanofibers grown on W metal underlayers was carried out as depicted in the FIG. 17B. FIG. 17B panel (a) represents the typical structure of a CNF from a patterned catalyst of ~30 nm diameter. The catalyst Ni particle at the CNF tip usually had a conical shape. EDX point analysis was carried out both at the tip of the CNF and at its base as shown in the FIG. 17B panels (b) and (c) respectively. The EDX spectra reveal no characteristic peak representing Si at the tip of the fibers (FIG. 17B panel (b)). W was found to coexist with Ni catalyst at the tip. However a small amount of Si is detected at the base of the fibers (FIG. 17B panel (c)). Presence of silicon in the catalyst particles (both at the tip and at the base) regardless of catalyst particle type (Ni/Fe catalysts on an Si substrate) is reported by cross sectional TEM observations. It can be extrapolated from these observations that the particle at the tip of the CNF was part of the metallurgical layer from which the CNF grew and since in the sample the content of only Ni and W but no Si at the tip was observed, it can be surmised that the metallurgical layer for growth in this case was a Ni—W system. It is therefore proposed that a W-silicide layer has provided means for the Ni—W layer to nucleate for growth. In the model for tip growth suggested by Melechko et al., (Melechko, A. V.; Merkulov, V. I.; Lowndes, D. H.; Guillorn, M. A.; Simpson, M. L., *Chem. Phys. Lett.*, 2002, 356, (5-6), 527, incorporated herein by reference) the interface between catalytic particle and substrate is important. By having a silicide rather than a pure metal interfacing the catalytic Ni—W particle, these crucial interface conditions would be altered significantly—apparently in favour of CNF growth. The Mo metal underlayer behaves the same as the W metal underlayer in many ways; producing CNF with almost the same statistics in terms of diameter, length, growth yield etc. Mo also behaves similar to W with regards to silicidation. It is therefore proposed that the explanation regarding the W metal underlayer is valid for Mo as well.

In conclusion, results on CNF PECVD growth have been presented in terms of metal-Si-metal reactions, silicide phases and kinetics. Silicidation is likely to play a vital role in defining the growth mechanism of nanostructures, where a silicide can enable the upper metallurgical layer to nucleate. EDX analysis supports this conclusion for the case of a Ni on Si on W system. Breaking up of the catalyst particles is found to be more related to growth kinetics rather than the thermal expansion coefficient of different metals. The silicidation processes for thin film metal-Si-metal systems are complex and involve more than one mechanism governing their kinetics.

Example 10

Controlling Nanostructures

This example describes control of CNT/CNF diameter and length distribution in PECVD growth from a single geometrical design. Results were obtained by controlling the diameter of catalyst dots by the shot modulation technique of electron beam lithography. The method comprises fabrication of dots of different sizes from one single geometrical design and the consequent effects on growth of vertically aligned carbon nanofibers on different metal underlayers. Statistical analysis was undertaken to evaluate the uniformity of the grown CNF structures by the PECVD system, and to examine the achievable uniformity in terms of diameter and length distributions as a function of different metal underlayers. It is possible to control the variation of diameter of grown nanofibers to a precision of 2±1 nm, and the results are statistically predictable. The developed technology is suitable for fabricating carbon based nano-electro mechanical structures (NEMS).

Figure 29:
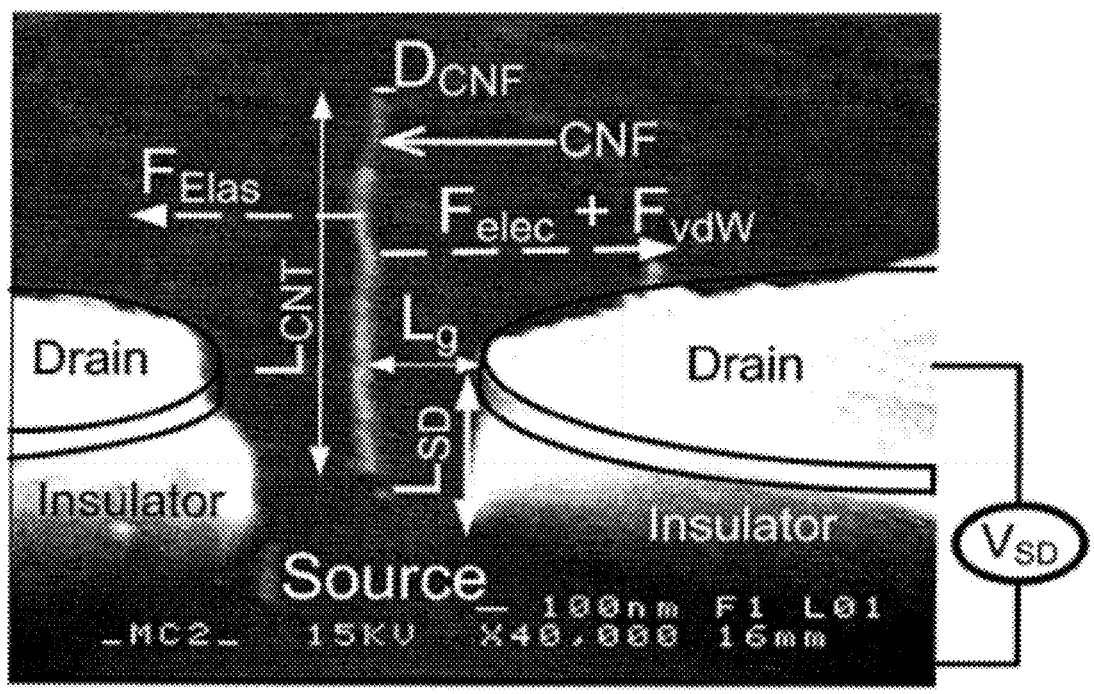
FIG. 29: shows an exemplary nano-relay device using a nanostructure.

The electrical characteristics (I-V) and switching dynamics of the fabricated devices depend on a number of design and fabrication related parameters. Since the CNF/CNT is the active part of the device, both the diameter and the length of the CNTs/CNFs are of great importance. Device geometry is depicted in FIG. 29, which shows an electron microscopy image of a fabricated vertical "nanorelay" structure where the parameters that influences the device characteristics are shown. A single CNF is grown between two drain electrodes. The drains are separated from the source electrode by 400 nm thick $SiO_2$ insulator. Charge can be induced into the CNF by applying a voltage to the drain electrode to actuate the CNF. For such two terminal devices, the pull-in voltage is defined by the balance of the elastic, electrostatic and the van der Waals forces (Dequesnes, M.; Rotkin, S. V.; Alum, N. R., *Nanotechnology*, 13(1), 120, (2002), incorporated herein by reference). Since all these three forces are strongly correlated with the diameter and the length of the grown structures and these are the parameters that can be controlled experimentally to a certain extent. In this example, is described (a) development of a technology to vary the diameter of the CNFs from one single geometrical design with a precision of 2±1 nm; (b) growing the CNFs on different metal underlayers to realize the optimum the CMOS platform for CNFs growth; (c) statistical spread and control over length distribution of the grown structures; and (d) pitch limitations for mass production of high density parallel structures.

Sample Preparation and Characterization

To fabricate the catalysts dots, the shot modulation technique of electron beam lithography is used to define the catalyst dimensions. The shot modulation technique is a robust technique that has been used for fabricating different kinds of nano-structures. For example, by varying the dose applied during the exposure of the two electrode regions, the width of the gap between them can be controlled with nanometer precision (see, e.g., Liu, K.; Avouris, P.; Bucchignano, J.; Martel, R.; Sun, S.; Michl, J., *Applied Physics Letters*, 80(5), 865, (2002), incorporated herein by reference). The experiment described in this example uses the state of the art electron beam lithography system, the JBX-9300FS model. The system is capable of keeping the spot size down to ~6 nm at 500 pA probe current at 100 kV operating voltage. The system has a height detection module which is used to ensure the accuracy of the focus point of the e-beam spot on the entire work piece and compensate for the height variation of the resists that usually occurs during spin coating of the resists.

Oxidized silicon substrates 1 cm$^2$ area with an oxide thickness of 400 nm, were used. First the metal (=Mo, Nb, or W) electrode layer was evaporated directly on the substrate by electron beam evaporation to a thickness of 50 nm. Sheet resistance measurements were carried out on the deposited films. Double layer resists system, consisting of 10% copolymer and 2% PMMA resists, were then spin coated and baked respectively. The shot modulation experiments were then carried out on initial dots of 10×10 arrays with 50 nm square geometry. The same block was then distributed in an array of 8×8 matrix and the dose of electron beam was varied linearly with an interval of 100 μC/cm$^2$ starting from 500 μC/cm$^2$. No proximity corrections were made for dose compensation. Inside the matrix, the columns represent the same dose while the rows represent different doses. The samples were exposed and then developed in a standard developer, IPA:H$_2$O (93:7) for 3 min.

The samples were then mounted in an e-beam evaporator, and an intermediate 10 nm thick amorphous silicon layer was deposited prior to deposition of the Ni catalyst layer. After the e-beam evaporation, lift off processes were carried out in Acetone at 60° C., then IPA, and completing the sequence by rinsing in DI water and N$_2$ blow drying.

A DC plasma-enhanced CVD chamber was used to grow the nanostructures. The experimental set-up and detailed growth procedure have been described previously (see, e.g., Morjan, R. E.; Maltsev, V.; Nerushev, O.; Yao, Y.; Falk, L. K. L.; Campbell, E. E. B., *Chemical Physics Letters,* 383(3-4), 385, (2004), incorporated herein by reference). The nanotube growth was carried out in a C$_2$H$_2$:NH$_3$ gaseous (1:5) mixture at 5 mbar chamber pressure at 700° C. for 20 minutes for all of the experimental runs. The substrates were first heated up to 700° C. under low vacuum conditions (0.13 mbar) with a 3.8° C. s$^{-1}$ ramping rate (annealing stage). Once the final temperature was reached, the C$_2$H$_2$:NH$_3$ gas mixture was introduced into the chamber and 1 kV was applied to the anode to induce plasma ignition. After growth, the samples were cooled down to room temperature before air exposure. Nanotubes grown in this way from pre-fabricated dots were then imaged with a JEOL JSM 6301F scanning electron microscope (SEM) and JEOL ULTRA 55 SEM. All the experiments were performed repeatedly to verify their reproducibility.

Figure 30:
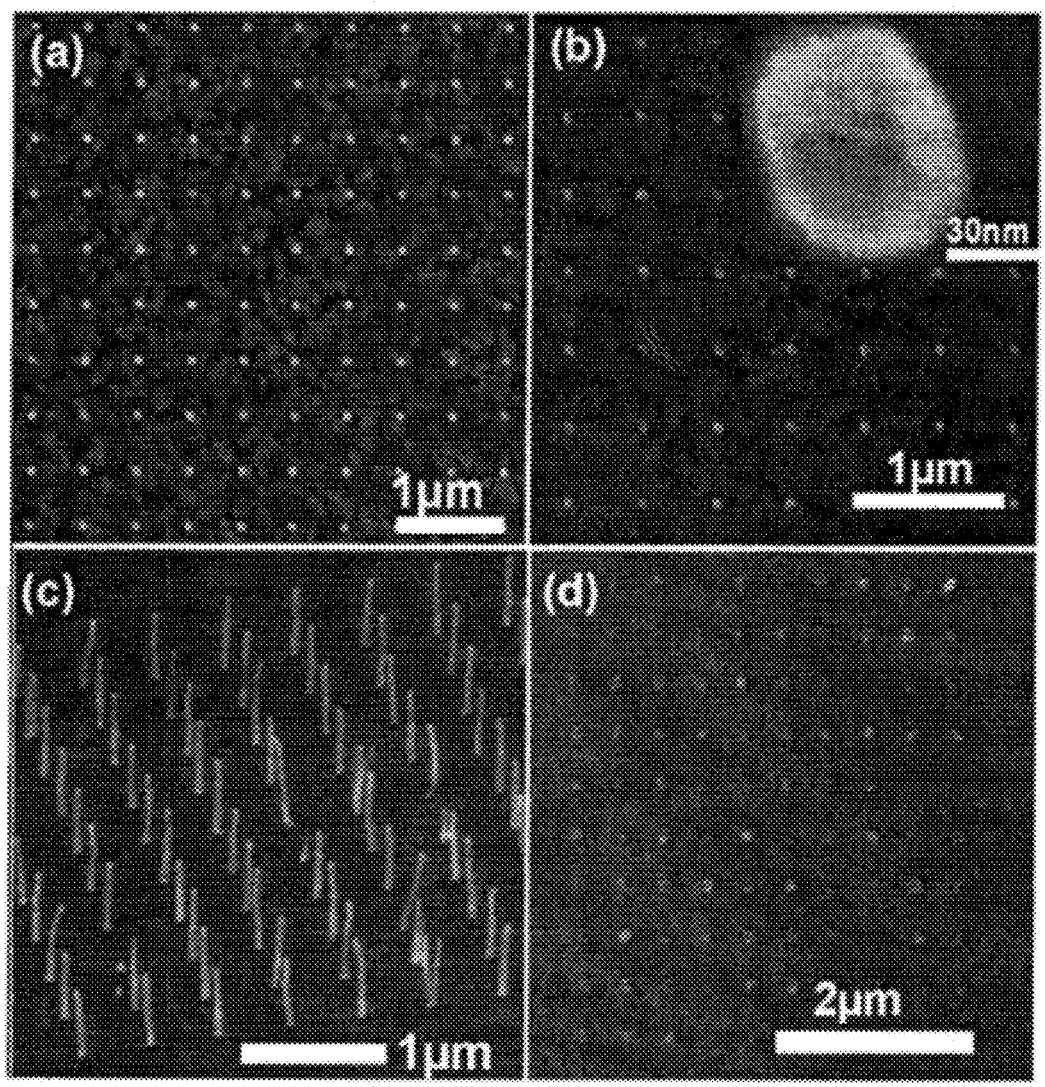
FIG. 30: Sequential presentation of results at different stages of the fabrication procedures: (a) after lithography and metal deposition where 1200 μC cm$^{-2}$ dose was applied, (b) after an annealing step before growth of CNF. A high resolution image of a dot is shown in the inset (c) after growth of CNF's at 700° C. for 20 min (from 60° tilted substrates) and (d) after a growth step of CNF's where no intermediate amorphous Si layer was applied, resulting in no growth of CNF's.

After each step of the experimental sequences, samples were characterized by SEM, as portrayed in FIG. 30. FIG. 30(*a*) represents the 10×10 array of fabricated dots prior to the heating step for growth. As can be seen from the figure, the square geometry rounded up to dots. FIG. 30(*b*) was taken after the heating step prior to exposing the sample to plasma and gas mixture for growth. Not much seems to happen during the heating step and squared dots remain intact. FIG. 30(*c*) depicts the results obtained after the growth sequence. The growth yields more than 98% at the dose scale of 1200 μC/cm$^2$. Predominant vertical growth of CNFs was observed. However, for some instances, slight angular deviation from perpendicularity of the grown structures was also observed. In order to differentiate the impact of the insertion of a layer of amorphous Si as part of catalyst, a set of experiments in which only Ni catalyst was deposited on W substrates was carried out. As can be seen from FIG. 30(*d*), no growth of CNF is evident. Such results are also reported in (Kabir, M. S.; Morjan, R. E.; Nerushev, O. A.; Lundgren, P.; Bengtsson, S.; Enokson, P.; Campbell, E. E. B., *Nanotechnology,* 16(4), 458, (2005), incorporated herein by reference).

Correlation Between Shot Modulation and Catalyst Dimension

Figure 31:
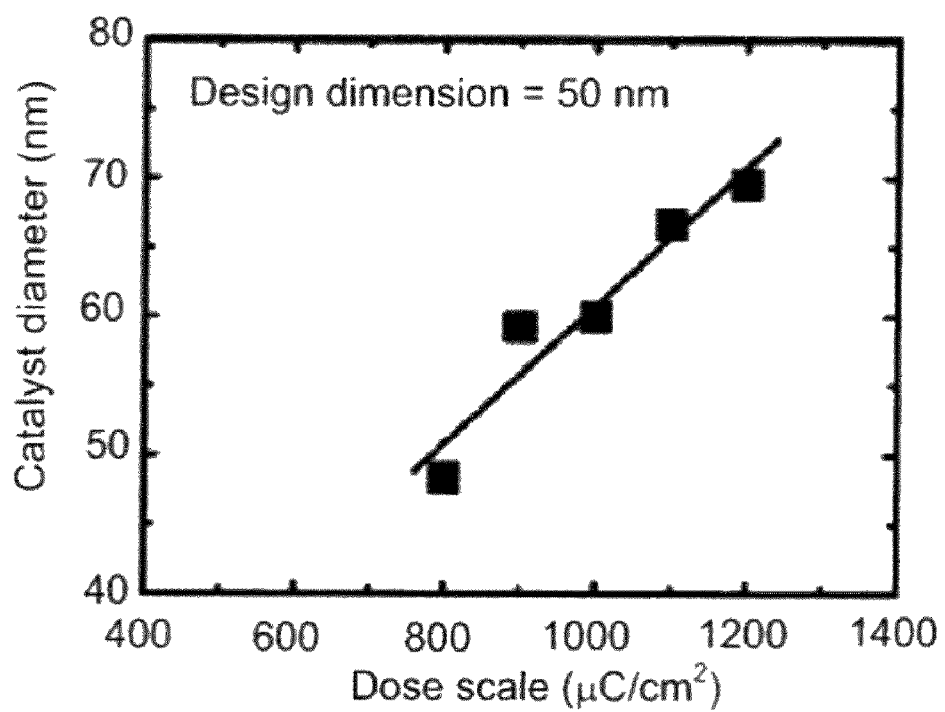
FIG. 31: Diameter as a function of dose for dots after the lithography step. A linear fit of the measured values is indicated by a straight line.

The effect of shot modulation on defining the catalyst dimensions, demonstrates the possibility of controlling the diameter of CNF's with nanometer precision. Experiments were carried out on a geometrical design set to 50 nm square. All of the metal underlayers gave reproducible results. The electron beam exposure was carried out at 500 pA, 100 kV and thereby the beam step size was set to equal a spot size of ~6 nm. FIG. 31 describes the catalyst diameter after metal evaporation as a function of irradiated electron dose during the exposure. The dose was varied by varying the dwell time of the beam on each exposure shot. Linear increment of the catalyst diameter as a function of electron dose is expected as the dose was varied linearly ranging from 500 μC/cm$^2$ to 1200 μC/cm$^2$. For the tungsten layer, below a threshold of 800 μC/cm$^2$ electron dose, no catalyst structure was observed. The observation can be explained in terms of how the electron energy is transferred to the resists. During an exposure, a series of elastic and inelastic scattering events determine the volume over which energy is deposited and the resist exposed. When the feature sizes are small, this effect becomes even more crucial to define the final exposed pattern. On the other hand, the energy deposited to the resists can be varied simply by keeping the beam 'on' the spot for a longer period. However, in addition to the beam induced parameters, the end outcome of the fabricated structures is determined by experimental parameters like resists thickness, resist developer, solid angle of the metal evaporation, etc. Still, there exist a minimum threshold point below which not enough energy will be transferred to the resists to be developed in the resist developer and no metal structure appears after metal deposition and lift off process. This is what is observed in FIG. 31. No structure appeared below 800 μC/cm$^2$ electron dose. Additionally, this threshold point depends not only on the type of the resists itself but also on other parameters such as substrate material, beam current density, beam pitch, etc. Nevertheless, the electron beam lithography technique not only facilitated extremely high positional precision capability (≦50 nm) but also proved to be a robust technique to control the diameter from a single design.

Growth on Different Metal Underlayers

Figure 32:
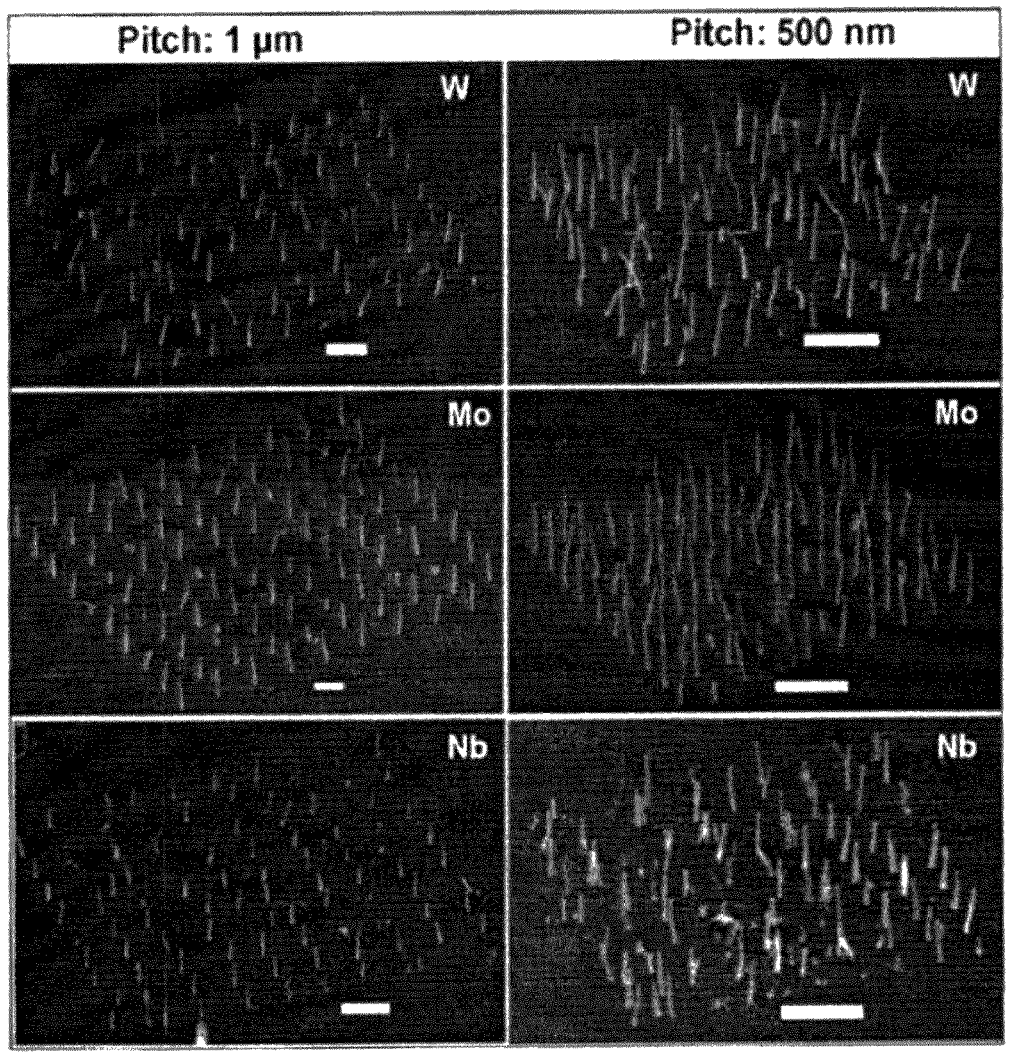
FIG. 32: SEM micrograph of the grown CNFs for dose scale 800 μC cm$^{-2}$ for three different metal underlayers. The column corresponds to 1 μm and 500 nm pitch respectively. Micrographs are taken from 60° tilted substrates. All scale bars are 1 μm.
Figure 33:
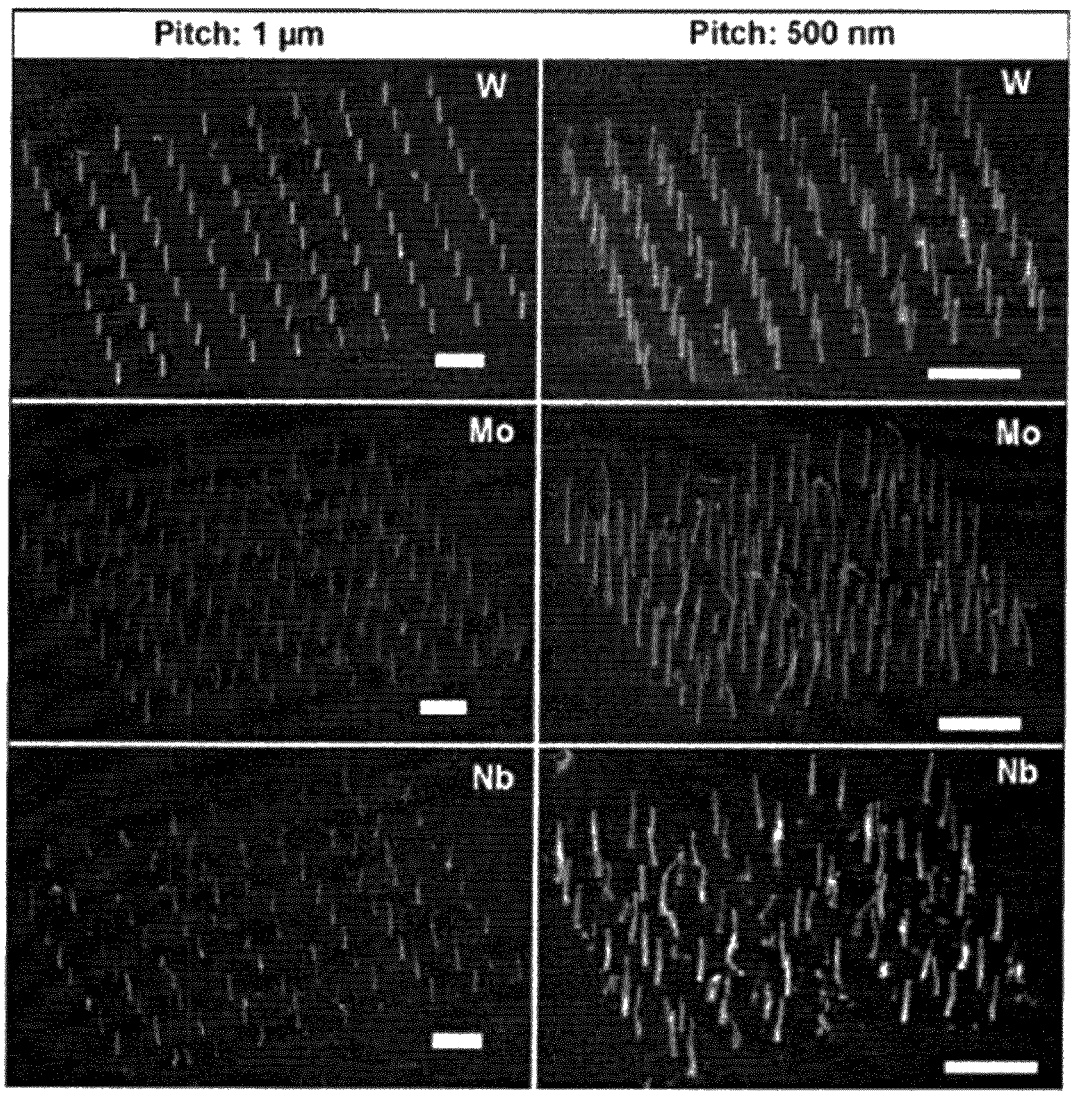
FIG. 33: SEM micrograph of the grown CNFs at a dose scale of 1200 μC cm$^{-2}$ for three different metal underlayers. The column corresponds to 1 μm and 500 nm pitch respectively. Micrographs are taken from 60° tilted substrates. All scale bars are 1 μm.

FIGS. 32 and 33 show an SEM of nanotubes grown from catalyst dots on different metal underlayers fabricated at a dose of 800 μC/cm$^2$ and 1200 μC/cm$^2$ respectively, for two different pitches (500 nm and 1 μm) in each case. Doses below 800 μC/cm$^2$ did not give any growth of CNFs, a fact which correlates well with the observation of lack of catalyst particles after lithography under these conditions (see FIG. 31). The structures of the grown CNFs were very similar for the Mo and W metal underlayers except for the fact that the W metal underlayers required a slightly higher dosage to reach the same yield. For the case of tungsten, at the dose of 800 μC/cm$^2$, CNFs grew from more than 60% of the total catalyst dots. At even higher doses, more than 97% catalyst dots act as nucleation sites for growth of nanotubes. CNFs grew from supported catalyst particles via a tip-growth mechanism in the followed conditions. The block with 500 nm pitch, on the other hand, yielded more than 85% growth from catalyst cites produced at 800 μC/cm$^2$. This incidence correlates with the proximity effect of the electron dose, and resulted in higher energy deposited to the resists during the processing.

Mo and W provided a stable platform for Si—Ni to interact, forming silicides at the growth temperature without breaking into little droplets. This result is different from the observations by Yudasaka et al. (see Yudasaka, M.; Kikuchi, R.; Ohki, Y.; Ota, E.; Yoshimura, S.; *Applied Physics Letters*, 70(14), 1817, (1997), incorporated herein by reference), Merkulov et al. (see Merkulov, V. I.; Lowndes, D. H.; Wei, Y. Y.; Eres, G.; Voelkl, E. *Applied Physics Letters*, 76(24), 3555, (2000), incorporated herein by reference) and Teo et al. (see Teo, K. B. K., et al., *Nanotechnology*, 14(2), 204, (2003), incorporated herein by reference) where, for initially large dots, multiple droplets were formed. As the size of the dots is reduced, the number of Ni droplets also decreases. Merkulov et al. observed ~300 nm critical diameter and Teo et al. observed ~100 nm critical diameter below which single VAC-NFs are grown. In all cases, only Ni was used as catalyst layer. In addition, in their case, formation of droplets was the necessary precursor for the catalytic growth of nanofibers. On the contrary, no droplet formation is observed after the heating step (see FIG. 30(b)). Similar behaviour was observed even for the case where films of catalyst were used (Kabir, M. S.; Morjan, R. E.; Nerushev, O. A.; Lundgren, P.; Bengtsson, S.; Enokson, P.; Campbell, E. E. B. *Nanotechnology*, 16(4), 458, (2005), incorporated herein by reference). Therefore, these observations suggest that the formation of droplets may not be the only criterion for catalyst nucleation.

The binary phase diagram of Nb—Si indicates that no reaction should occur at the growth temperature used in the experiment (see, e.g., Zhao, J. C., Jackson, M. R., and Peluso, L. A., *Mater. Sci. Eng. A*, 372, 21, (2004), incorporated herein by reference). Therefore, a Nb metal underlayer is also expected to facilitate a stable platform for Si and Ni to interact. The silicide formation step is therefore not expected to be the reason for the poor growth results on the Nb metal underlayer. There are a number of parameters that would influence the growth results including details of how the metal underlayer and the catalyst layers are deposited.

Furthermore, a Si layer is present between the Ni catalyst and the metal underlayers. Ni undergoes chemical reactions with Si at growth temperature 750° C. and forms mono/di silicidates (Kabir, M. S.; Morjan, R. E.; Nerushev, O. A.; Lundgren, P.; Bengtsson, S.; Enokson, P.; Campbell, E. E. B. *Nanotechnology*, 16(4), 458, (2005), incorporated herein by reference) and remains stable. The observation may also perhaps be due to the fact that below a critical dot size (in this case ~50 nm has rather small volume) the breakup does not occur due to increase in the surface energy, which is larger than the reduction of strain energy imposed by the mismatch of thermal expansion coefficient of different metal layers at a given temperature. Nevertheless, alter the acetylene is introduced, the VACNF growth begins. Growth mechanisms follow the tip growth model as is evident from the bright spot at the tip of nanotubes. Only rarely has formation of multiple CNFs from single dots been observed. Since the occurrence of such multiples of CNFs was less than 3%, the phenomenon is considered to be negligible and remains to be explained.

Statistical Evaluation

Figure 34:
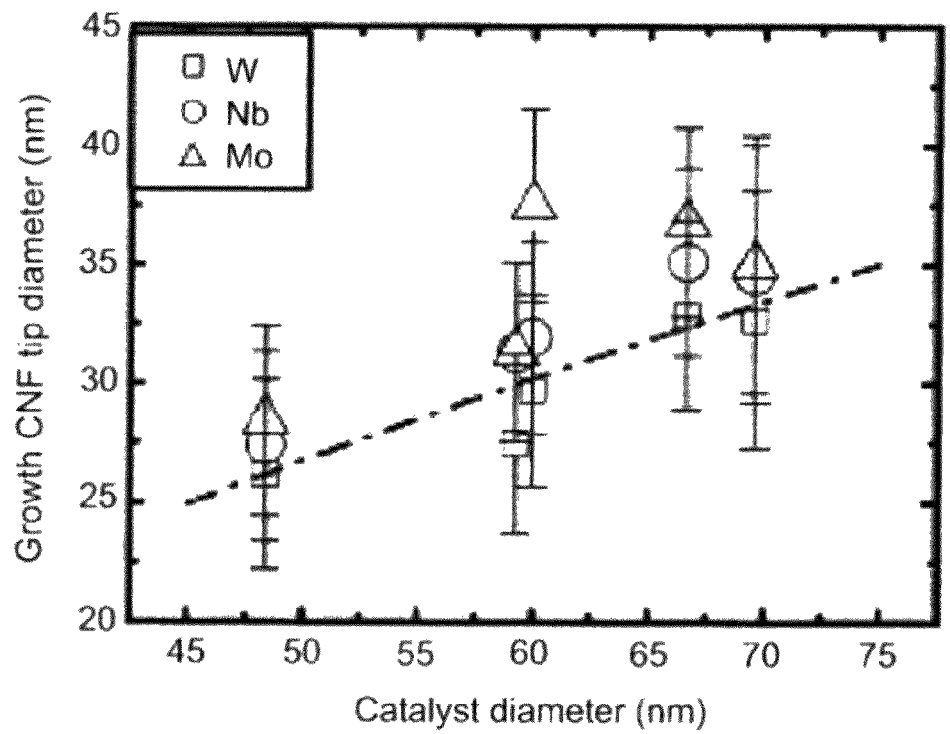
FIG. 34: Tip diameter of grown CNFs as a function of the catalyst diameter. Error bars indicate the standard deviation from the average value. The trend of the average value is indicated by a dashed-dotted line for the W substrate.
Figure 35:
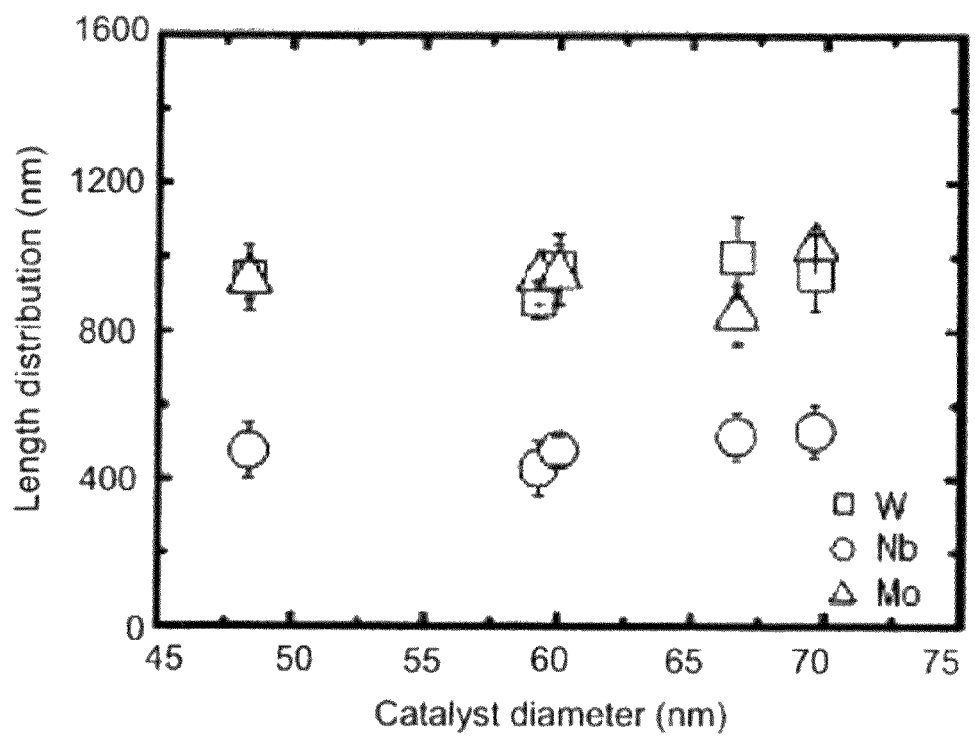
FIG. 35: Average length distribution is plotted as a function of the catalyst diameter for different metal underlayers. Error bars represent the corresponding standard deviation.

All experiments were performed on 72 blocks of 10×10 arrays of catalyst dots for each electron dose. To evaluate the structural uniformity, especially the tip diameter and the height distribution of the grown CNF structures, statistical analysis was undertaken. The statistical distribution was carried out on 75 randomly chosen CNFs for each electron dose. The results from statistical distributions are summarized in FIG. 34 and FIG. 35. FIG. 34 represents the grown CNF tip diameter as a function of catalyst dimension. Standard deviations of the measured data are shown as error bars for obtained mean values. For instance, the obtained mean value for the tip diameter of the grown CNFs is 26 nm (W substrate) from ~48 nm diameter catalyst with a standard deviation of ±3.5 nm.

FIG. 34 also represents a benchmark to predict the results with a statistical accuracy of ±3 nm, which is sufficiently good data to fabricate NEMS structures with statistically predictable I-V characteristics. Moreover, almost linear dependence of the tip diameter on the size of catalyst dimension, which is again dependent on the deposited electron dose of the EBL, proves to be a robust technique to control the tip diameter with an accuracy of ±2 nm.

As evident from the figures, diameters of the grown CNFs are roughly 50% smaller than the initial catalyst size. This observation is consistent with others (see Teo, K. B. K., et al., *Nanotechnology*, 14(2), 204, (2003), incorporated herein by reference). According to the spherical nanocluster assumption (Teo, K. B. K., et al., *Nanotechnology*, 14(2), 204, (2003), incorporated herein by reference), it is possible to calculate the expected diameter of the grown CNF by equating the patterned catalyst with the volume of a sphere. The calculated diameters are thus plotted in dotted lines. The theoretical plot gave very good agreement with the average experimental values for diameters when the critical thickness for the catalyst was set to 4 nm. This is 60% reduction from the initial thickness of the catalyst film (initial 10 nm thick Ni catalyst). Moreover, this observation fortifies the fact that the silicidation occurs during the growth process, and dominates and controls the exact thickness of the catalytically active film. Statistical analysis on length distributions of the grown CNFs showed Gaussian distributions for all cases. The most pragmatic parameter from the distributions, the FWHM of length distribution, is plotted as a function of catalyst dimensions in FIG. 35. The spread of the Gaussian fit is also indicated by bar on each point. It is apparent from the Figure that height distributions for W and Mo almost overlap with each other. Whereas Ni produced more than half the height compare to other metals. This difference for different metals underlayers suggest that the different metals give rise to different pace to the catalytic activities of the catalysts resulting different length distributions. Moreover, the spread of length distribution is of the order of 100 nm which is substantially better than the reported value by others (see Teo, K. B. K., et al., *Nanotechnology*, 14(2), 204, (2003), incorporated herein by reference) where spreads of the order of microns were reported. The height variations as a function of catalyst diameter show a predominantly straight line, which is not surprising as the volume of the catalyst does not increase significantly as a function of catalyst dimension to produce significant impact on height.

Diameter and Length Distributions

All experiments were performed on 72 blocks of 10×10 arrays of catalyst dots for each electron dose (7200 dots for each dose condition). The tip diameter and nanofiber length were determined for at least 50 randomly chosen structures for each electron dose. The results are summarized in FIGS. 34 and 35.

The length of grown nanotubes ranged from 800 nm to 900 nm. The tip diameter was ranging from 20 nm to 70 nm. Only a few nanotubes did not grow normal to the substrate. The grown fibers tend to have larger diameter at the bottom and smaller at the top, thereby forming conic shape nanofiber structures with conical angle less than 2°. Apparently, e-field alignment is related to number of CNTs growing from each dot. When examining the critical size for the nucleation of single CNFs, it was discovered that there were still some instances of multiple (i.e., double) CNFs from some catalyst dots (below 3%). Mo substrate produced better yield (more than 80%) at the same electron dose. Structural configurations of the grown structures did not seem to differ between Mo and W metal underlayers except where the W metal underlayers required little higher dosage to reach the same yield. This could be related to the conductivity of the metal substrates. Nb was chosen as an exotic material simply for the purpose of a comparative analysis with the other metals. At dose 800 μC/cm$^2$, not more than 30% dots nucleated for growth, but this trend remains the same at higher dosage.

FIG. 34 shows the CNF average tip diameter as a function of catalyst dimension (i.e., electron dose). The error bars represent standard deviations in nanometers. An almost linear dependence of the tip diameter on the catalyst size is observed. Since the catalyst size can be controlled by adjusting the electron dose in the EBL, this proves to be a robust technique to control the tip diameter from a single design geometry with an average standard deviation of ±4 nm. As is evident from FIG. 34, the diameters of the grown CNFs are roughly 50% smaller than the initial catalyst size. The base diameter is slightly smaller than the diameter of the catalyst with an average value ranging from 40 to 50 nm as a function of dose, i.e., approximately 1.5 times larger diameter than at the tip (corresponding to a conical angle of about 0.5° for 1 μm long fibres). This observation is consistent with related studies where carbon nanofibres were grown on Ni catalysts of 100 nm dimensions and larger deposited on a doped silicon substrate with an 8 nm thick oxide barrier where the measured tip diameters were about 0.5 of metal catalyst diameter (Teo K B K, et al., *Nanotechnology*, 14, 204, (2003), incorporated herein by reference). That earlier work was more focused on large diameter structures (larger than 100 nm). The measured standard deviations were smaller than in the instant case; however, this is more related to the lithographic challenges of producing small<100 nm structures than to the growth process. In this case the catalyst tip of the grown CNF takes an approximately conical shape (Yao Y, Falk L K L, Morjan R E, Nerushev O A and Campbell E E B, *J. Microsc.*, 219, 69-75, (2005), incorporated herein by reference) and therefore the volume of catalyst material enclosed within the CNF tip can easily be estimated. From TEM studies it is possible to estimate the height of the cone to be approximately 40 nm for a 25 nm diameter CNF. The estimated catalyst volume then turns out to be approximately one-fifth of the originally deposited catalyst dot volume. The remaining catalyst material is present at the base of the CNF in the form of small Ni particles embedded in a carbon 'dome' or in a thin layer of Ni between the carbon 'dome' and the amorphous silica layer coating the silicon wafer (Yao Y, et al., *J. Microsc.*, 219, 69-75, (2005), incorporated herein by reference).

The measured lengths of the grown CNFs showed Gaussian distributions for all cases. The average length is plotted as a function of catalyst dimension in FIG. 35. The standard deviation is indicated by the bar on each point. It is apparent from the figure that the height distributions for W and Mo almost overlap with each other. On the other hand, the nanofibres grown on the Nb underlayer were only slightly more than half the height of the fibres grown on the other metals. The spread of the length distribution for W and Mo metal underlayers varied from 8 to 15% with an average standard deviation of 11%. In contrast, for the Nb metal underlayer it varied up to 20% with an average standard deviation of 16%. There is no dependence of the height of the structures on the catalyst diameter within the range that has been investigated as described herein.

Other description and examples can be found in: M. S. Kabir, "Towards the Integration of Carbon Nanostructures into CMOS Technology", *Ph.D. Thesis*, Chalmers University of Technology, Goteborg, Sweden, (August 2005), ISBN: 91-7291-648-6, incorporated herein by reference.

The foregoing description is intended to illustrate various aspects of the present invention. It is not intended that the examples presented herein limit the scope of the present invention. The invention now being fully described, it will be apparent to one of ordinary skill in the art that many changes and modifications can be made thereto without departing from the spirit or scope of the appended claims.

All references cited herein are hereby incorporated by reference in their entirety for all purposes.

What is claimed:

1. A heat dissipator, comprising:
    an insulating substrate; and
    a plurality of nanostructures supported by said insulating substrate, wherein each of said nanostructures comprises:
        a plurality of intermediate layers on the insulating substrate, wherein at least two of the plurality of intermediate layers are interdiffused, and wherein material of the at least two of the plurality of intermediate layers that are interdiffused is present in the nanostructure.

2. The heat dissipator according to claim 1, wherein said plurality of nanostructures is at least partly embedded in an insulator.

3. The heat dissipator according to claim 1, wherein at least one of the plurality of intermediate layers comprises material selected from the group consisting of amorphous silicon and germanium.

4. The heat dissipator according to claim 1, wherein each of said nanostructures comprises:
    a conducting base layer;
    a layer of amorphous silicon on the conducting base layer;
    a layer of catalyst on the layer of amorphous silicon; and
    a carbon nanostructure disposed on the layer of catalyst.

5. The heat dissipator according to claim 1, wherein each of said nanostructures comprises:
    a conducting base layer;
    a layer of amorphous germanium on the conducting base layer;
    a layer of catalyst on the layer of amorphous germanium; and
    a carbon nanostructure disposed on the layer of catalyst.

6. An electronic device comprising:
    an electronic circuit; and
    a heat dissipator according to claim 1 arranged in thermal contact with said electronic circuit.

7. The electronic device according to claim 6, wherein said heat dissipator is arranged in such a way that said nanostructures are substantially perpendicular to an edge of said electronic circuit.

8. The heat dissipator according to claim 1, wherein said nanostructure comprises:
    a base;
    a tip; and
    a body between said base and said tip,
    wherein said tip comprises material from at least one of said intermediate layers having diffused through said body during growth of said nanostructure.

* * * * *